(12) United States Patent
Hsieh et al.

(10) Patent No.: US 12,107,080 B2
(45) Date of Patent: Oct. 1, 2024

(54) LIGHT-EMITTING DEVICE, MANUFACTURING METHOD THEREOF AND DISPLAY MODULE USING THE SAME

(71) Applicant: EPISTAR CORPORATION, Hsinchu (TW)

(72) Inventors: Min-Hsun Hsieh, Hsinchu (TW); Tzu-Hsiang Wang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 109 days.

(21) Appl. No.: 18/070,669

(22) Filed: Nov. 29, 2022

(65) Prior Publication Data

US 2023/0086456 A1 Mar. 23, 2023

Related U.S. Application Data

(63) Continuation of application No. 17/000,249, filed on Aug. 21, 2020, now Pat. No. 11,515,295.

(30) Foreign Application Priority Data

Aug. 22, 2019 (TW) .................................. 108130109

(51) Int. Cl.
*H01L 29/20* (2006.01)
*H01L 23/00* (2006.01)
(Continued)

(52) U.S. Cl.
CPC .......... *H01L 25/0753* (2013.01); *H01L 24/32* (2013.01); *H01L 24/83* (2013.01);
(Continued)

(58) Field of Classification Search
CPC ..... H01L 25/0753; H01L 33/62; H01L 24/83; H01L 24/32; H01L 2224/83192;
(Continued)

(56) References Cited

U.S. PATENT DOCUMENTS 8,441,121 B2 5/2013 Sun
10,497,835 B2 12/2019 Jung
(Continued)

FOREIGN PATENT DOCUMENTS

CN 104662118 A 5/2015
CN 204857720 U 12/2015
(Continued)

*Primary Examiner* — Ismail A Muse
(74) *Attorney, Agent, or Firm* — Patterson + Sheridan, LLP

(57) ABSTRACT

The application discloses a light-emitting device including a carrier which includes an insulating layer, an upper conductive layer formed on the insulating layer, a plurality of conducting vias passing through the insulating layer, and a lower conductive layer formed under the insulating layer; four light-emitting elements arranged in rows and columns flipped on the carrier; and a light-passing unit formed on the carrier and covering the four light-emitting elements; wherein each of the light-emitting elements including a first light-emitting bare die emitting a first dominant wavelength, a second light-emitting bare die emitting a second dominant wavelength, and a third light-emitting bare die emitting a third dominant wavelength; and wherein two adjacent first light-emitting bare die in a row has a first distance W1, two adjacent first light-emitting bare die in a column has a second distance W2, and W1 is the same as W2.

18 Claims, 41 Drawing Sheets

(51) Int. Cl.
*H01L 25/075* (2006.01)
*H01L 33/00* (2010.01)
*H01L 33/62* (2010.01)

(52) U.S. Cl.
CPC .... *H01L 33/62* (2013.01); *H01L 2224/32227* (2013.01); *H01L 2224/83192* (2013.01); *H01L 2224/83851* (2013.01)

(58) Field of Classification Search
CPC . H01L 2224/32227; H01L 2224/83851; H01L 33/38; H01L 33/52; H01L 23/31; H01L 33/08
See application file for complete search history.

(56) References Cited

U.S. PATENT DOCUMENTS

| | | |
|---|---|---|
| 2006/0108396 A1 | 5/2006 | Nessman et al. |
| 2007/0148918 A1 | 6/2007 | Kinsman et al. |
| 2012/0061706 A1 | 3/2012 | Kamada |
| 2014/0186979 A1 | 7/2014 | Tu et al. |
| 2014/0217437 A1 | 8/2014 | Kim |
| 2015/0295154 A1 | 10/2015 | Tu et al. |
| 2017/0033066 A1 | 2/2017 | Napetschnig et al. |
| 2017/0254518 A1 | 9/2017 | Vasylyev |
| 2017/0259366 A1 | 9/2017 | Ishikawa et al. |
| 2019/0115494 A1 | 4/2019 | Koyanagi et al. |
| 2019/0259736 A1* | 8/2019 | Li ............................ H01L 33/62 |
| 2020/0083420 A1* | 3/2020 | Gu ...................... H01L 23/5384 |
| 2021/0048179 A1 | 2/2021 | Vasylyev |

FOREIGN PATENT DOCUMENTS

| | | |
|---|---|---|
| CN | 105280795 A | 1/2016 |
| CN | 105849820 A | 8/2016 |
| CN | 206370442 U | 8/2017 |
| CN | 206451731 U | 8/2017 |
| CN | 107623065 A | 1/2018 |
| JP | 2009105153 A | 5/2009 |
| KR | 20170037565 A | 4/2017 |
| TW | 201234666 A | 8/2012 |
| TW | 201413879 A | 4/2014 |
| TW | 201714328 A | 4/2017 |

* cited by examiner

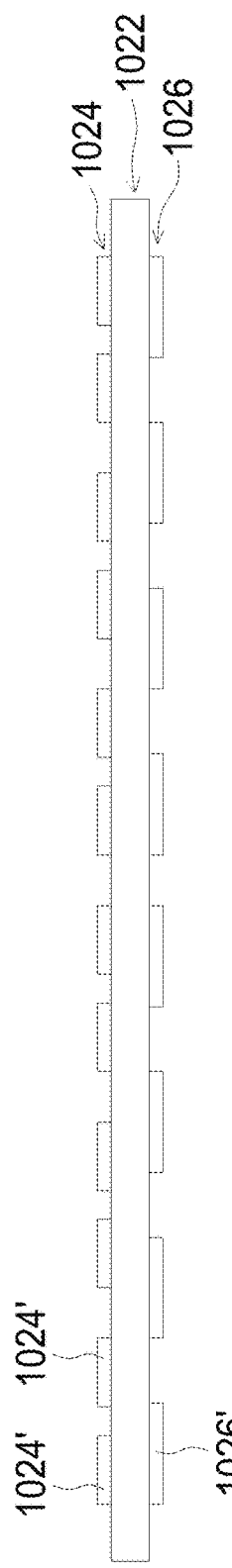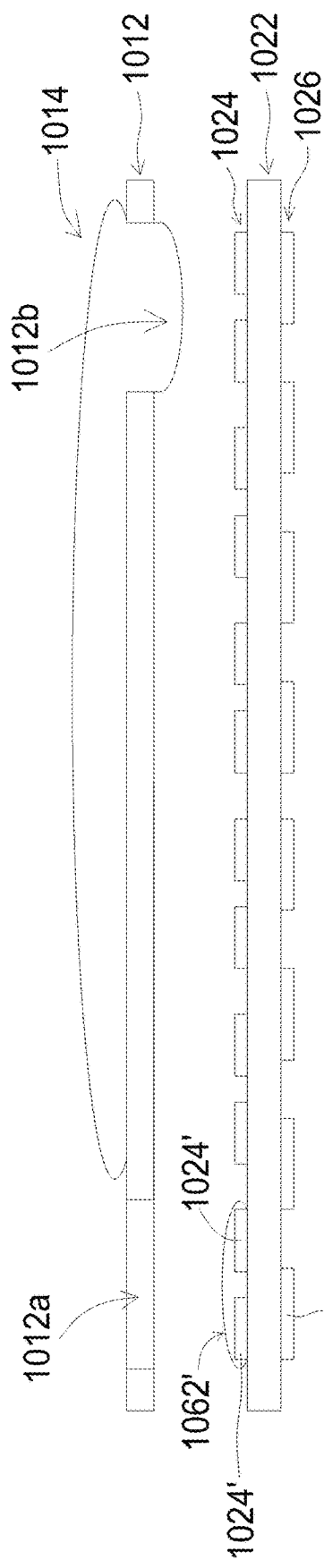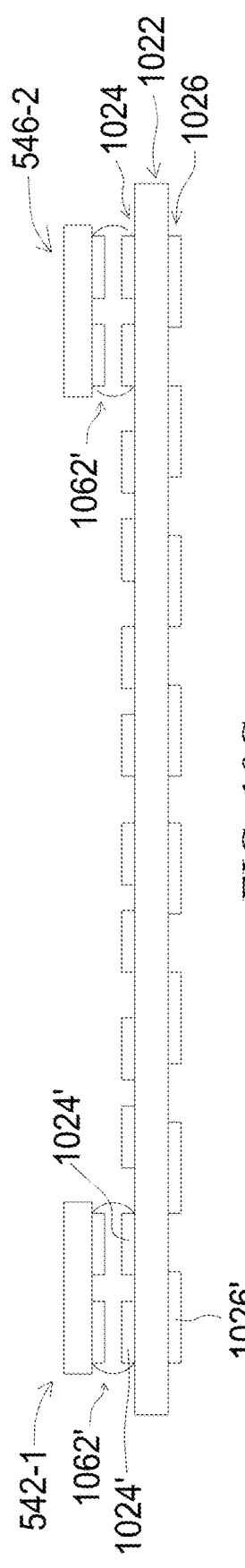

LIGHT-EMITTING DEVICE, MANUFACTURING METHOD THEREOF AND DISPLAY MODULE USING THE SAME

RELATED APPLICATION DATA

This application is a continuation application of U.S. application Ser. No. 17/000,249, filed on Aug. 21, 2020, which claims the right of priority of TW Application No. 108130109, filed on Aug. 22, 2019, and the content of which is hereby incorporated by reference in its entirety.

TECHNICAL FIELD

This present application is related to a light-emitting device and a manufacturing method thereof, and especially a light-emitting device, which has a carrier with certain structure and a certain connection, and a manufacturing method thereof.

DESCRIPTION OF BACKGROUND ART

The light-emitting diode (LED) has special properties, such as low power consumption, low heat radiation, long lifetime, high impact resistance, small volume, and high responding speed so LED is widely used in applications requiring light-emitting units, such as vehicle, household electric appliance, display, or lighting fixture.

LED is able to emit monochromatic light so LED is suitable to be a pixel of display like outdoor or indoor display, and one of the trends for display technology development is to increase the resolution of the display. For increasing the resolution of the display, the LED should be miniaturized.

SUMMARY OF THE DISCLOSURE

The application discloses a light-emitting device including a carrier which includes an insulating layer, an upper conductive layer formed on the insulating layer, a plurality of conducting vias passing through the insulating layer, and a lower conductive layer formed under the insulating layer; four light-emitting elements arranged in rows and columns flipped on the carrier; and a light-passing unit formed on the carrier and covering the four light-emitting elements; wherein each of the light-emitting elements including a first light-emitting bare die emitting a first dominant wavelength, a second light-emitting bare die emitting a second dominant wavelength, and a third light-emitting bare die emitting a third dominant wavelength; and wherein two adjacent first light-emitting bare die in a row has a first distance W1, two adjacent first light-emitting bare die in a column has a second distance W2, and W1 is the same as W2.

BRIEF DESCRIPTION OF THE DRAWINGS

FIG. 6B shows a top view of the light-emitting device disclosed in

FIG. 6A.

FIGS. 10A~10K show a manufacturing process of a display module in accordance with one embodiment of present application.

FIG. 13B shows a top view of the light-emitting device disclosed in

FIG. 13A.

DETAILED DESCRIPTION OF PREFERRED EMBODIMENTS

Figure 1A:
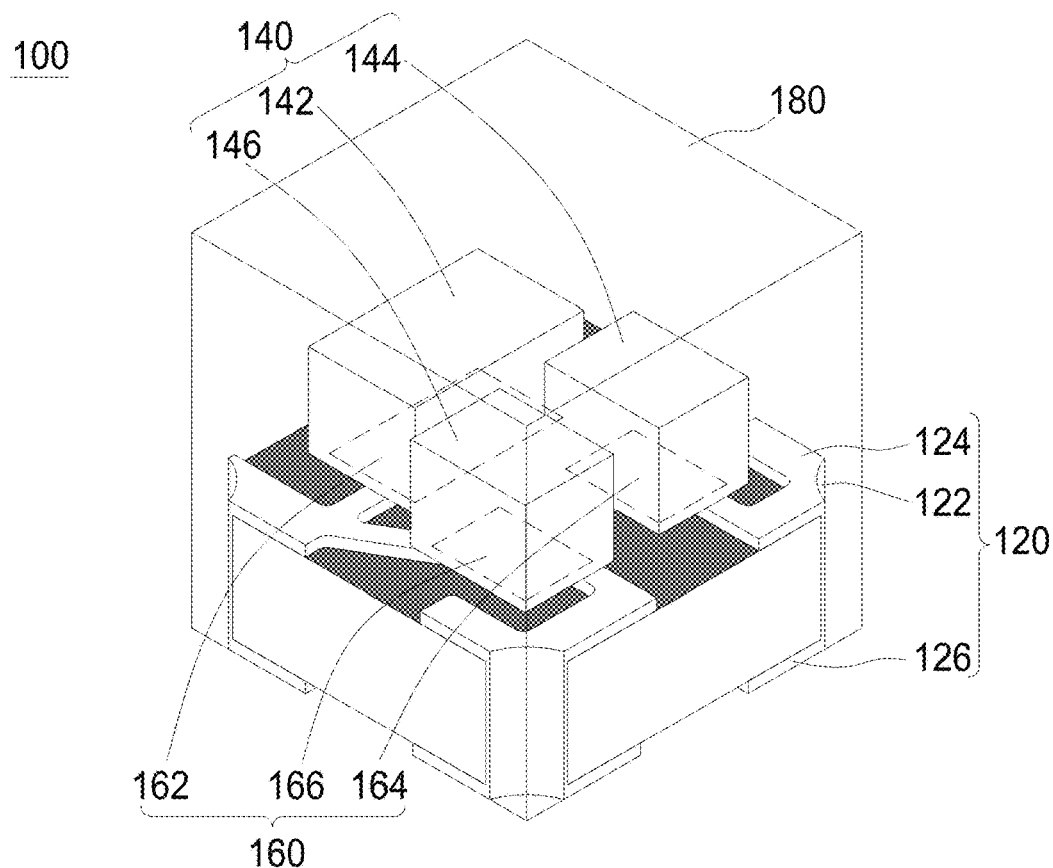
FIG. 1A shows a three-dimensional view of a light-emitting device in accordance with one embodiment of present application.

The embodiments of the application are illustrated in details, and are plotted in the drawings. The same or the similar parts in the drawings and the specification have the same reference numeral. In the drawings, the shape and thickness of a specific element could be shrunk or enlarged. It should be noted that the element which is not shown in the drawings or described in the following description could be the structure well-known by the person having ordinary skill in the art.

Figure 1B:
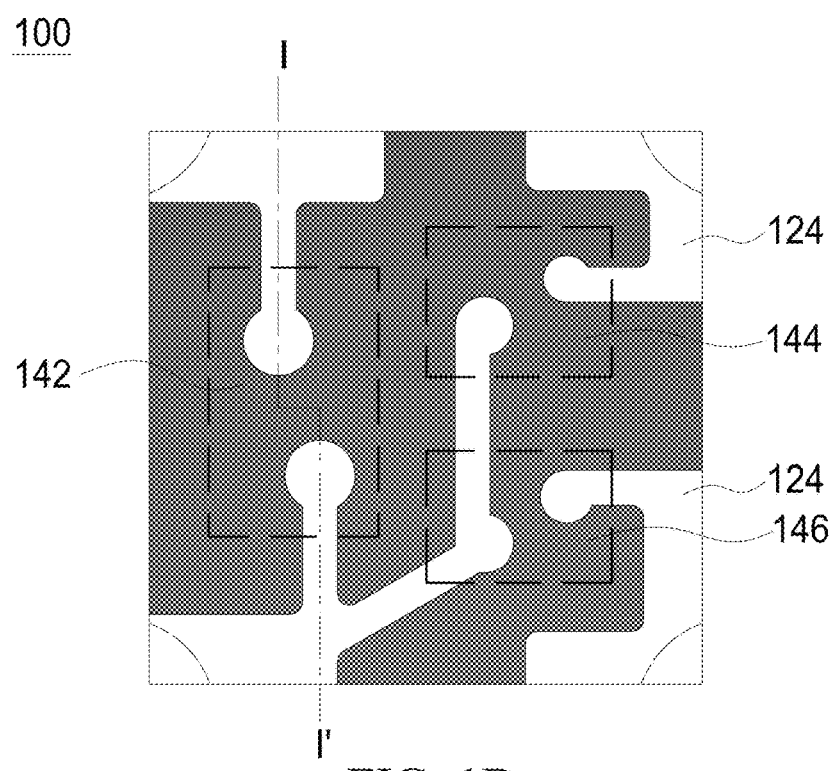
FIG. 1B shows a top view of the light-emitting device disclosed in FIG. 1A.
Figure 1C:
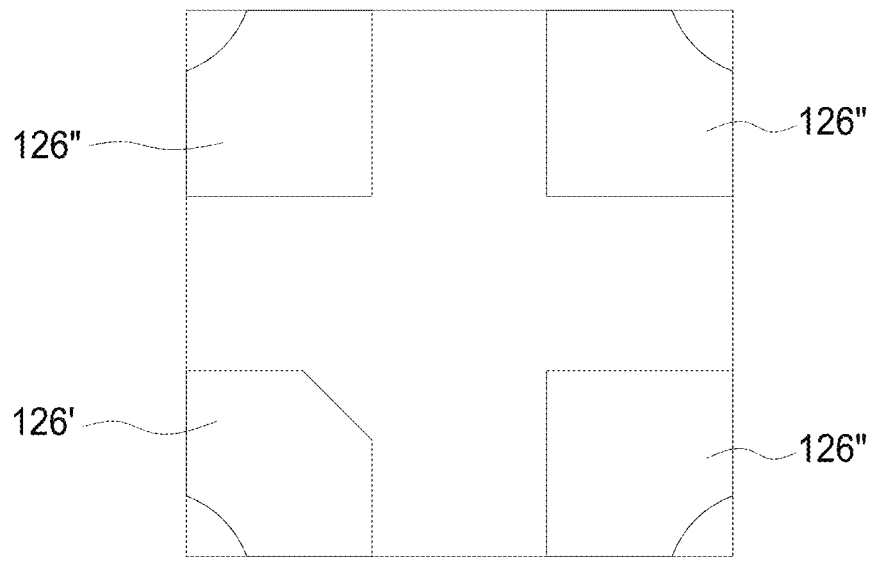
FIG. 1C shows a bottom view of the light-emitting device disclosed in FIG. 1A.

FIG. 1A shows a three-dimensional view of a light-emitting device 100 in accordance with one embodiment of present application. FIG. 1B shows a top view of the light-emitting device 100 disclosed in FIG. 1A. FIG. 1C shows a bottom view of the light-emitting device 100 disclosed in FIG. 1A. The light-emitting device 100 includes a carrier 120, a light-emitting element 140, a connecting structure 160, and a light-passing unit 180. In one embodiment, the light-emitting element 140 includes a first light-emitting unit 142, a second light-emitting unit 144, and a third light-emitting unit 146. In one embodiment, the light-emitting element 140 is formed on the carrier 120, the connecting structure 160 is formed between the carrier 120 and the light-emitting element 140, and the light-passing unit 180 covers the light-emitting element 140 and the connecting structure 160.

In one embodiment, the carrier 120 includes an insulating layer 122, an upper conductive layer 124, and a lower conductive layer 126. The upper conductive layer 124 electrically connects the light-emitting element 140 and the lower conductive layer 126, which is electrically connected to the external power supply. In one embodiment, the upper conductive layer 124 electrically connects the lower conductive layer 126 through the conductive via (not shown). The conductive via penetrates the insulating layer 122 and can be formed in the periphery or interior of the insulating layer 122. In one embodiment, the upper conductive layer 124 is formed upon the insulating layer 122 and of patterned structure, and the lower conductive layer 126 is formed under the insulating layer 122 and of patterned structure. Referring to FIG. 1C, in one embodiment, the first, second, and third light-emitting units 142, 144, 146 have one common electrode so the lower conductive layer 126 has four electrode pads. Specifically, in the embodiment, the common electrode means a terminal which physically and electrically connects multiple electrodes of same polarity of multiple light-emitting units. In one embodiment, the first, second, and third light-emitting units 142, 144, 146 are light-emitting diodes, and the p-type semiconductors layers (not shown) thereof share the same electrode. In another embodiment, the n-type semiconductor layers (not shown) of the first, second, and third light-emitting units 142, 144, 146 share the same electrode. In one embodiment, a shape of one electrode pad 126' of the lower conductive layer 126 is different from the shapes of the other three electrode pads 126" for identification purpose. In the embodiment, in the lower conductive layer 126, one corner of the electrode pad 126' of the common electrode has a bevel surface 126b as shown in FIG. 1C. Namely, the shape of the electrode pad 126' is a pentagon and different from the other three electrode pads 126", which are quadrangles. The four electrode pads 126', 126" are located in the four corners respectively and are electrically connected to four external electrodes. In another embodiment, there are six electrodes for the first, second, and third light-emitting units 142, 144, 146 to be electrically connected to external power supply independently so the lower conductive layer 126 has six electrode pads.

The material of the insulating layer 122 can be epoxy resin, BT (Bismaleimide Triazine) resin, polyimide resin, composite of epoxy resin and fiberglass, or composite of BT resin and fiberglass. The material of the upper conductive layer 124 and the lower conductive layer 126 can be metal, such as Cu, Sn, Al, Ag or Au. In one embodiment, if the light-emitting device 100 is a pixel of a display device, a light-absorbing layer (not shown), such as black coating layer, can be formed on the surface of the insulating layer 122 to enhance contrast of the display device.

Figure 1D:
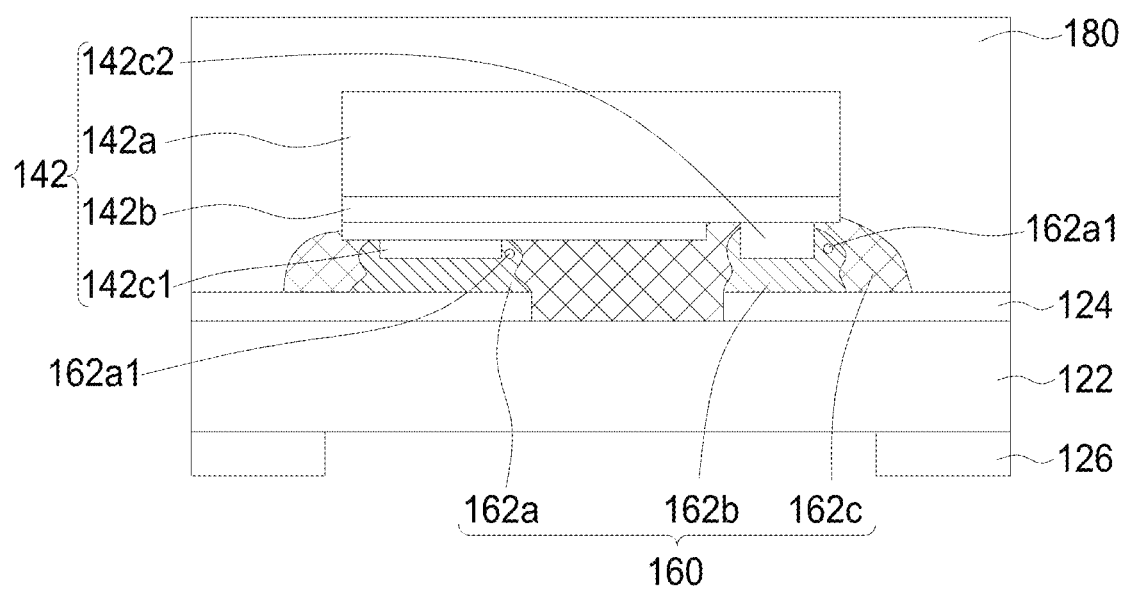
FIG. 1D shows a cross-sectional view of the light-emitting device disclosed in FIG. 1A.

Referring to FIG. 1A, in the embodiment, the number of the light-emitting unit is three, but it is not a limitation. In other embodiments, the number of the light-emitting unit can be one, two, four, or five. In one embodiment, the first light-emitting unit 142, the second light-emitting unit 144, and the third light-emitting unit 146 can be LED (light-emitting diode) dies for emitting different dominant wavelengths (Wd) or different colors. In one embodiment, the first light-emitting unit 142 is a red LED die, which can be driven by an electrical current provided by power supply to emit a first light with a dominant wavelength or peak wavelength between 600 nm~660 nm. FIG. 1D shows a cross-sectional view along I-I' in FIG. 1B. In one embodiment, the first light-emitting unit 142 includes a substrate 142a, a light-emitting layer 142b, and contacting electrodes 142c1, 142c2, wherein the light-emitting layer 142b has one side facing the substrate 142a and another side facing the contacting electrodes 142c1, 142c2. The substrate 142a can carry or support the light-emitting layer 142b. Besides, the substrate 142a is distant from a surface of the light-emitting layer 142b, which is an upper surface of the first light-emitting unit 142 and is also a light extraction surface thereof. In one embodiment, the substrate 142a is a transparent ceramic substrate, such as Aluminum Oxide substrate and bound with the light-emitting layer 142b through a bonding layer (not shown).

In one embodiment, the second light-emitting unit 144 is a green LED die, which can emit a second light with a dominant wavelength or peak wavelength between 510 nm~560 nm. The composition of the second light-emitting unit 144 is similar to that of the first light-emitting unit 142. The second light-emitting unit 144 includes a substrate, a light-emitting layer, and contacting electrodes, wherein the composition of the light-emitting layer of the second light-emitting unit 144 is different from that of the first light-emitting unit 142. Besides, in one embodiment, the substrate of the second light-emitting unit 144 is a growth substrate, such as sapphire, for epitaxially growing the light-emitting layer. The structure of the third light-emitting unit 146 is similar to that of the first light-emitting unit 144, wherein the composition of the light-emitting layer of the third light-emitting unit 146 is different from that of the second light-emitting unit 144.

In another embodiment, the first light-emitting unit 142 includes an LED die covered by a wavelength conversion material, wherein the LED die is able to emit blue light or UV light with a wavelength shorter than that of red light, and the wavelength conversion material is able to convert blue light or UV light into red light. The second light-emitting unit 144 includes an LED die covered by a wavelength conversion material, wherein the LED die is able to emit blue light or UV light with a wavelength shorter than that of green light, and the wavelength conversion material is able to convert blue light or UV light into green light. The third light-emitting unit 146 includes an LED die covered by a wavelength conversion material, wherein the LED die is able to emit UV light with a wavelength shorter than that of blue light, and the wavelength conversion material is able to convert blue light or UV light into blue light.

Referring to FIG. 1B, in one embodiment, the first light-emitting unit 142, the second light-emitting unit 144, and the third light-emitting unit 146 are arranged as a triangle and respectively located on the three vertices. In another embodiment, the first light-emitting unit 142, the second light-emitting unit 144, and the third light-emitting unit 146 are arranged as a straight line.

Referring to FIG. 1A, in one embodiment, the connecting structure 160 includes a first region 162, a second region 164, and a third region 166. The first region 162 of the connecting structure 160 is able to be electrically and physically connected to the carrier 120 and the first light-emitting unit 142. Furthermore, referring to FIG. 1D, the first region 162 includes a first electrical connecting portion 162a, a second electrical connecting portion 162b, and a first protection portion 162c. In one embodiment, the first electrical connecting portion 162a is electrically connected to the upper conductive layer 124 and the contacting electrodes 142c1, the second electrical connecting portion 162b is electrically connected to the upper conductive layer 124 and the contacting electrodes 142c2, and the first protection portion 162c surrounds the first electrical connecting portion 162a and the second electrical connecting portion 162b. In one embodiment, the contours of the first electrical connecting portion 162a and the second electrical connecting portion 162b can be flat or bumpy. In one embodiment, the first electrical connecting portion 162a and/or the second electrical connecting portion 162b have neck shape. In other words, the first electrical connecting portion 162a has a width between the contacting electrode 142c1 and the upper conductive layer 124 smaller than a width at the interface of the first electrical connecting portion 162a and a width at the interface of the upper conductive layer 124, or the second electrical connecting portion 162b has a width between the contacting electrode 142c2 and the upper conductive layer 124 smaller than a width at the interface of the second electrical connecting portion 162b and a width at the interface of the upper conductive layer 124. In one embodiment, the first electrical connecting portion 162a and the second electrically connecting portion 162b are mainly formed of electrically conductive material mixing with resin. In one embodiment, the first electrical connecting portion 162a and the second electrically connecting portion 162b includes cavity and/or resin 162a1. In another embodiment, the first electrical connecting portion 162a and the second electrical connecting portion 162b are made of electrically conductive material.

In one embodiment, the first protection portion 162c is located between the first electrical connecting portion 162a and the second electrical connecting portion 162b, surrounds and covers the first electrical connecting portion 162a and the second electrical connecting portion 162b, and is connected to the carrier 120 and a surface of the first light-emitting unit 142. The first protection portion 162c not only protects the first electrical connecting portion 162a and the second electrical connecting portion 162b, but also prevents the electrically conductive material from being oxidized by the moisture of the environment and prevents the first electrical connecting portion 162a and the second electrical connecting portion 162b from being short-circuited caused by the softening or melting of the material in high temperature. Besides, the first protection portion 162c is able to enhance bonding strength between the carrier 120 and a surface of the first light-emitting unit 142. In one embodiment, the first protection portion 162c is mainly made of resin and may include a little of electrically conductive material. It is worth noted that the electrically conductive material is not presented continuously between the first electrical connecting portion 162a and the second electrical connecting portion 162b. In another embodiment, the first protection portion 162c is made of resin without electrically conductive material.

The electrically conductive materials of the first electrical connecting portion 162a, the second electrical connecting portion 162b, and the first protection portion 162c can be the same or different, wherein the electrically conductive material includes Au, Ag, Cu or alloy of Sn. In one embodiment, the electrically conductive material includes metal with low melting point or an alloy with low liquidus melting point. In one embodiment, the temperature of the low melting point of the metal or the low liquidus melting point of the alloy is lower than 210° C. In another embodiment, the temperature of the low melting point of the metal or the low liquidus melting point of the alloy is lower than 170° C., wherein the alloy with low liquidus melting point includes InSn alloy or BiSn alloy.

The resin contained in the first electrical connecting portion 162a, the second electrical connecting portion 162b, and the first protection portion 162c can be the same or different, wherein the resin may be thermosetting resin. In one embodiment, the resin may be thermosetting epoxy. In one embodiment, the resin has a glass transition temperature (Tg), wherein Tg is larger than 50° C. In another embodiment, the resin has a glass transition temperature (Tg) larger than 120° C. In one embodiment, the difference of the glass transition temperature (Tg) between the first protection portion 162c and the electrically conductive materials of the first electrical connecting portion 162a and/or the second electrical connecting portion 162b is smaller than 50° C. In one embodiment, a weight ratio of the electrically conductive material to the first region 162 is between 40% and 80%. In another embodiment, the weight ratio of the electrically conductive material to the first region 162 is between 30% and 70%.

Referring to FIG. 1A, in one embodiment, the second region 164 of the connecting structure 160 is able to be electrically and physically connected to the carrier 120 and the second light-emitting unit 144. Similarly, in one embodiment, the third region 166 of the connecting structure 160 is able to be electrically and physically connected to the carrier 120 and the third light-emitting unit 146. The detailed structure, functions, and materials of the second region 164 and the third region 166 are the same as or similar to the first region 162, which can be referred to FIG. 1D and the corresponding paragraphs.

Referring to FIG. 1A, in one embodiment, the light-passing unit 180 covers the light-emitting element 140, the connecting structure 160, and the upper conductive layer 124. In one embodiment, the light-passing unit 180 directly contacts the first light-emitting unit 142, the second light-emitting unit 144, the third light-emitting unit 146, the first region 162, the second region 164 and the third region 166 of the connecting structure 160, and the upper conductive layer 124. In one embodiment, a side wall of the light-passing unit 180 and a side wall of the carrier 120 are coplanar. In another embodiment, the side wall of the light-passing unit 180 and the side wall of the carrier 120 are not coplanar. A surface (not shown) is between the side wall of the light-passing unit 180 and the side wall of the carrier 120, and the surface is not parallel to the side wall of the light-passing unit 180 and the side wall of the carrier 120, wherein the surface may be a lower surface of the light-passing unit 180 or the upper surface of the carrier 120. The light-passing unit 180 is able to protect the light-emitting element 140, the connecting structure 160, and the upper conductive layer 124. Besides, a light emitted from the light-emitting element 140 is able to penetrate the light-passing unit 180 so one surface of the light-passing unit 180 can be as a light extraction surface of the light-emitting device 100. In one embodiment, the penetration rate of the light-passing unit 180 for light with wavelength between 440 nm~470 nm, 510 nm~540 nm, and 610 nm~640 nm is larger than 80%. In one embodiment, the refractive index of the light-passing unit 180 is between 1.3~2.0. In another embodiment, the refractive index of the light-passing unit 180 is between 1.35~1.70. Furthermore, the light-passing unit 180 is able to prevent the upper conductive layer 124 from being oxidized by moisture of the environment.

The material of the light-passing unit 180 may be resin, ceramic, glass or the combination thereof. In one embodiment, the material of the light-passing unit 180 is heat curing resin, wherein the heat curing resin may be epoxy or silicone resin. In one embodiment, the material of the light-passing unit 180 is silicone resin, wherein the composition of silicone resin is able to be adjusted by the requirement of the physical and optical characteristics. In one embodiment, the light-passing unit 180 is made of silicone resin having aliphatic hydrocarbon group, such as methyl cyclosiloxane compound, with better extensibility for bearing thermal stress from the light-emitting element 140. In another embodiment, the light-passing unit 180 is made of silicone resin having aromatic hydrocarbon group, such as phenyl methicone compound, with larger refractive index for improving light extraction percentage of the light-emitting element 140. The smaller difference of the refractive indices of the materials between the light-emitting element 140 and the light extraction surface thereof, the larger the light angle is, and the light extraction percentage can be improved. In one embodiment, the material of the light extraction surface of the light-emitting element 140 is sapphire, of which the refractive index is about 1.77, and the material of the light-passing unit 180 is silicone resin having aromatic hydrocarbon group, of which the refractive index is larger than 1.9.

Figure 2A:
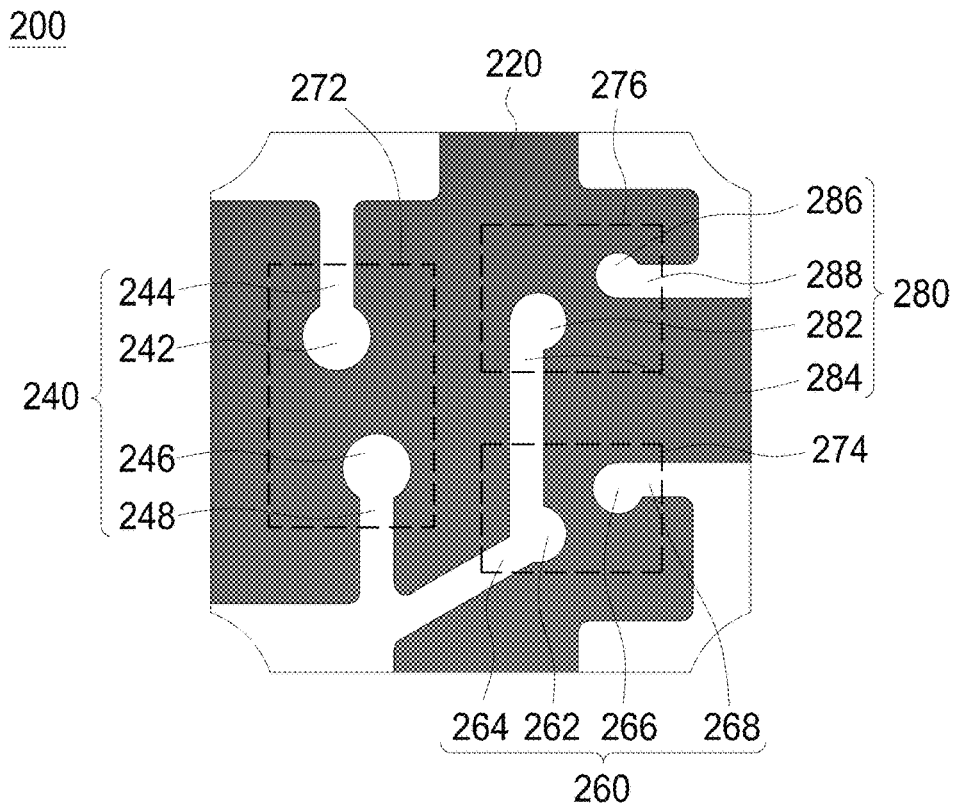
FIG. 2A shows a top view of a carrier of a light-emitting device in accordance with one embodiment of present application.
Figure 2B:
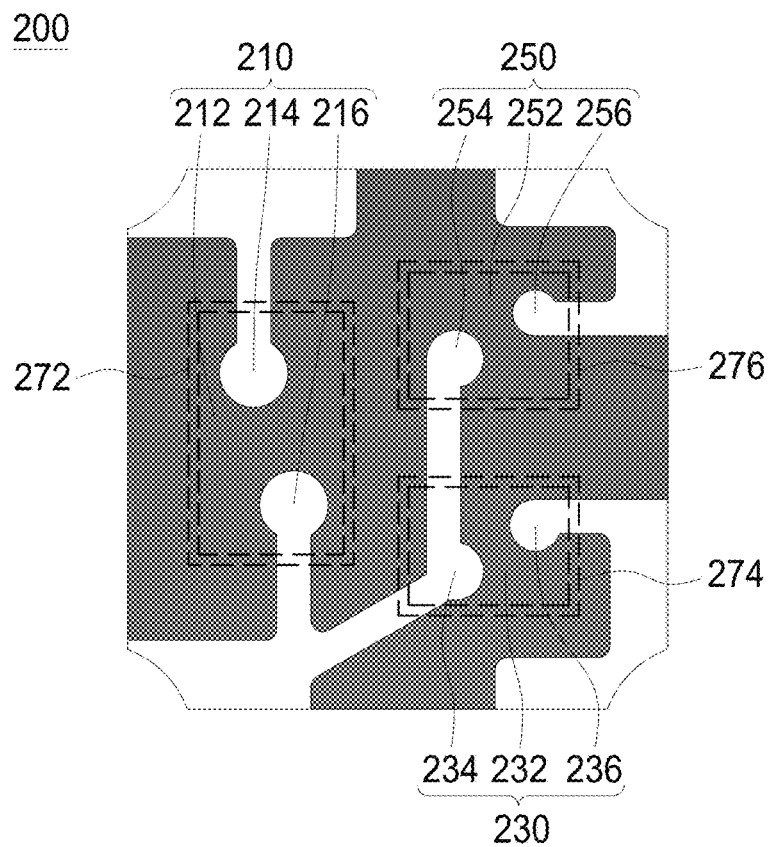
FIG. 2B shows a top view of a carrier and a connecting structure of a light-emitting device in accordance with one embodiment of present application.
Figure 2C:
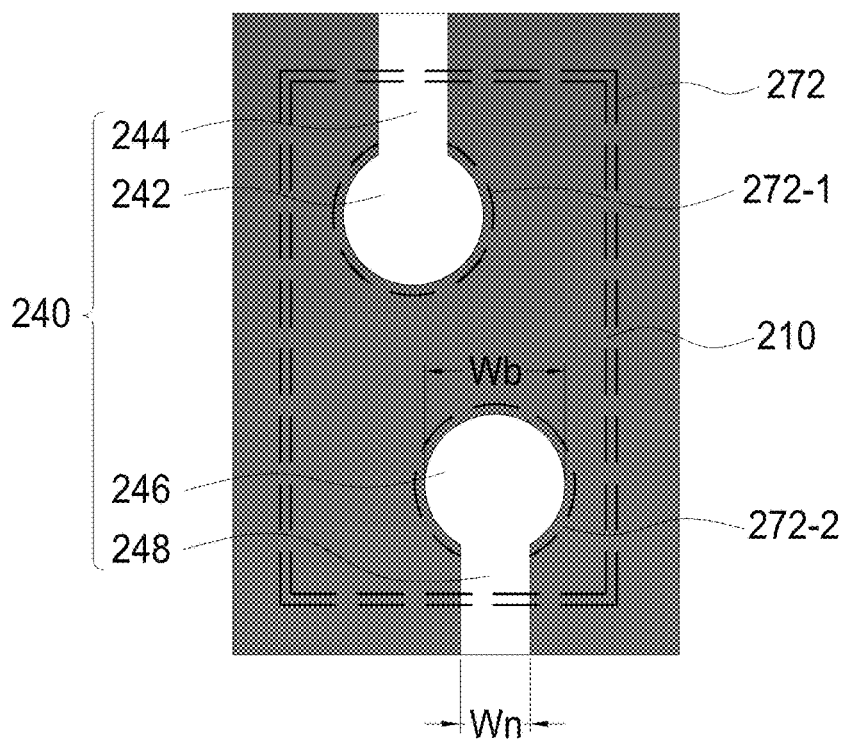
FIG. 2C shows an enlarged diagram of a first region and a first contacting region corresponding to a first light-emitting unit disclosed in FIGS. 2A and 2B.

FIG. 2A shows a top view of a carrier 220 of a light-emitting device 200 in accordance with one embodiment of present application. FIG. 2B shows a top view of a carrier and a connecting structure of the light-emitting device 200 in accordance with one embodiment of present application. FIG. 2C shows an enlarged diagram of a first region 210 and a first contacting region 240 corresponding to a first light-emitting unit 272 disclosed in FIGS. 2A and 2B. In one embodiment, FIGS. 2A~2C and FIGS. 1A~1D show the same embodiment so FIGS. 2A~2C can be interpreted with FIGS. 1A~1D. FIGS. 2A~2C and FIGS. 1A~1D show different embodiments. In one embodiment, the carrier 220 includes an upper conductive layer, wherein the upper conductive layer includes a first contacting region 240, a second contacting region 260, and a third contacting region 280. In one embodiment, the first contacting region 240 is corresponding to the first light-emitting unit 272. The second contacting region 260 is corresponding to a second light-emitting unit 274. The third contacting region 280 is corresponding to a third light-emitting unit 276. Taking the first light-emitting unit 272 and the corresponding first contacting region 240 as an example, in one embodiment, the first contacting region 240 includes a first connecting portion 242, a first necking portion 244, a second connecting portion 246 and a second necking portion 248. And, referring to FIG. 2C, the first necking portion 244 can be extended from the first connecting portion 242 or be connected to the first connecting portion 242 to each other. The first connecting portion 242 can be a main electrical connection for a contacting electrode 272-1 of the first light-emitting unit 272. The first necking portion 244 can be connected to a portion of the upper conductive layer to be a bridge of outside electrical connection. In one embodiment, the first connecting portion 242 has an area the same as or similar to the area of the contacting electrode 272-1 of the first light-emitting unit 272. In one embodiment, an area ratio of the first connecting portion 242 to the contacting electrode 272-1 of the first light-emitting unit 272 is between 0.8 and 12. Besides, a width Wb of the first connecting portion 242 is larger than a width Wn of the first necking portion 244. In one embodiment, a ratio of the width Wn of the first necking portion 244 to the width Wb of the first connecting portion 242 is smaller than 0.6. Similarly, an area ratio of the second connecting portion 246 to the other contacting electrode 272-2 of the first light-emitting unit 272 is between 0.8 and 12. A ratio of the width Wn of the second necking portion 248 to the width Wb of the second connecting portion 246 is smaller than 0.6. The width Wb and the width Wn respectively mean the largest widths of the connecting portion and the necking portion. For example, as the shape of the connecting portion is a circle, the width Wb of the connecting portion is the diameter of the circle. In one embodiment, the smallest distance between the first connecting portion 242 and the second connecting portion 246 is smaller than 100 μm. In another embodiment, the smallest distance between the first connecting portion 242 and the second connecting portion 246 is smaller than 50 μm.

Referring to FIG. 2B, in one embodiment, the connecting structure includes the first region 210, a second region 230, and a third region 250. In one embodiment, as shown in FIG. 2A, the first contacting region 240 is connected to the first light-emitting unit 272 through the first region 210 of the connecting structure. A first electrical joint portion 214 of the first region 210 is formed on the first connecting portion 242 and electrically connected to one electrode the first light-emitting unit 272, and a second electrical joint portion 216 is formed on the second connecting portion 246 and is electrically connected to another electrode of the first light-emitting unit 272. A first protection portion 212 covers the first electrical joint portion 214 and the second electrical joint portion 216. Besides, as shown in FIG. 2A, in one embodiment, the first connecting portion 242 is approximately located in a region surrounded by first protection portion 212. In one embodiment, the area which the first connecting portion 242 covers is larger than or similar to the area of the first light-emitting unit 272.

As shown in FIGS. 2A and 2B, the second light-emitting unit 274 is corresponding to the second region 230 and the second contacting region 260. The structures and functions of a second protection portion 232, a third electrical joint portion 234, and a fourth electrical joint portion 236 of the second region 230 can be the same or similar to those of the first protection portion 212, the first electrical joint portion 214, and the second electrical joint portion 216. The structures and functions of a third connecting portion 262, a third necking portion 264, a fourth connecting portion 266, and a fourth necking portion 268 of the second contacting region 260 can be the same or similar to those of the first connecting portion 242, the first necking portion 244, the second connecting portion 246, and the second necking portion 248. Similarly, the third light-emitting unit 276 is corresponding to the third region 250 and the third contacting region 280. The structures and functions of a third protection portion 252, a fifth electrical joint portion 254 and a sixth electrical joint portion 256 of the third region 250 can be the same or similar to those of the first protection portion 212, the first electrical joint portion 214, and the second electrical joint portion 216. The structures and functions of a fifth connecting portion 282, a fifth necking portion 284, an sixth connecting portion 286, and an sixth necking portion 288 of the third contacting region 280 can be the same or similar to those of the first connecting portion 242, the first necking portion 244, the second connecting portion 246, and the second necking portion 248.

Figure 3A:
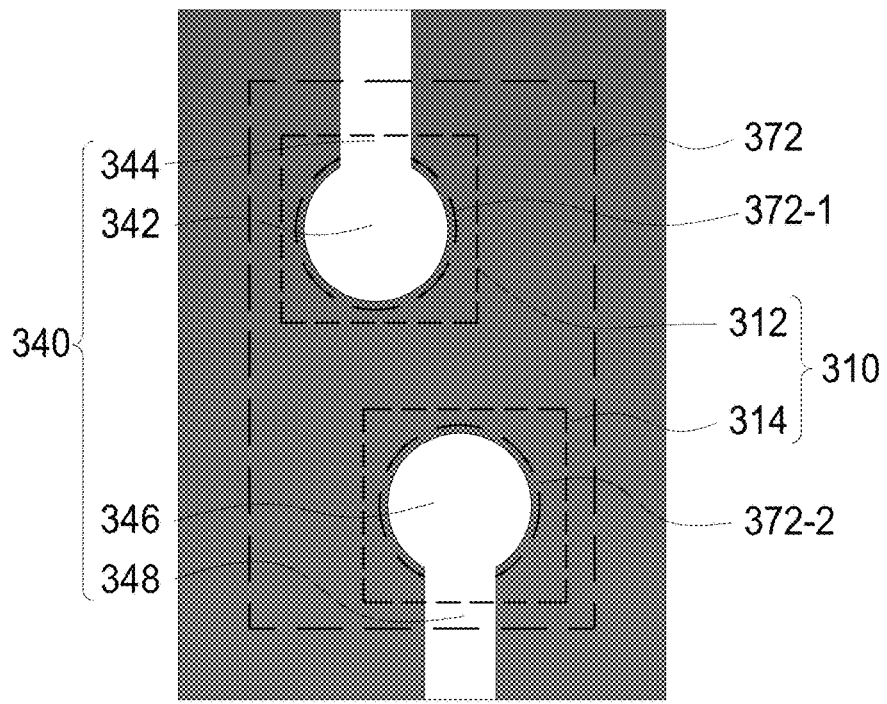
FIG. 3A shows a top view of a first region and a first contacting region corresponding to a first light-emitting unit in accordance with one embodiment of present application.
Figure 3B:
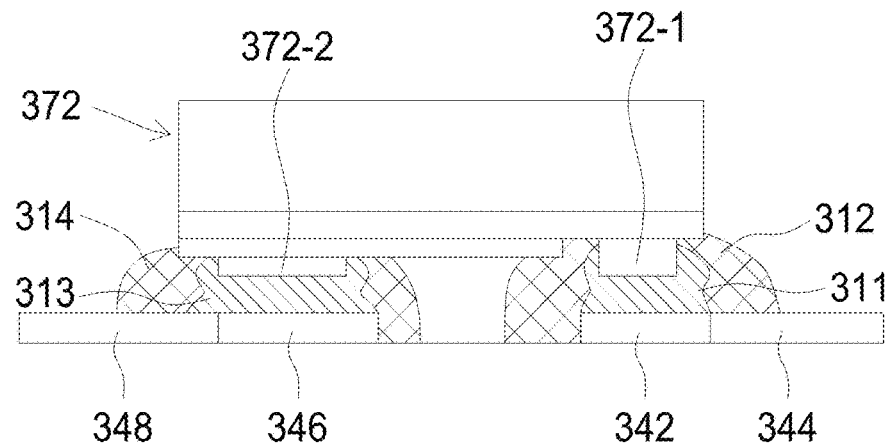
FIG. 3B shows a cross-sectional view of the first light-emitting unit connected to the first contacting region disclosed FIG. 3A.

FIG. 3A shows a top view of a first region 310 and a first contacting region 340 corresponding to a first light-emitting unit 372 in accordance with one embodiment of present application. FIG. 3B shows a cross-sectional view of the first light-emitting unit 372 connected to the first contacting region 340 disclosed in FIG. 3A. Referring to FIGS. 3A and 3B, what differs FIG. 3A from FIG. 2A is in the first region 310 including two protection portions 312, 314. In one embodiment, a contacting electrode 372-1, a first connecting portion 342 of the first contacting region 340 and a first electrical connecting portion 311 are covered by the protection portions 312. A portion of a first necking portion 344 is covered by the protection portions 312. Besides, a contacting electrode 372-2, a second connecting portion 346, and a second electrical connecting portion 313 are covered by the protection portions 314. Besides, a portion of a second necking portion 348 is covered by the protection portions 314.

Figure 4:
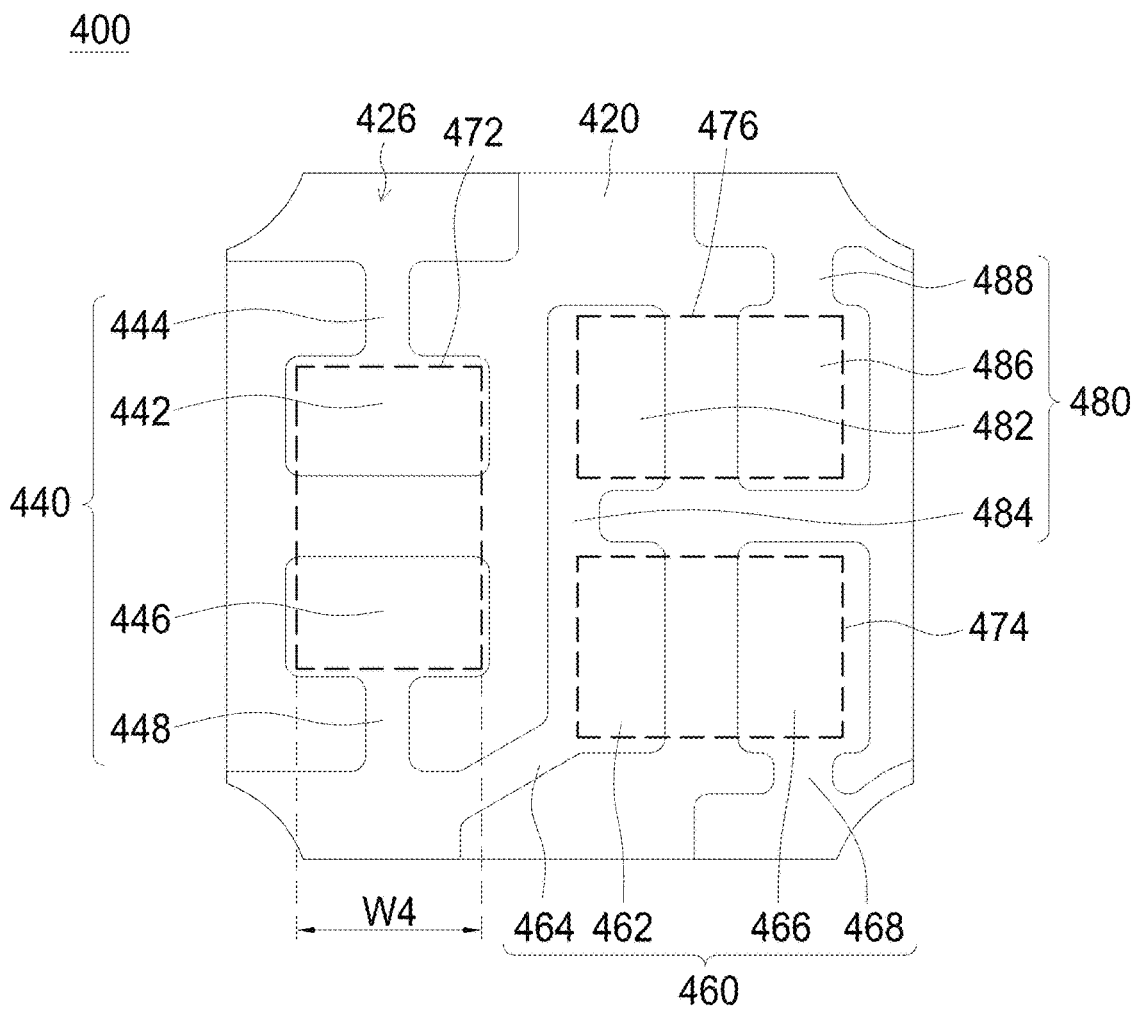
FIG. 4 shows a top view of a carrier of a light-emitting device in accordance with one embodiment of present application.

FIG. 4 shows a top view of a carrier 420 of a light-emitting device 400 in accordance with one embodiment of present application. In one embodiment, the carrier 420 includes an upper conductive layer 426, wherein the upper conductive layer 426 includes a first contacting region 440, a second contacting region 460, and a third contacting region 480. Taking the first contacting region 440 as an example, the difference between the first contacting region 440 in FIG. 4 and the first contacting region 240 in FIG. 2A is that the width or area of a first connecting portion 442 is larger than those of a corresponding electrode (not shown) of a first light-emitting unit 472. In one embodiment, the width of the first connecting portion 442 is larger than the width W4 of the first light-emitting unit 472 and a width a first necking portion 444 is smaller than the width of the first connecting portion 442. Similarly, a width of a second connecting portion 446 is larger the width W4 of the first light-emitting unit 472 and a width of a second necking portion 448 is smaller than the width of a second connecting portion 446. In another embodiment, the width of the first connecting portion 442 is equal to or smaller than the width W4 of the first light-emitting unit 472. Besides, a second light-emitting unit 474 is corresponding to the second contacting region 460. The structures and functions of a third connecting portion 462, a third necking portion 464, a fourth connecting portion 466, and a fourth necking portion 468 of the second contacting region 460 can be the same or similar to those of the first connecting portion 442, the first necking portion 444, the second connecting portion 446, and the second necking portion 448. Furthermore, the third light-emitting unit 476 is corresponding to the third contacting region 480. The structures and functions of a fifth connecting portion 482, a fifth necking portion 484, an sixth connecting portion 486, and a sixth necking portion 488 of the third contacting region 480 can be the same or similar to those of the first connecting portion 442, the first necking portion 444, the second connecting portion 446, and the second necking portion 448. When the area of the connecting portion of the upper conductive layer 426 is increased, the height non-uniformity among the light-emitting units and the tilting of the light-emitting units both caused by the volume difference of different regions of the connecting structure can be reduced. In detail, the larger the area of the connecting portion of the conductive layer, the flatter the connecting portion is on the connecting portion for being connected to the electrodes of the light-emitting units. Thus, even though the volumes of the connecting portions are different, the difference in height between the light-emitting units is not too large.

Figure 5A:
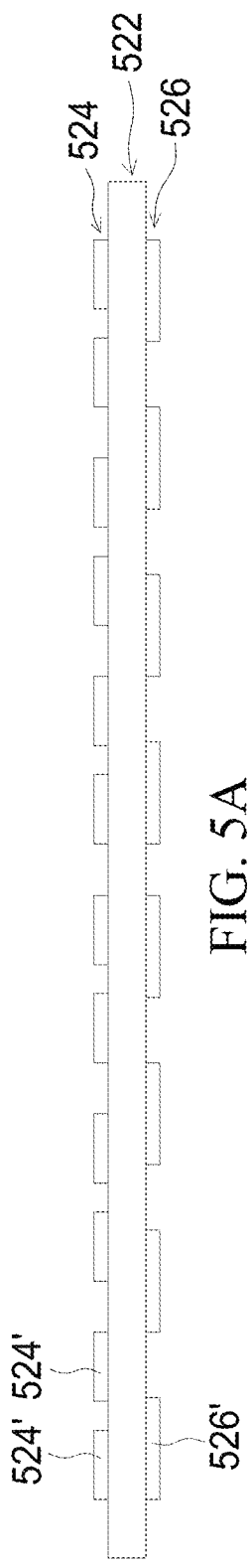
FIGS. 5A~5J show a process of manufacturing a light-emitting device in accordance with one embodiment of present application.

FIGS. 5A~5J show a manufacturing process of a light-emitting device 100 shown in FIG. 1 in accordance with one embodiment of present application. Referring to FIG. 5A, a carrier is provided, wherein the carrier includes an insulating layer 522, an upper conductive layer 524, and a lower conductive layer 526. The upper conductive layer 524 and the lower conductive layer 526 respectively have a plurality of connecting terminals 524', 526', wherein the plurality of connecting terminals 524', 526' is able to be electrically connected to a plurality of light-emitting elements. In one embodiment, each of the plurality of light-emitting elements includes three light-emitting units, wherein each of the three light-emitting units needs two electrodes corresponding to the connecting terminals 524' of the upper conductive layer 524 or the connecting terminals 526' of the lower conductive layer 526. Thus, the upper conductive layer 524 includes 3*2*N connecting terminals 524', wherein N can be an integral larger than 1. The three light-emitting units have a common electrode, so the lower conductive layer 526 includes 4*N connecting terminals 526'.

Figure 5B:
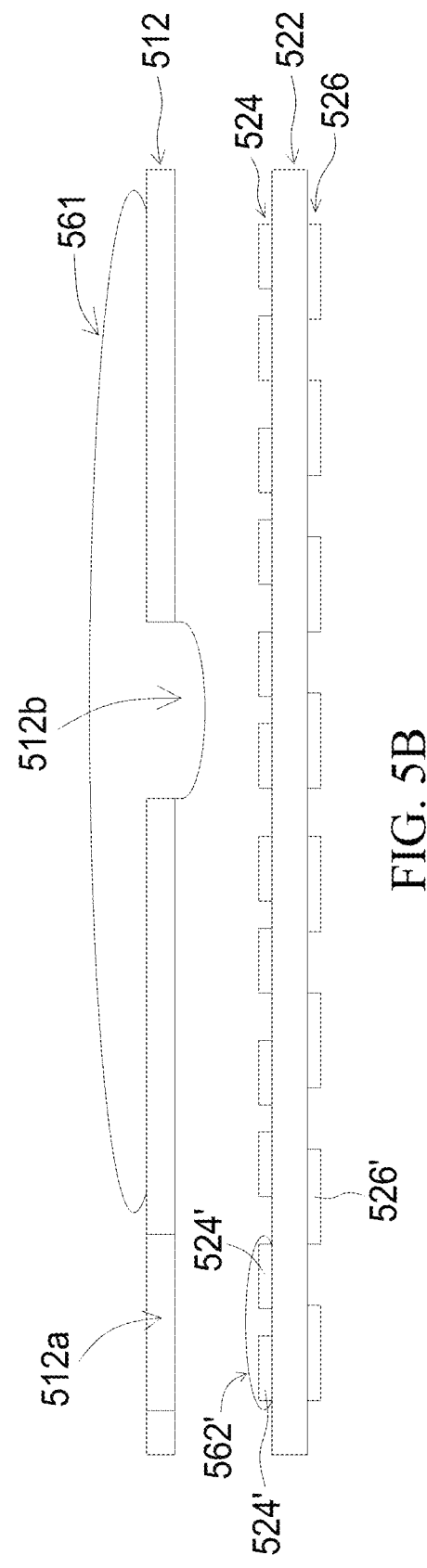
Figure 5C:
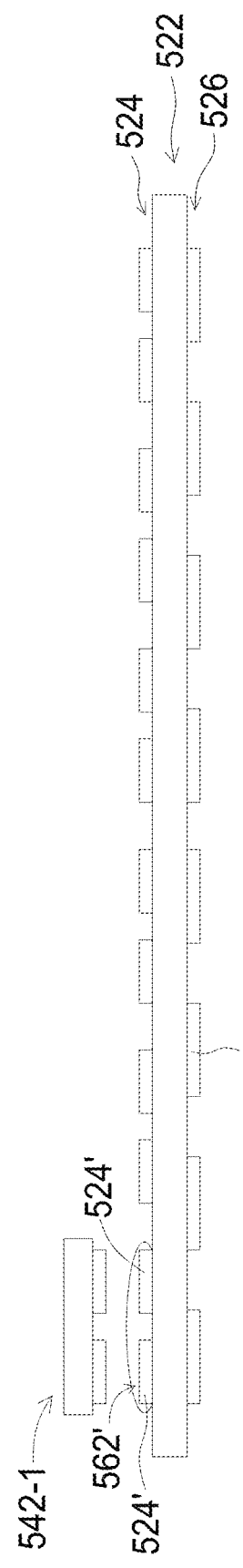

Referring to FIG. 5B, the glue 561 with electrically conductive particles (not shown) forms an unsolidified block 562' on the upper conductive layer 524 after passing through the hole 512b of a patterned jig 512. The patterned jig 512 can be a stencil or a printing plate. In one embodiment, the positions where the unsolidified blocks 562' are formed on the upper conductive layer 524 are corresponding to the positions where a group of the light-emitting units are electrically connected or the two electrodes of a light-emitting unit are formed. In another embodiment, each of the positions of the unsolidified blocks 562' is corresponding to the position where the electrodes of each light-emitting unit of one group of the light-emitting units are electrically connected to, wherein the group of the light-emitting units means the light-emitting units which emit light with the same peak wavelength (Wp) or the same color. For example, all of the light-emitting units in a group emit red light, all of the light-emitting units in a group emit blue light, or all of the light-emitting units in a group emit green light. Referring to FIG. 5C, a first group of light-emitting units 542-1 is connected to the unsolidified blocks 562' and formed on the upper conductive layer 524. In one embodiment, referring to FIGS. 5C and 5D, the light-emitting units 542-1, 542-2 of the first group 542 are formed on the upper conductive layer 524 one by one. To be more specific, the light-emitting unit 542-1 is firstly formed on the upper conductive layer 524 and the light-emitting unit 542-2 is formed subsequently. Alternatively, the light-emitting units 542-1, 542-2 can be formed on the upper conductive layer 524 at the same time.

Figure 5D:
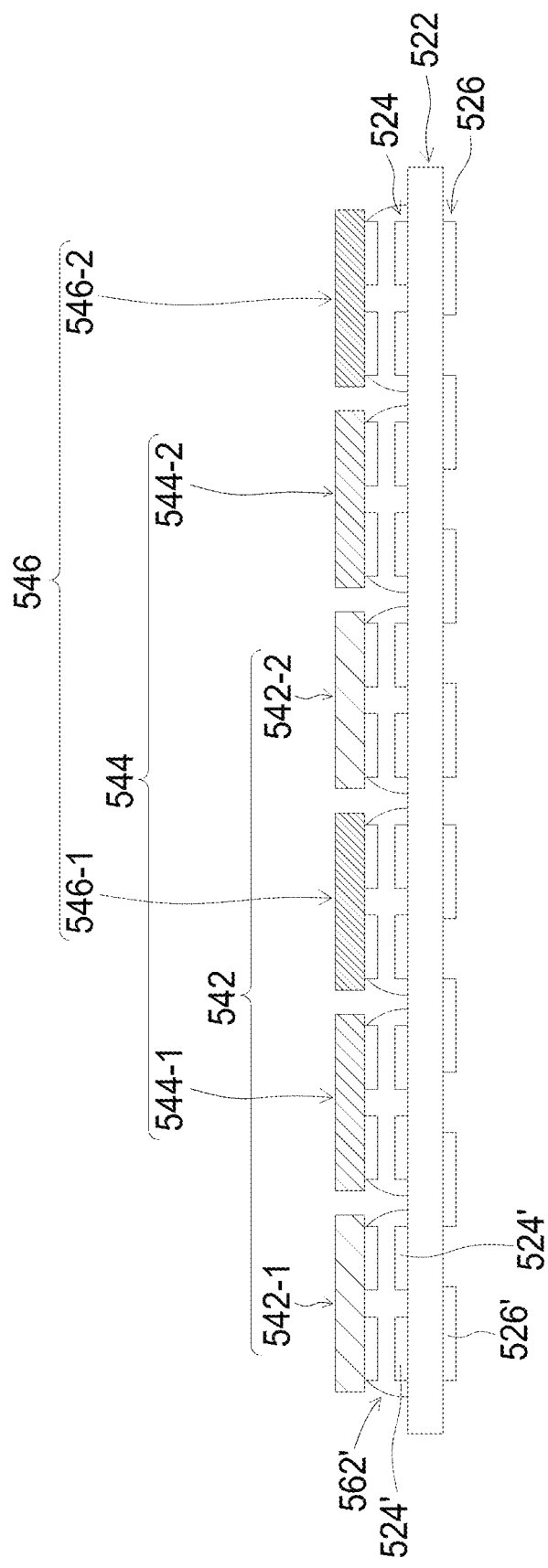

Referring to FIG. 5D, in one embodiment, groups 542, 544, 546 of multiple light-emitting units are formed on the same carrier, and the multiple light-emitting units 542-1, 544-1, 546-1, 542-2, 544-2, 546-2 are respectively formed on different unsolidified blocks 562' on the upper conductive layer 524. In FIG. 5D, in each of the groups, the number of the light-emitting units is 2, but not limited to, or can be an integer larger than 1.

Figure 5E:
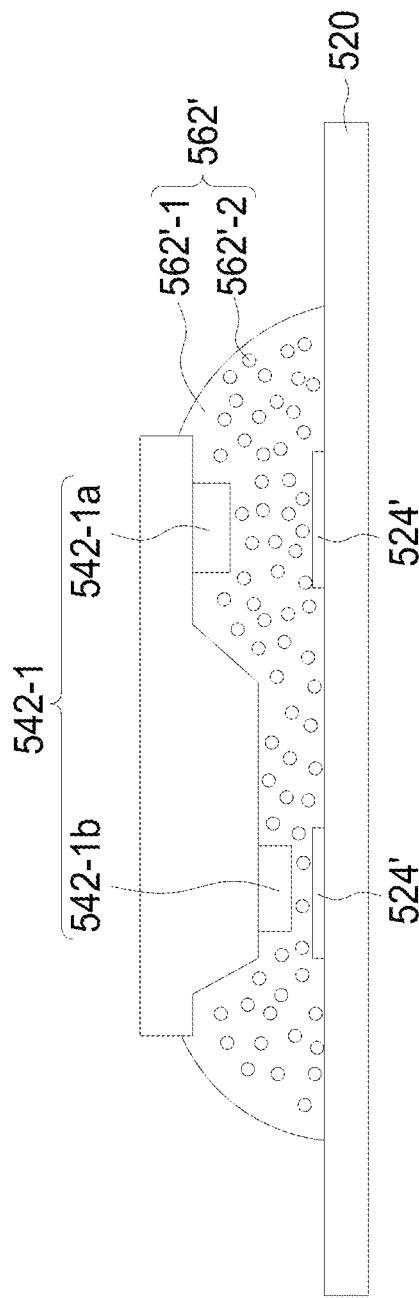
Figure 5F:
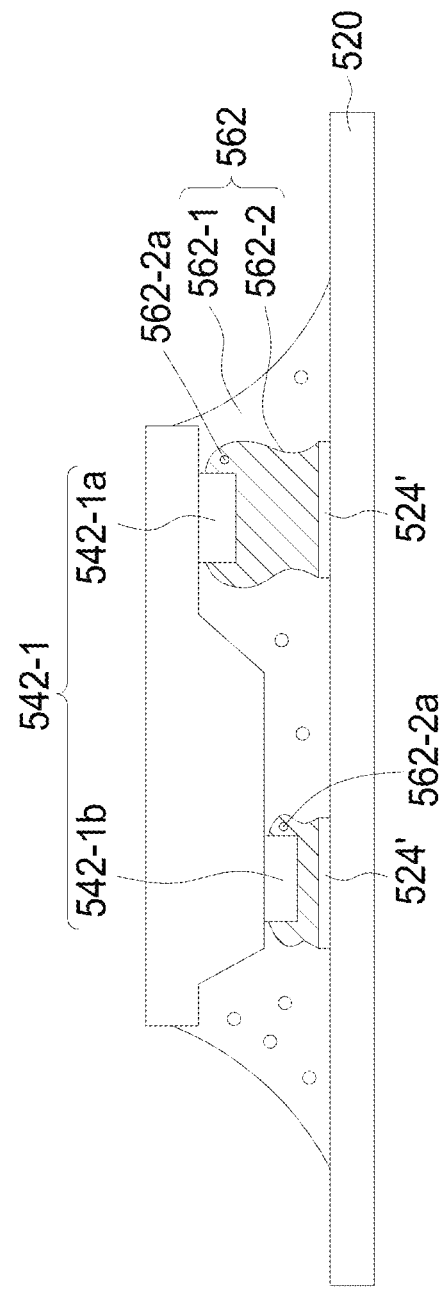

FIG. 5E and FIG. 5F respectively show detailed structures of one unsolidified block and one solidified block connecting the light-emitting unit 542-1 and carrier 520. Referring to 5E, the electrically conductive particles 562'-2 in the unsolidified blocks 562' are spread in a protection portion 562'-1. The protection portion 562'-1 has not solidified so protection portion 562'-1 is in liquid state. In one embodiment, during solidifying process, the viscosity of the protection portion 562'-1 is firstly decreased and then increased, and the electrically conductive particles 562'-2 gather between or surrounding the electrodes 542-1a, 542-1b of the light-emitting unit 542-1 and the upper conductive layer 524. The electrically conductive particles 562'-2 experience a molten state during gathering. Referring to 5F, after the protection portion 562'-1 is solidified, the electrically conductive particles 562'-2 form electrical connecting portions 562-2 and the protection portion 562'-1 forms a solidified protection portion 562-1. In one embodiment, a part of the electrically conductive particles 562'-2 does not gather between or surrounding the electrodes 542-1a, 542-1b and the upper conductive layer 524 so portions of the electrically conductive particles 562'-2 are separated from each other and exist between the electrical connecting portions 562-2.

Figure 5G:
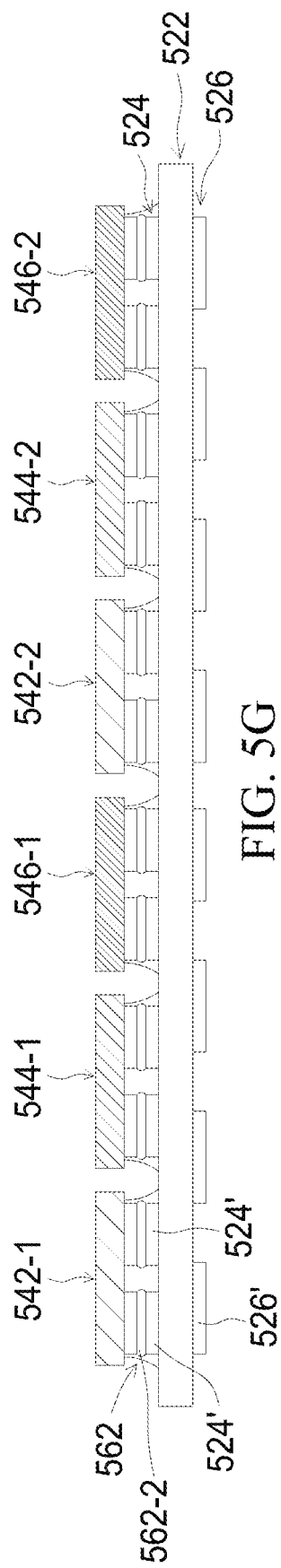
Figure 5H:
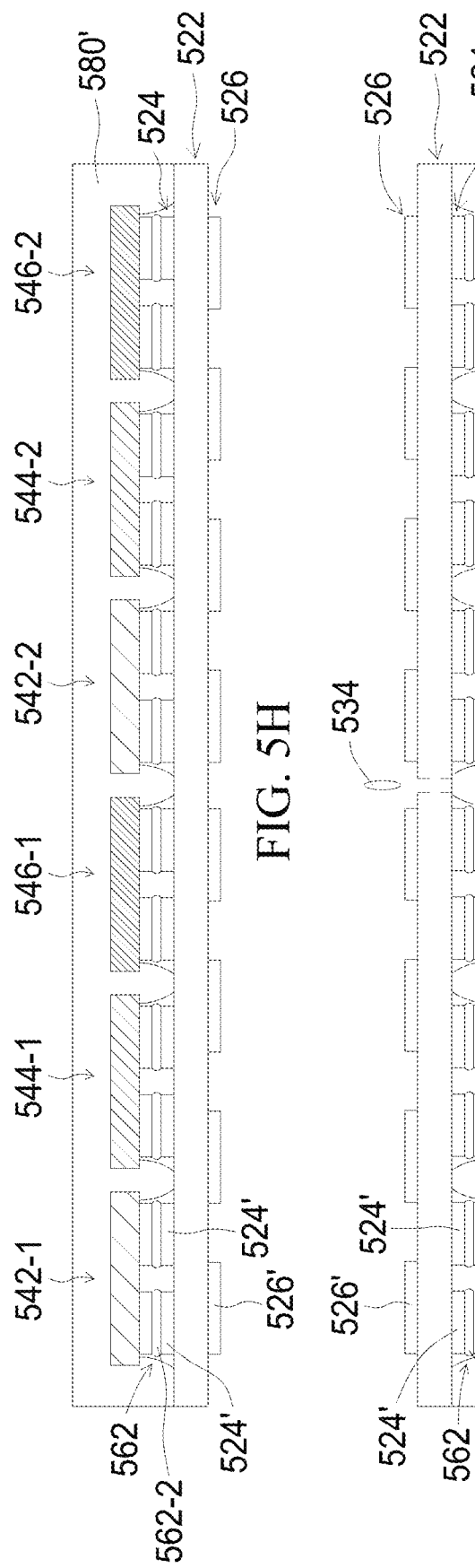

Referring to FIG. 5G, connecting structures 562 between the upper conductive layer 524 and the corresponding light-emitting units 542-1, 542-2 of the first group, the light-emitting units 544-1, 544-2 of a second group, and the light-emitting units 546-1, 546-2 of a third group are solidified and in electrical connecting state. In one embodiment, the solidification of the connecting structures 562 and the electrical connection among the light-emitting units 542-1, 542-2 of the first group, the light-emitting units 544-1, 544-2 of the second group, the light-emitting units 546-1, 546-2 of the third group, and the upper conductive layer 524 are formed at the same time. In another embodiment, the light-emitting units 542-1, 542-2 of the first group are disposed on the upper conductive layer 524 and the corresponding unsolidified blocks 562' can be firstly solidified and form electrical connection. After that, the light-emitting units 544-1, 544-2 of the second group are disposed on the upper conductive layer 524 and the corresponding unsolidified blocks 562' are solidified and form electrical connection. Then, the light-emitting units 546-1, 546-2 of the third group are disposed on the upper conductive layer 524 and the corresponding unsolidified blocks 562' are solidified and forms electrical connection. Referring to FIG. 5H, a light-passing unit 580' is formed to cover the light-emitting units 542-1, 542-2 of the first group, the light-emitting units 544-1, 544-2 of the second group, and the light-emitting units 546-1, 546-2 of the third group. In one embodiment, the light-passing unit 580' continuously covers the light-emitting units 542-1, 542-2 of the first group, the light-emitting units 544-1, 544-2 of the second group, and the light-emitting units 546-1, 546-2 of the third group. The method of forming the light-passing unit 580' includes coating and molding processes. In one embodiment, after the light-passing unit 580' covering the first group of light-emitting units 542, the second group of light-emitting units 544 and the third group of light-emitting units 546, the light-passing unit 580' is solidified.

Figure 5I:
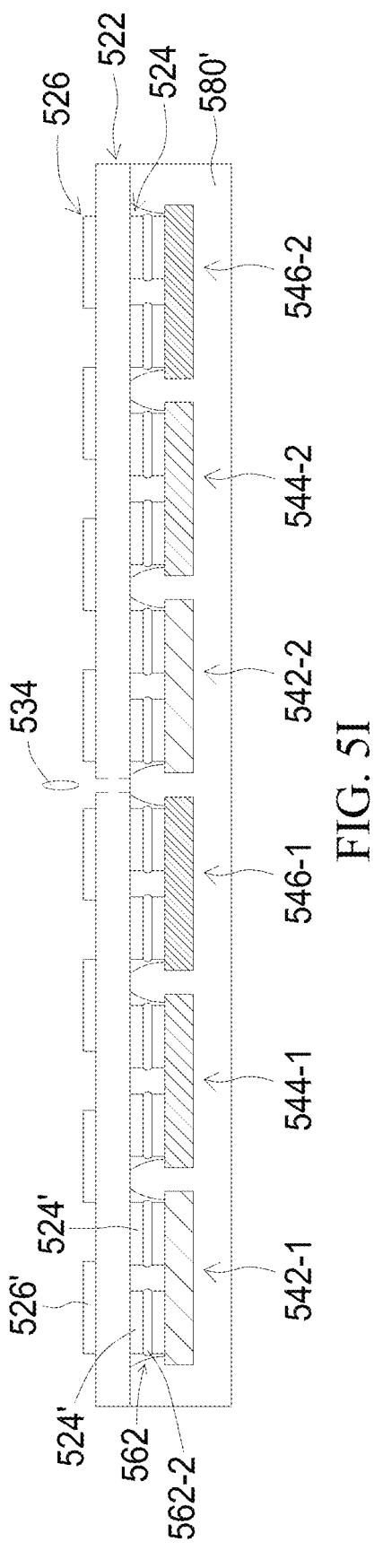
Figure 5J:
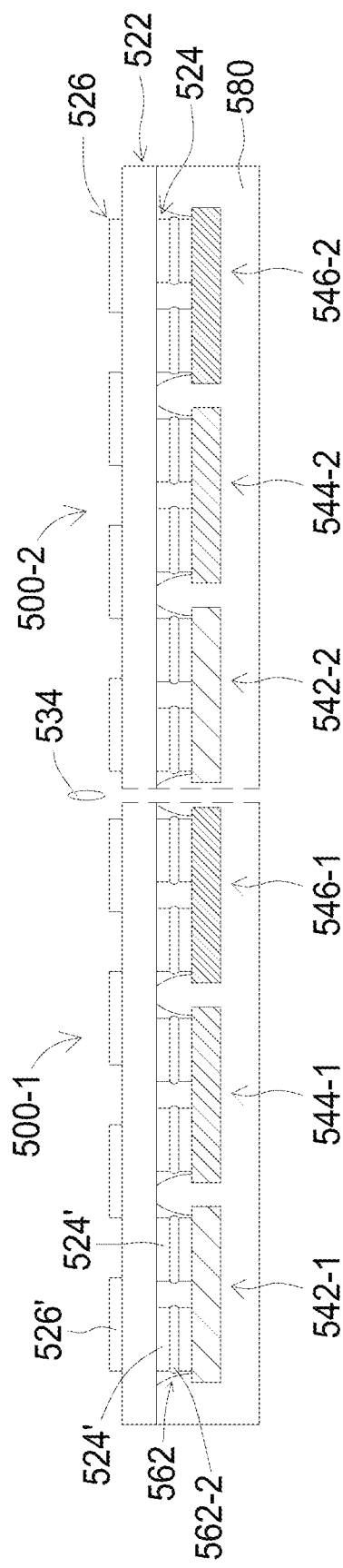

FIG. 5I and FIG. 5J show the steps of separating the light-emitting devices. In one embodiment, the insulating layer 522 of the carrier and the light-passing unit 580' are separated in two steps. Referring to FIG. 5I, the first separation step includes cutting the insulating layer 522 of the carrier to form cutting lanes by a cutting tool 534. Referring to FIG. 5J, the second separation step includes cutting the light-passing unit 580' to form light-emitting devices 500-1, 500-2 by a cutting tool 534. In another embodiment, the sequence of cutting the insulating layer 522 of the carrier and cutting the light-passing unit 580' can be changed so the light-passing unit 580' can be separated before separating the insulating layer 522 of the carrier. In another embodiment, the insulating layer 522 and the light-passing unit 580' can be separated in the same step so the side walls of the insulating layer 522 and the light-passing unit 580 can be coplanar.

Figure 6A:
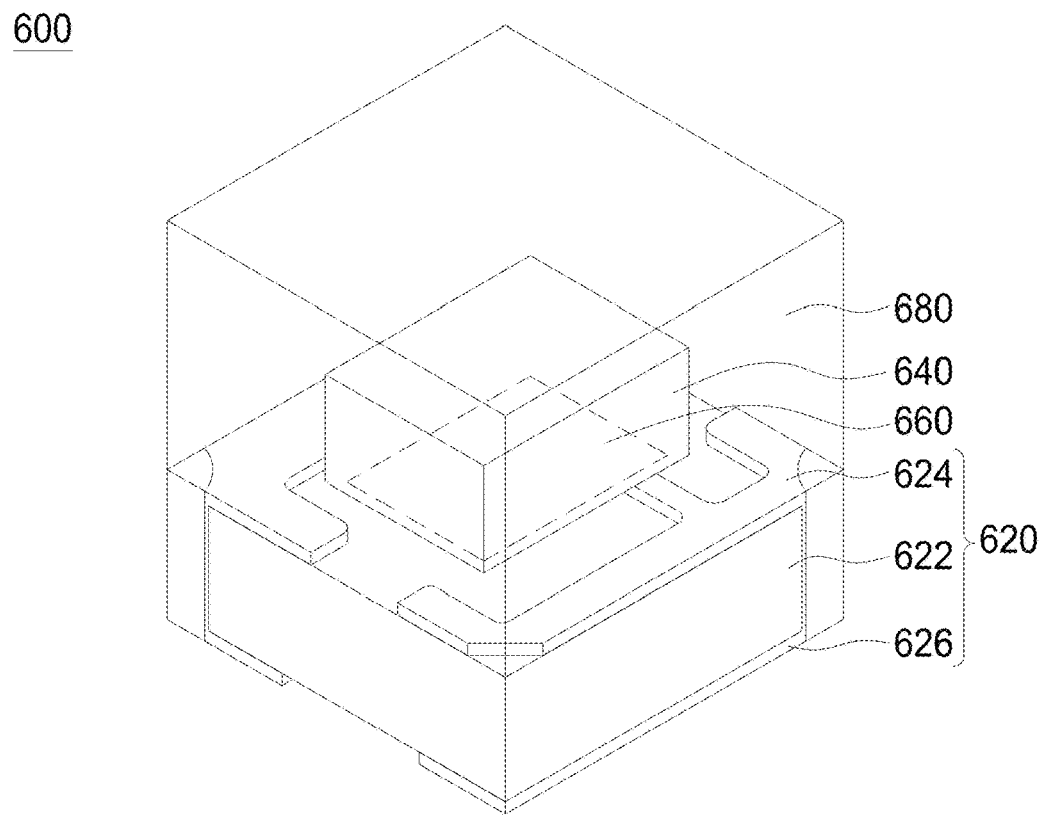
FIG. 6A shows a three-dimensional view of a light-emitting device in accordance with one embodiment of present application.
Figure 6B:
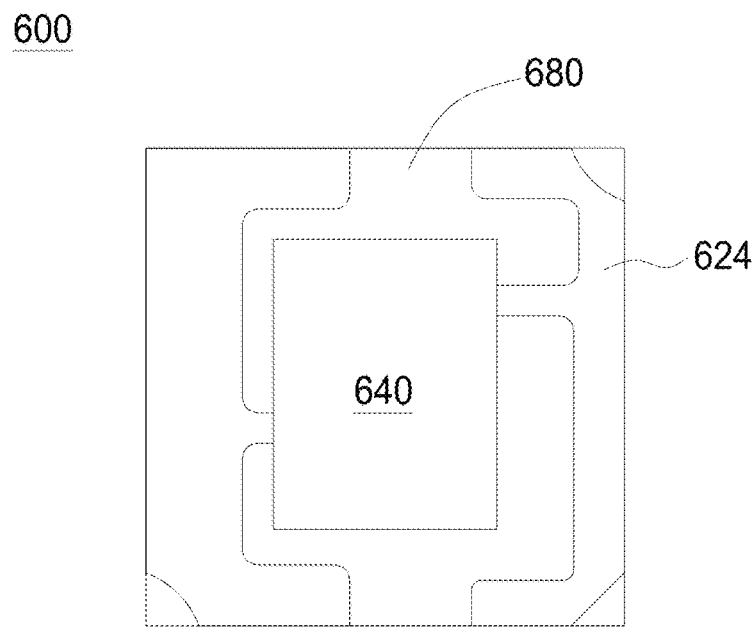
Figure 6C:
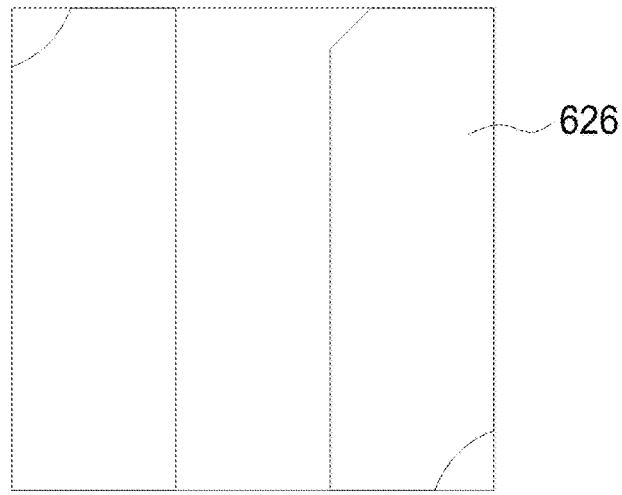
FIG. 6C shows a bottom view of the light-emitting device disclosed in FIG. 6A.

FIG. 6A shows a three-dimensional view of a light-emitting device 600 in accordance with one embodiment of present application. FIG. 6B shows a top view of the light-emitting device 600. FIG. 6C shows a bottom view of the light-emitting device 600. The light-emitting device 600 includes a carrier 620, a light-emitting element 640, a connecting structure 660, and a light-passing unit 680. In one embodiment, the light-emitting element 640 is formed on the carrier 620, the connecting structure 660 is formed between the carrier 620 and the light-emitting element 640, and the light-passing unit 680 covers the light-emitting element 640 and the connecting structure 660. The detailed structures, functions, and forming methods of the carrier 620, the light-emitting element 640, the connecting structure 660 and the light-passing unit 680 can be referred to FIG. 1 and the related paragraphs.

What differs the light-emitting device 600 in FIG. 6A from the light-emitting device 100 is the light-emitting element 640 including only one light-emitting unit for emitting a first light and the light-passing unit 680 including wavelength conversion material excited by the first light for emitting a second light. In one embodiment, a light emitted from the light-emitting device 600 is a mixed light including at least two lights with different wavelengths and the color thereof is a white light. In one embodiment, the light-emitting element 640 comprises a blue light-emitting diode for emitting a first light when driven by an electrical power. The first light has a dominant wavelength or a peak wavelength between 430 nm~490 nm. In another embodiment, the light-emitting element 640 comprises a UV light-emitting diode, and the first light has a dominant wavelength or a peak wavelength between 400 nm~430 nm. The wavelength conversion material in the light-passing unit 680 can be wavelength conversion particles dispersed in the light-passing unit (not shown).

In one embodiment, after the wavelength conversion material absorbs the first light, such as UV or blue light, the wavelength conversion material is excited to emit a second light, which can be a yellow light having the dominant wavelength or peak wavelength between 530 nm~590 nm. In another embodiment, after the wavelength conversion material absorbs the first light, such as UV or blue light, the wavelength conversion material is excited to emit a second light, which can be a green light having the dominant wavelength or peak wavelength between 515 nm~575 nm. In another embodiment, after the wavelength conversion material absorbs the first light, such as UV or blue light, the wavelength conversion material is excited to emit a second light, which can be a red light having dominant wavelength or peak wavelength is between 600 nm~660 nm.

The wavelength conversion material comprises one type of wavelength conversion particles or multiple types of wavelength conversion particles. In one embodiment, the wavelength conversion material comprises multiple types of wavelength conversion particles being able to emit green and red lights. Thus, besides emitting the second light which is green light, the wavelength conversion material is able to emit a third light which is a red light and can be mixed with the first light, which is not absorbed, to form a mixed light. In another embodiment, the first light is completely or almost completely absorbed by the wavelength conversion material. In the description, "almost completely" means, in the mixed light, a light intensity of the first light is equal to or smaller than 3% of the light intensity of the second light or third light.

The material of the wavelength conversion material includes inorganic phosphor, organic fluorescent colorant, semiconductor or combination thereof. The semiconductor includes nano-crystal semiconductor, such as quantum dot.

Referring to FIG. 6B, a portion of an upper conductive layer 624 of the carrier 620 of the light-emitting device 600 is covered by the light-emitting element 640 and a portion thereof is exposed. Besides, the light-passing unit 680 covers the light-emitting element 640 and the exposed upper conductive layer 624. Referring to FIG. 6C, a lower conductive layer 626 of the light-emitting device 600 includes two separating electrode pads. In one embodiment, one of the electrode pads has one bevel for identification purpose.

Figure 7:
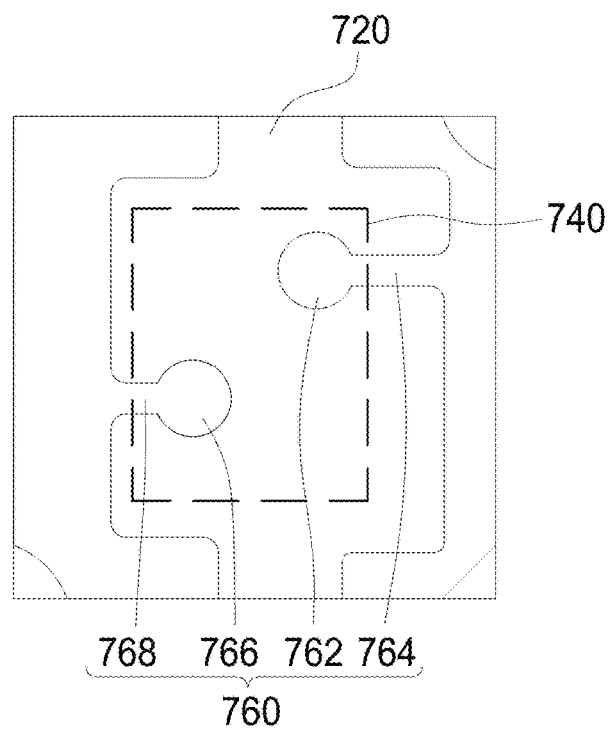
FIG. 7 shows a top view of a carrier of a light-emitting device in accordance with one embodiment of present application.

FIG. 7 shows a top view of a carrier 720 of a light-emitting device 700 in accordance with one embodiment of present application. In one embodiment, FIG. 7 and FIGS. 6A~6C describe the same embodiment so FIG. 7 can be read with FIGS. 6A~6C. In one embodiment, the carrier 720 includes an upper conductive layer and the upper conductive layer includes a connecting region 760. The connecting region 760 includes a first connecting portion 762, a first necking portion 764, a second connecting portion 766, and a second necking portion 768. In one embodiment, the connecting region 760 is corresponding to a light-emitting unit 740. The light-emitting unit 740 covers the first connecting portion 762, the second connecting portion 766, a portion of the first necking portion 764, and a portion of the second necking portion 768. The detailed structure, functions, and forming method of the connecting region 760 can be referred to FIG. 2A or FIG. 4 and the related paragraphs.

Figure 8:
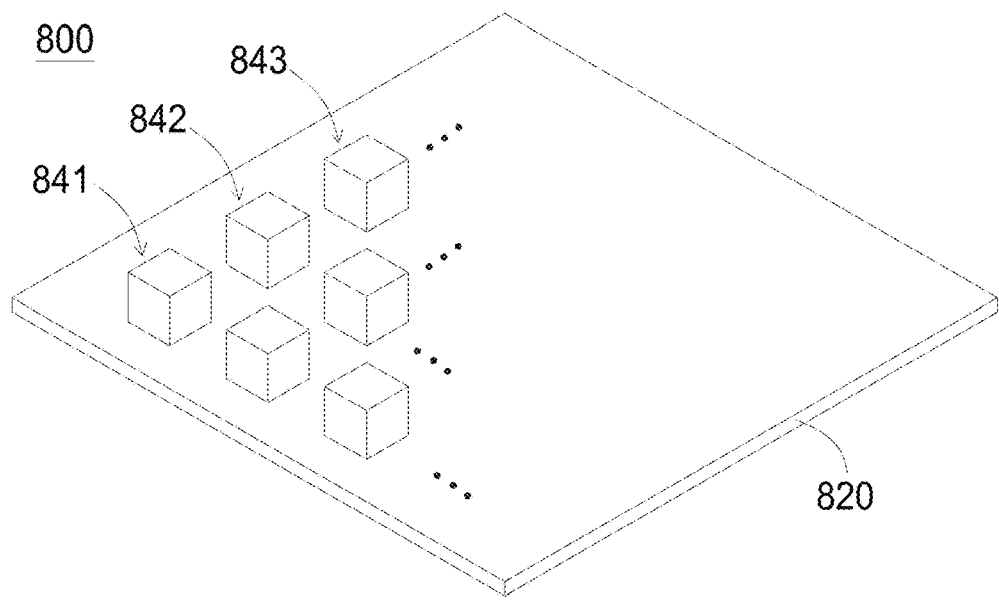
FIG. 8 shows a display module in accordance with one embodiment of present application.

FIG. 8 shows a display module 800 in accordance with one embodiment of present application. The display module 800 includes a carrier 820, such as a circuit board, and a plurality of light-emitting devices 841, 842, 843. In one embodiment, the plurality of light-emitting devices 841, 842, 843 is arranged in an array on the carrier 820 and electrically connects the circuit of the carrier 820. In one embodiment, each of the plurality of light-emitting devices 841, 842, 843 is a pixel, wherein the detailed structure thereof can be a light-emitting device shown in FIGS. 1A~1D. A surface of the carrier 820 has a light-absorbing layer (not shown), such as black layer, for improving the contrast of the display module 800 as playing image. In one embodiment, in the top view, the shape of the plurality of light-emitting devices 841, 842, 843 is rectangle, such as square, and the size thereof is between 0.1 mm~1 mm. In another embodiment, the size of the plurality of light-emitting devices 841, 842, 843 is between 0.1 mm~0.5 mm. In another embodiment, the size of the plurality of light-emitting devices 841, 842, 843 is between 0.2 mm~2 mm. In another embodiment, the size of the plurality of light-emitting devices 841, 842, 843 is between 0.5 mm~1.2 mm. In another embodiment, the plurality of light-emitting devices 841, 842, 843 is a white light source, and the detailed structure thereof can be referred to the light-emitting device shown in FIGS. 6A~6C.

Figure 9A:
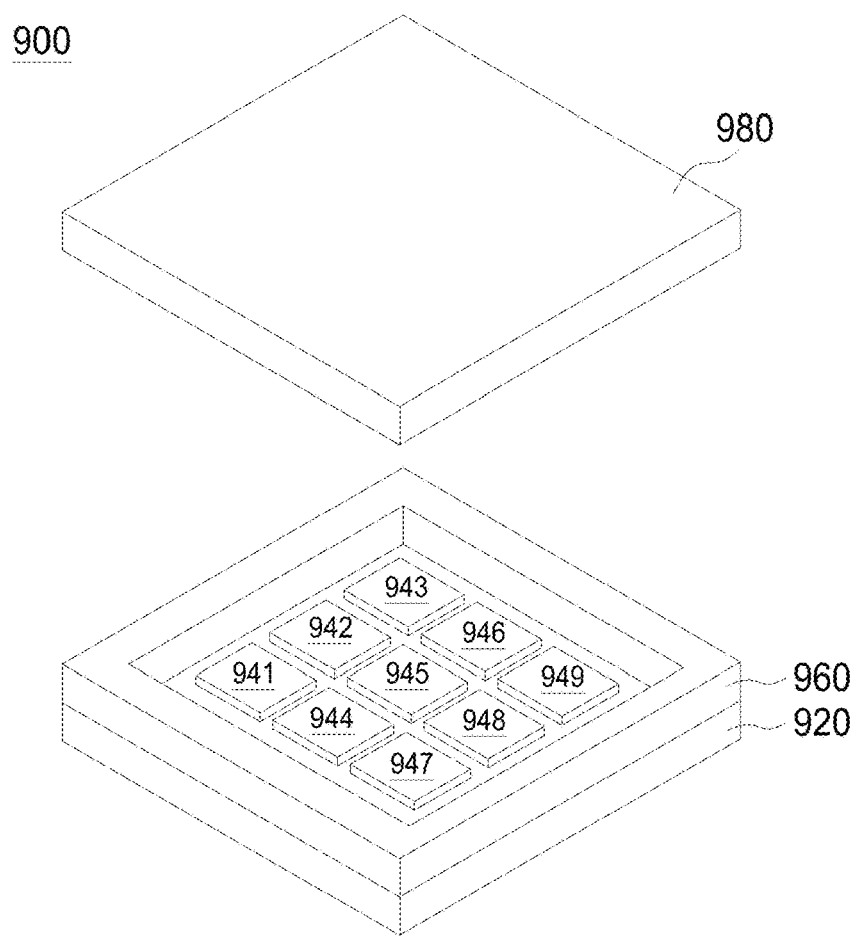
FIG. 9A shows a display device in accordance with one embodiment of present application.

FIG. 9A shows a display device 900 in accordance with one embodiment of present application. The display device 900 includes a carrier 920, a plurality of display modules 941~949 formed on the carrier 920, a frame 960 surrounds the plurality of display modules 941~949 and a panel 980 covers the plurality of display modules 941~949 and the frame 960. In one embodiment, a gap between any two neighbor display modules of the plurality of display modules 941~949 can be very small, and even the neighboring display modules are closely adjoining to one another.

Figure 9B:
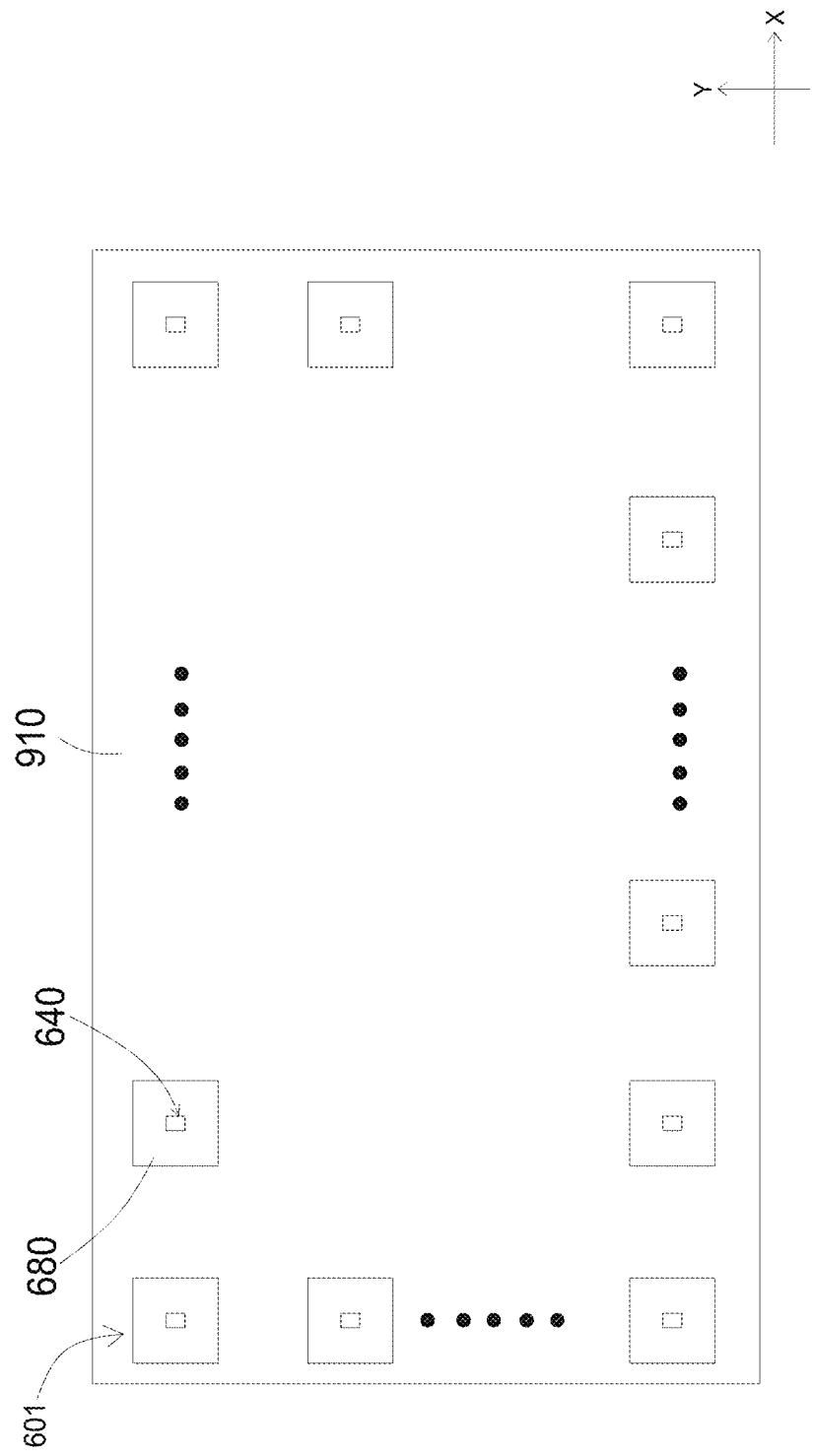
FIG. 9B shows a light-emitting module in accordance with one embodiment of present application.

FIG. 9B shows a light-emitting module 900B in accordance with one embodiment of present application. The light-emitting module 900B includes a carrier 910 and a plurality of the light-emitting devices 601 formed on the carrier 910. The light-emitting device 601 includes the light-emitting element 640 and the light-passing unit 680. The plurality of the light-emitting devices 601 can be arranged as a matrix on the carrier 910, and a surface of the carrier 910 has a circuit layer (not shown) for electrically connecting the plurality of the light-emitting devices 601. In one embodiment, the plurality of the light-emitting devices 601 is a white light source and the detailed structure thereof can be the light-emitting devices shown in FIGS. 6A~6C. In one embodiment, the light-emitting module 900B is a backlight module of a display.

Figure 10D:
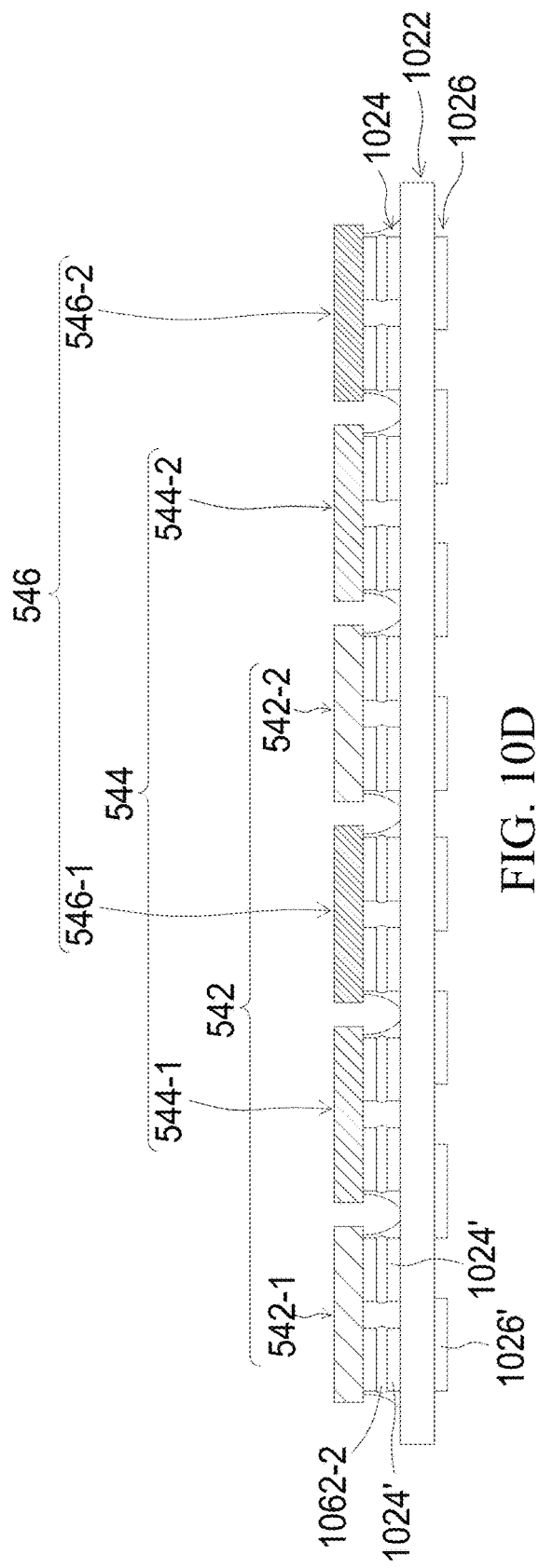

FIGS. 10A~10K show a process of manufacturing a display module 800 shown in FIG. 8 in accordance with one embodiment of present application. In one embodiment, the detailed structure of the light-emitting device in the display module 800 can be referred to the light-emitting device shown in FIG. 1A. Referring to FIG. 10A, a carrier is provided. The carrier includes an insulating layer 1022, an upper conductive layer 1024, and a lower conductive layer 1026. The upper conductive layer 1024 and the lower conductive layer 1026 respectively have a plurality of connecting terminals 1024', 1026'. It is noteworthy that the width of each of the connecting terminals 1026' of the lower conductive layer 1026 can be larger than the width of each of the electrodes of the light-emitting units 542-1, 544-1, 546-1, 542-2, 544-2, 546-2 to facilitate the subsequent steps of inspection. The detailed descriptions of the insulating layer 1022, the upper conductive layer 1024, and the lower conductive layer 1026 can be referred to FIG. 5A and the related paragraphs.

Referring to FIG. 10B, the glue 1014 with electrically conductive particles (not shown) forms an unsolidified block 1062' on the upper conductive layer 1024 after passing through the hole 1012b of a patterned jig 1012. The descriptions of the glue 1014, the patterned jig 1012, and the unsolidified blocks 1062' can be referred to FIG. 5B and the related paragraphs. Referring to FIG. 10C, the light-emitting units 542-1, 546-2 are connected with the unsolidified blocks 1062' and formed on the upper conductive layer 1024. The functions and the method of forming the light-emitting units 542-1, 546-2 on the upper conductive layer 1024 can be referred to FIG. 5C and the related paragraphs. Referring to FIG. 10D, the light-emitting units of the first group 542, the second group 544, and the third group 546 are formed on the same carrier, and then the corresponding unsolidified blocks 1062' are solidified to form connecting structures 1062 and electrical connecting portions 1062-2 which are used to electrically connecting the connecting portions 1024' of the upper conductive layer 1024 and the corresponding light-emitting units 542-1, 544-1, 546-1, 542-2, 544-2, 546-2. In one embodiment, there are at least three groups of the light-emitting units. The corresponding description of the group of the light-emitting units can be referred to FIG. 5B and the related paragraphs.

Figure 10E:
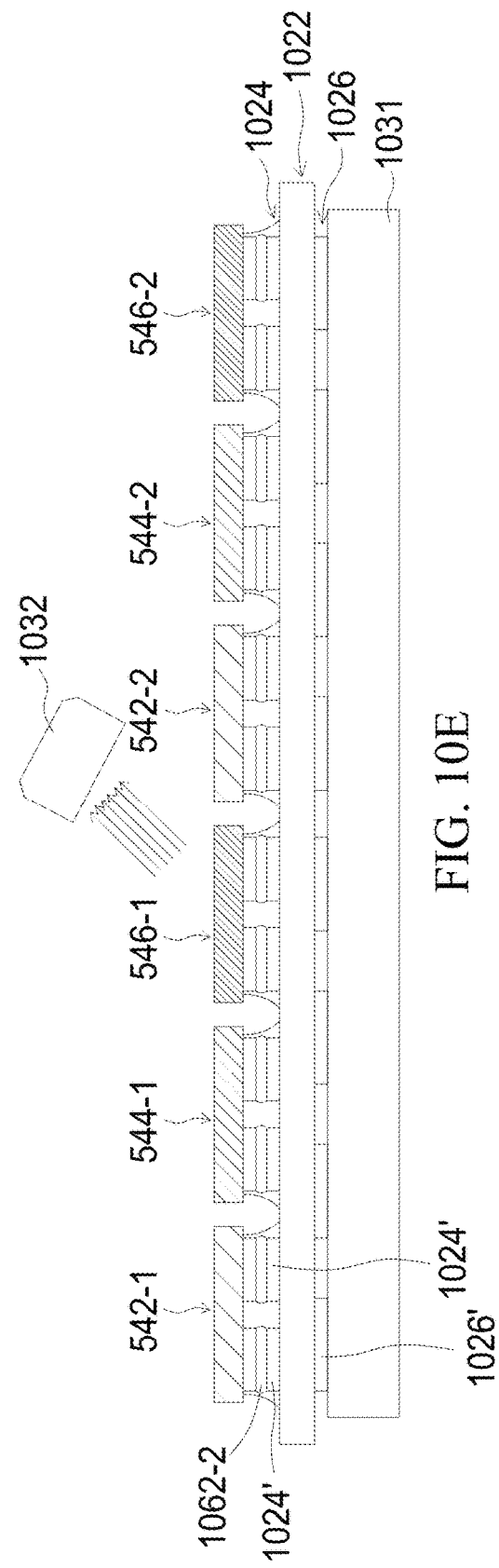

Referring to FIG. 10E, after electrically connecting the light-emitting units 542-1, 544-1, 546-1, 542-2, 544-2, 546-2 to the upper conductive layer 1024, the step of inspection can be performed. In one embodiment, the step of inspection is conducted by an inspecting device to inspect the light-emitting units 542-1, 544-1, 546-1, 542-2, 544-2, 546-2. The inspecting device includes an inspecting board 1031 and a sensing unit 1032 to check whether each of the light-emitting units 542-1, 544-1, 546-1, 542-2, 544-2, 546-2 meets the criteria so the unqualified units can be screened out. The inspecting board 1031 is able to electrically connect to the lower conductive layer 1026. In one embodiment, the width or area of each connection terminal 1026' of the lower conductive layer 1026 is larger than the width or area of each of the corresponding electrodes of the light-emitting units 542-1, 544-1, 546-1, 542-2, 544-2, 546-2. Thus, even the size of each of the light-emitting units 542-1, 544-1, 546-1, 542-2, 544-2, 546-2 is small, it is easier to conduct the inspection by the inspecting device. The criteria of the inspection include wavelength, intensity, or chromatic coordinate value. The unqualified units are screened out in the step of inspection so the yield of manufacturing the display module 800 can be improved and the number of times of repairing the display module 800 can be decreased.

Figure 10F:
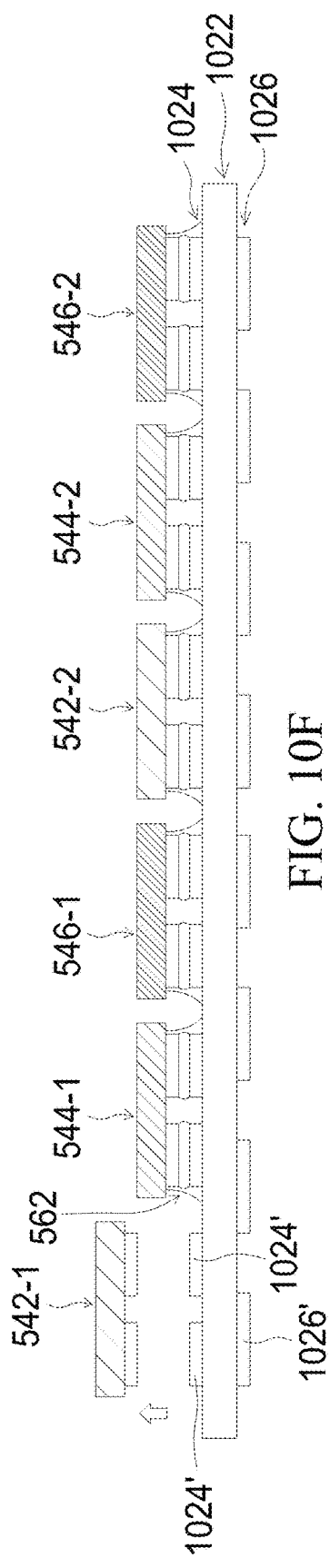
Figure 10G:
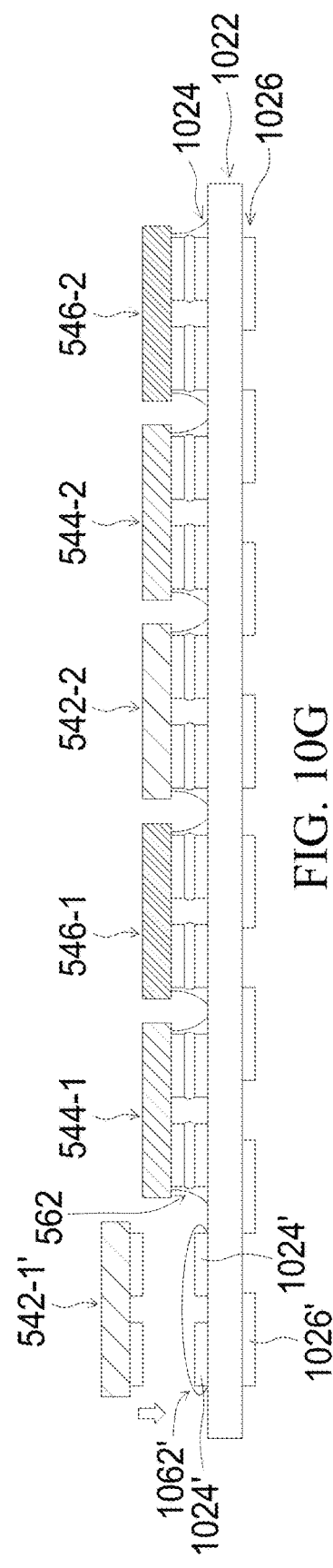

Referring to FIG. 10F, as the light-emitting unit 542-1 is identified as an unqualified unit in the inspection step, the light-emitting unit 541-1 can be removed. In one embodiment, the adhesion between the light-emitting unit 541-1 and the carrier can be decreased by heating and then the light-emitting unit 541-1 can be removed. Referring to FIG. 10G, another light-emitting unit 541-1' is formed on the position of the light-emitting unit 541-1 by being connected with another unsolidified block 1062'.

Figure 10H:
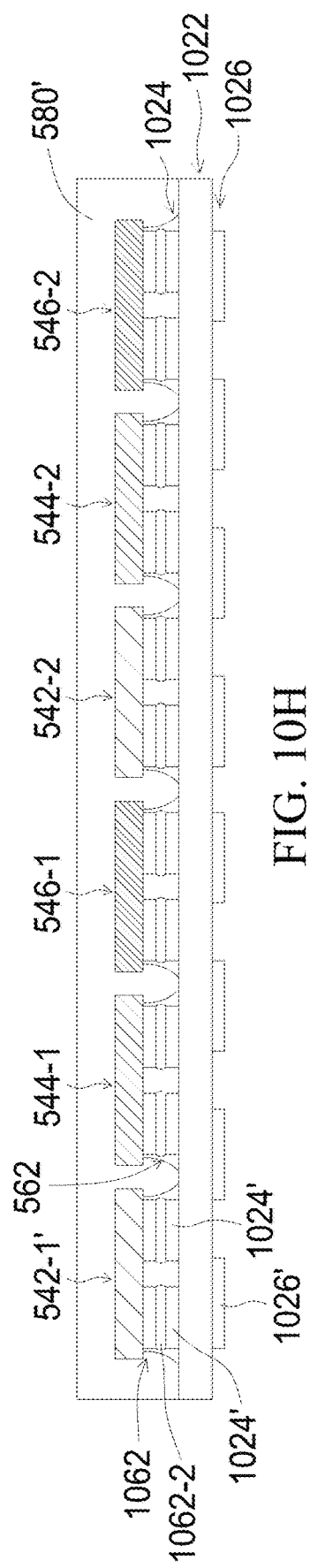
Figure 10I:
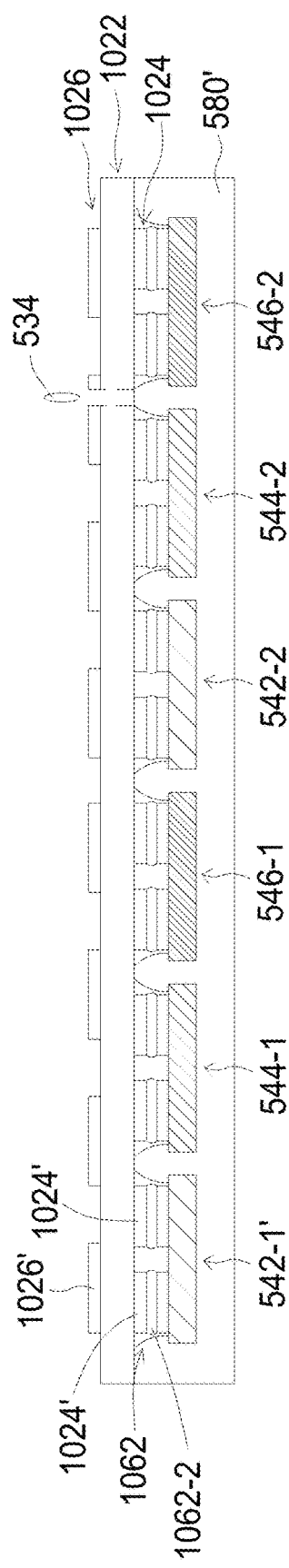
Figure 10J:
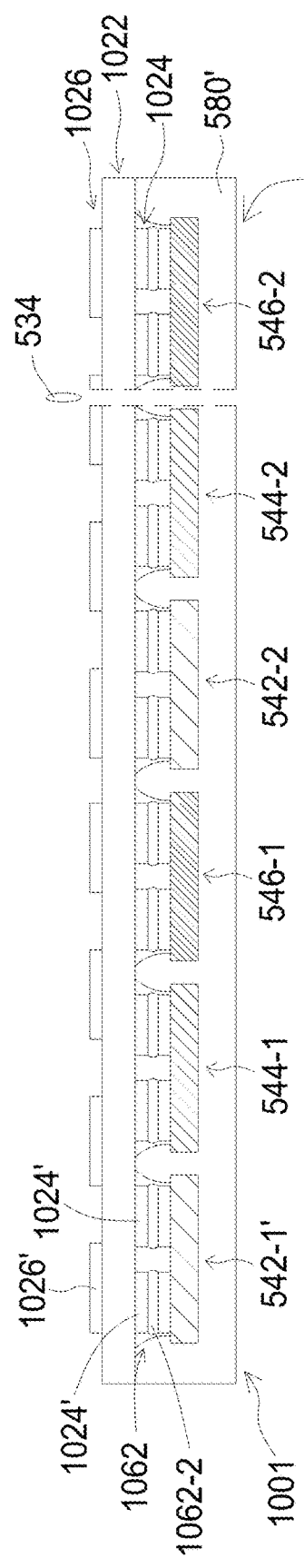

Referring to FIG. 10H, the first light-emitting units 542-1', 542-2, the second light-emitting units 544-1, 544-2 and the third light-emitting units 546-1, 546-2 are covered by the light-passing unit 580'. The functions and the forming method of the light-passing unit 580' can be referred to FIG. 5H and the related paragraphs. Referring to FIG. 10I, a first separation step for forming the light-emitting device includes cutting the insulating layer 1022 of the carrier for forming a cutting line by using a cutting tool 534. Referring to FIG. 10J, a second separation step for forming the light-emitting device includes cutting the light-passing unit 580' for forming the light-emitting devices 1001, 1002 by using a cutting tool 534. The function and the forming method of separating the light-emitting devices can be referred to FIGS. 5I and 5J and the related paragraphs.

Figure 10K:
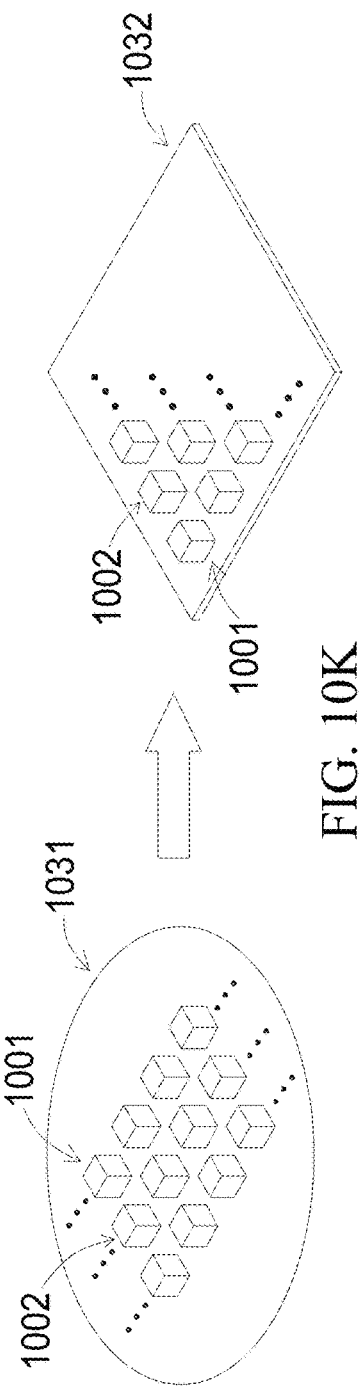

Referring to FIG. 10K, in a transferring step, the separated light-emitting devices 1001, 1002 are transferred from a temporary substrate 1031 to a target substrate 1032 for forming the display module 800. The way for transferring the light-emitting devices 1001, 1002 to the target substrate 1032 can be done one by one or once all together.

Figure 11A:
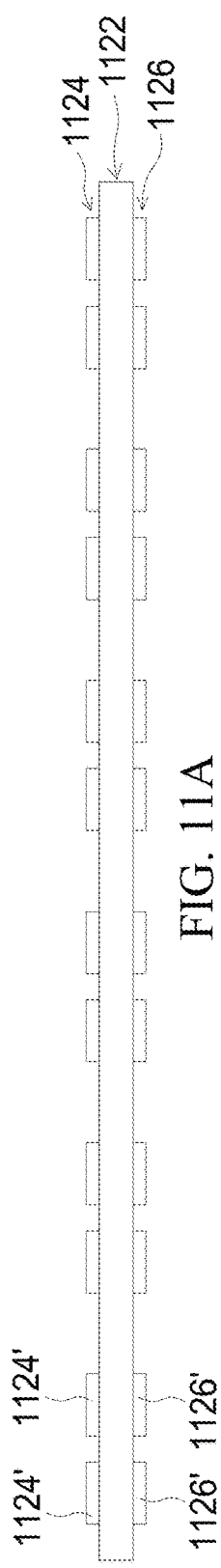
FIGS. 11A~11I show a manufacturing process of a display module in accordance with one embodiment of present application.

FIGS. 11A~11I show a manufacturing process of the display module 800 shown in FIG. 8 in accordance with another embodiment of present application. In the embodiment, the detailed structure of the light-emitting device in the display module 800 can be referred to FIG. 6A and the related paragraphs. Referring to FIG. 11A, a carrier is provided. The carrier includes an insulating layer 1122, an upper conductive layer 1124 and a lower conductive layer 1126. The upper conductive layer 1124 and the lower conductive layer 1126 respectively have a plurality of connecting terminals 1124', 1126'. The detailed structures of the insulating layer 1122, the upper conductive layer 1124, and the lower conductive layer 1126 can be referred to FIGS. 5A, 10A and the related paragraphs.

Figure 11B:
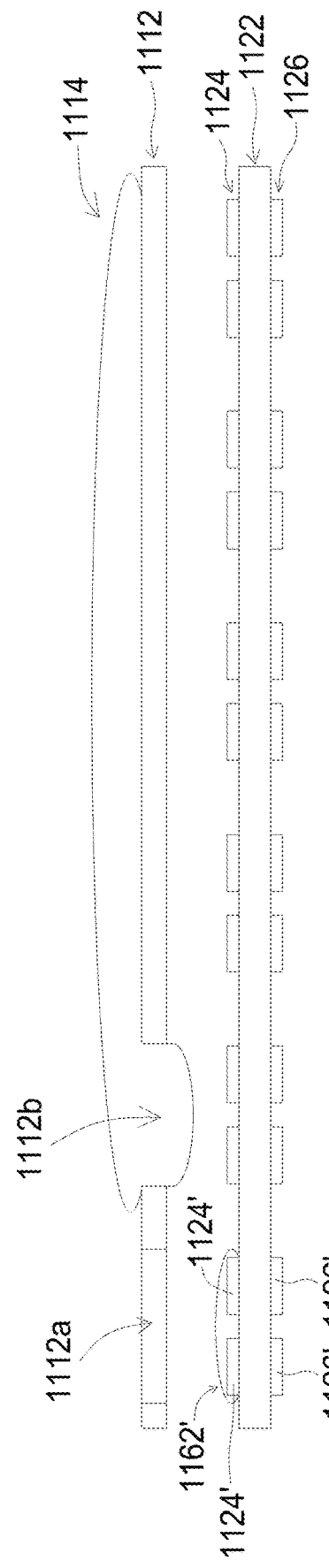
Figure 11C:
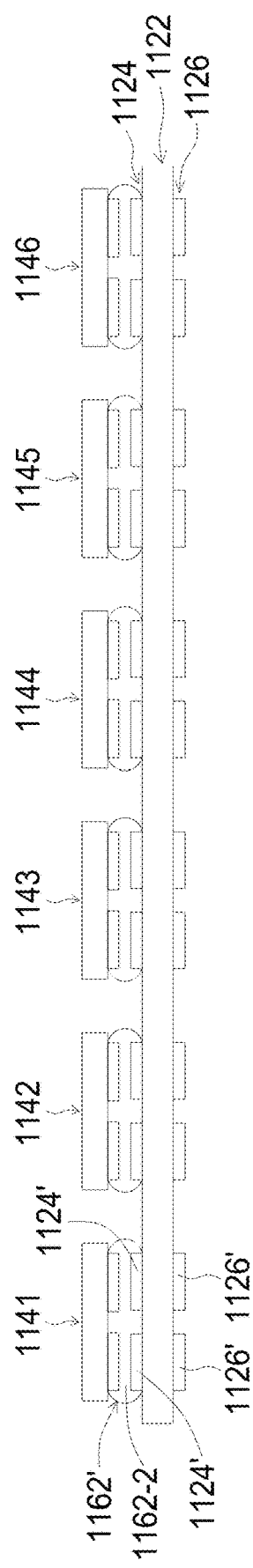
Figure 11D:
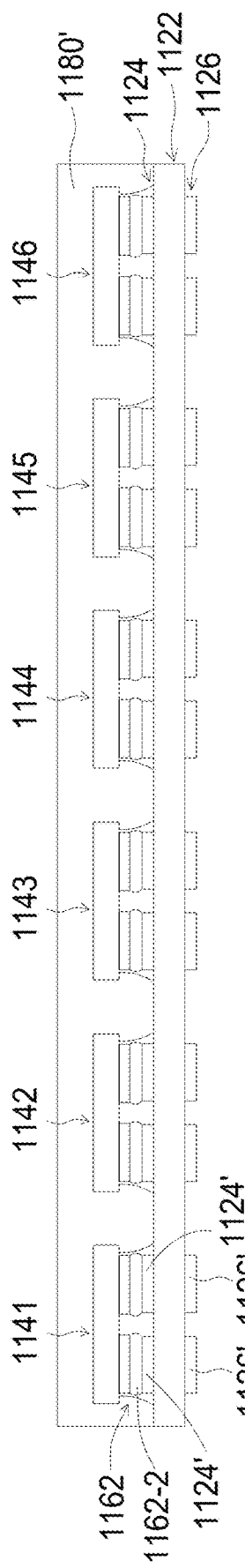

Referring to FIG. 11B, the glue 1114 with electrically conductive particles (not shown) forms an unsolidified block 1162' on the upper conductive layer 1124 after passing through the holes 1112a of a patterned jig 1012. The detailed descriptions of the glue 1114, the patterned jig 1112, and the unsolidified blocks 1162' can be referred to FIG. 5B and the related paragraphs. Referring to FIG. 11C, the light-emitting units 1141, 1142, 1143, 1144, 1145, 1146 are connected with the unsolidified blocks 1162' and formed on the upper conductive layer 1124. The functions of the light-emitting units 1141, 1142, 1143, 1144, 1145, 1146 and the forming method thereof on the upper conductive layer 1124 can be referred to FIG. 5C and the related paragraphs. Referring to FIG. 11D, the light-emitting units 1141, 1142, 1143, 1144, 1145, 1146 are formed on the same carrier, and then the unsolidified blocks 1162' are solidified to form connecting structures 1162 and electrical connecting portions 1162-2 which are used to electrically connecting the connecting terminals 1124' of the upper conductive layer 1124 and the light-emitting units 1141, 1142, 1143, 1144, 1145, 1146. A light-passing unit 1180' is then formed to cover the light-emitting units 1141, 1142, 1143, 1144, 1145, 1146. The functions and forming method of the light-passing unit 1180' can be referred to FIG. 5H and the related paragraphs. In one embodiment, before the light-passing unit 1180' is formed, the light-emitting units 1141, 1142, 1143, 1144, 1145, 1146 can be inspected first to check whether there is any unqualified unit or not.

Figure 11E:
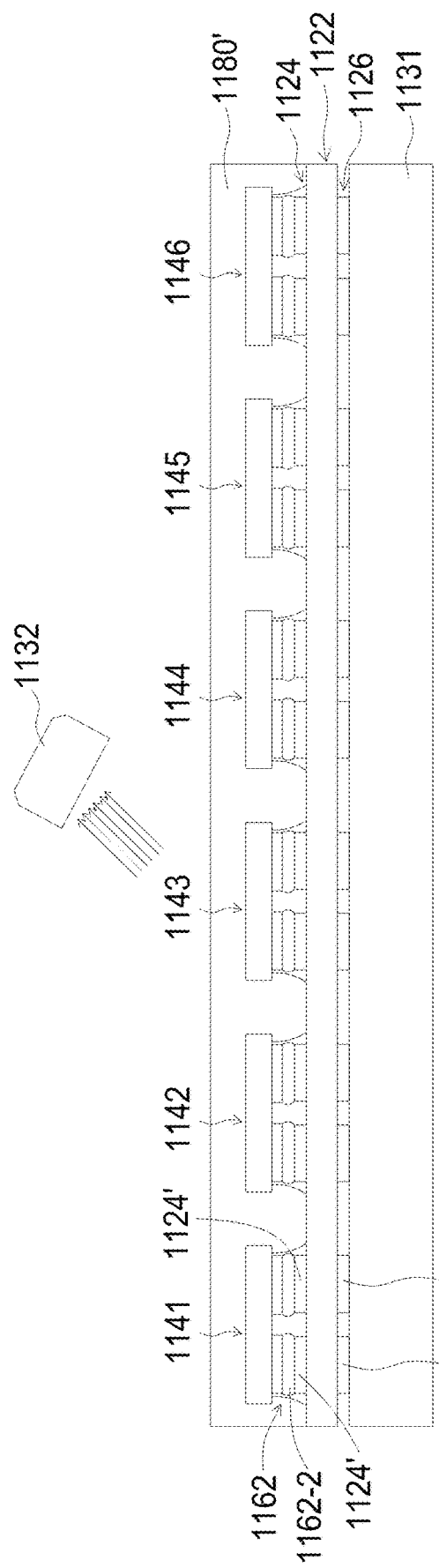

Referring to FIG. 11E, a step of inspecting the light-emitting units 1141, 1142, 1143, 1144, 1145, 1146 covered by the light-passing unit 1180' is performed. The detailed description of the inspection step can be referred to FIG. 10E and the related paragraphs. In one embodiment, the light-passing unit 1180' includes wavelength conversion material so the lights for inspection are the mixed lights of the lights from the light-emitting units 1141, 1142, 1143, 1144, 1145, 1146 and the lights excited by the wavelength conversion material.

Figure 11F:
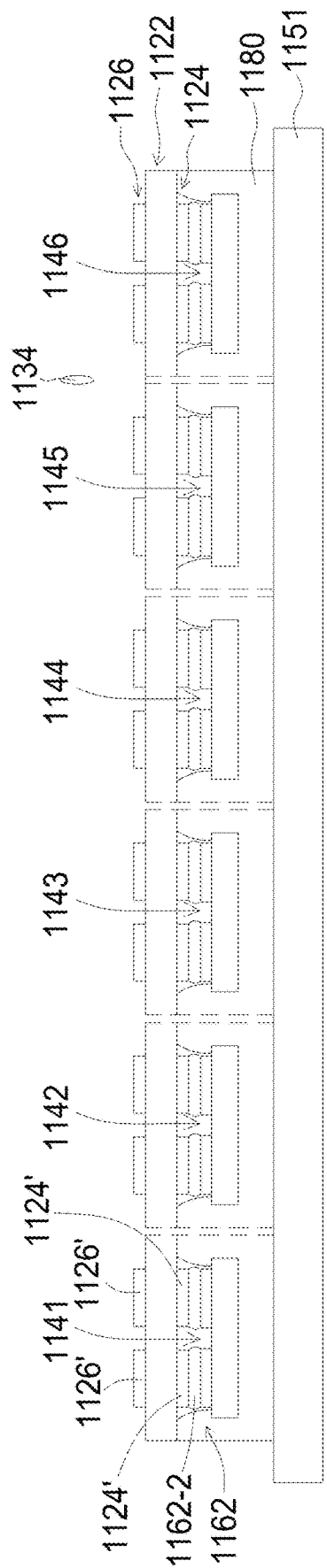
Figure 11G:
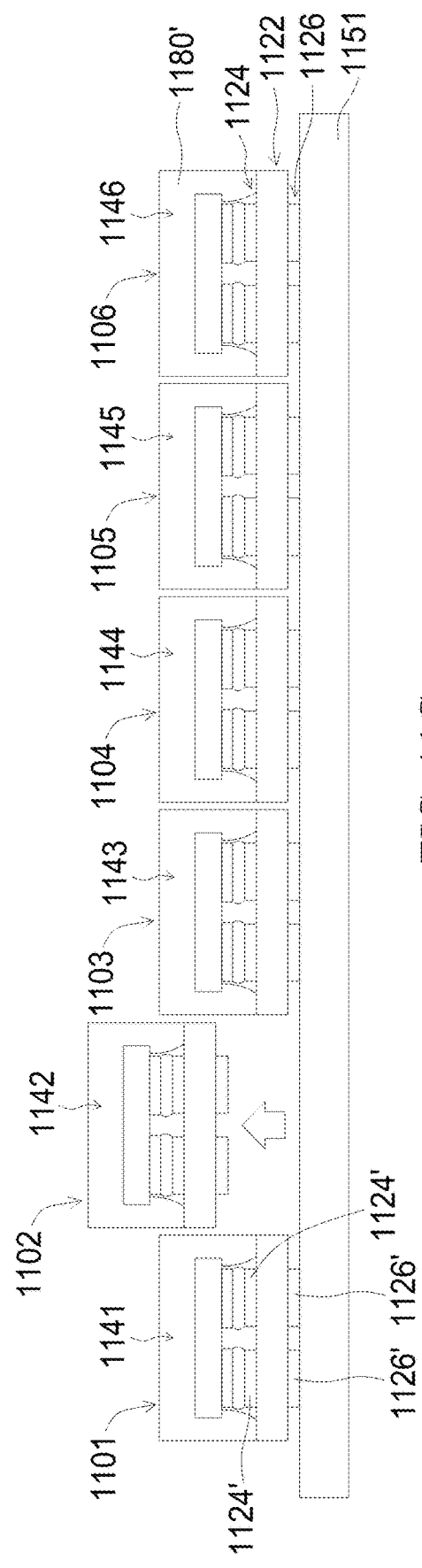
Figure 11H:
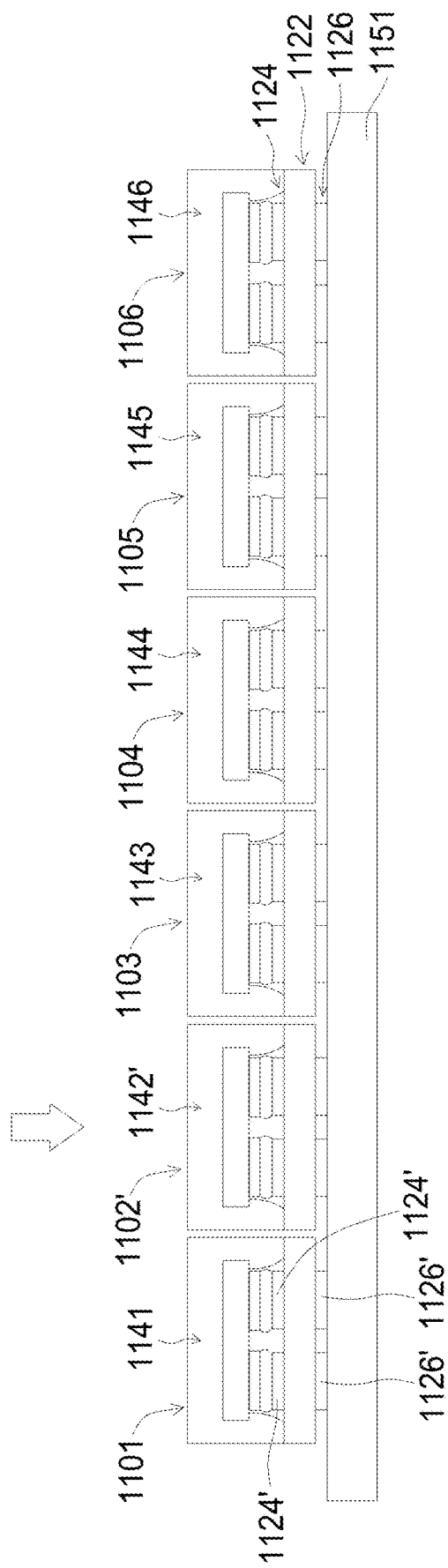

Referring to FIG. 11F, the step of separating the light-emitting devices includes cutting the insulating layer 1122 and the light-passing unit 1180' by a cutting tool 1134. The light-passing unit 1180' in FIG. 11D is cut to form separate light-passing units 1180. The detailed description of the step of separating the light-emitting devices can be referred to FIGS. SI, 5J, and the related paragraphs. In one embodiment, the separated light-emitting devices 1101, 1102, 1103, 1104, 1105, 1106 are formed after the separation step, and then the light-emitting device 1102 is determined as unqualified in the inspection step. Referring to FIG. 11G, the light-emitting devices 1101, 1102, 1103, 1104, 1105, 1106 are formed on a temporary substrate 1151, and then the light-emitting device 1102 can be removed from the temporary substrate 1151. FIG. 11H shows that a light-emitting device 1102' is formed and replaces the light-emitting device 1102. In another embodiment, after the light-emitting device 1102 is removed from the temporary substrate 1151, it is not necessary to place another light-emitting device and a vacancy is formed (not shown).

Figure 11I:
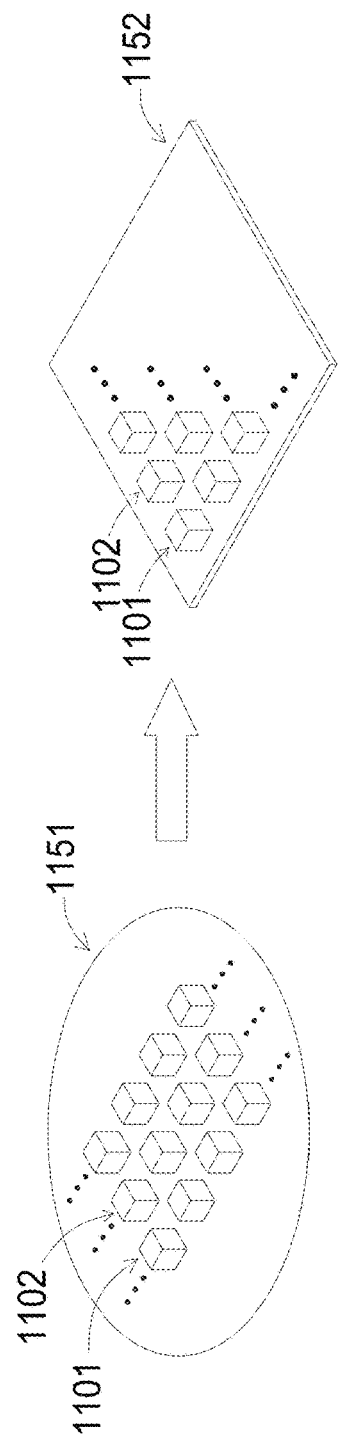

Referring to FIG. 11I, in a transfer step, the multiple light-emitting devices 1101, 1102 are transferred from a temporary substrate 1151 to a target substrate 1152 for forming a display module 800. The way to transfer the light-emitting devices 1101, 1102 to the target substrate 1152 can be done one by one or once all together.

Figure 12A:
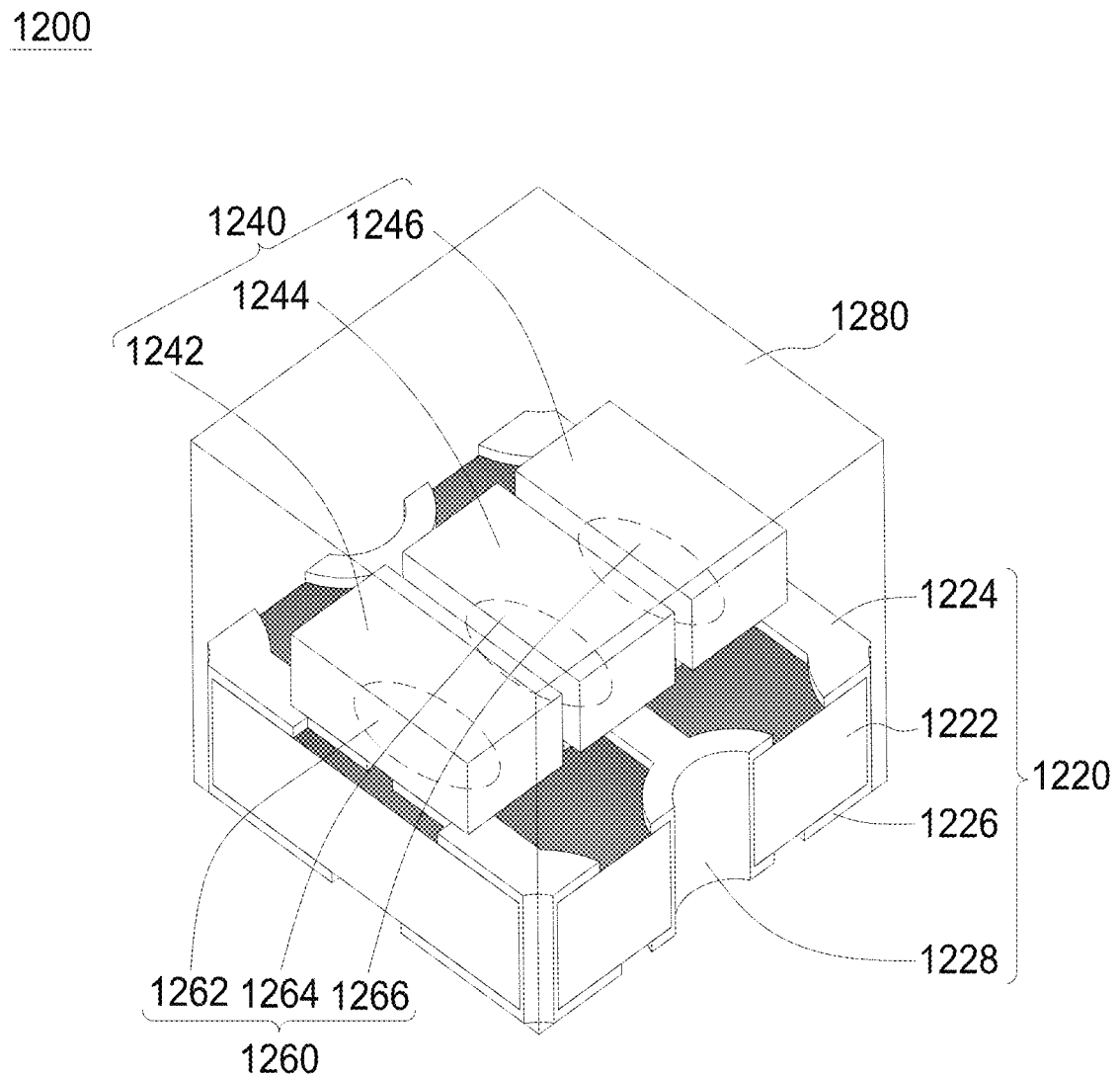
FIG. 12A shows a three-dimensional view of a light-emitting device in accordance with one embodiment of present application.
Figure 12B:
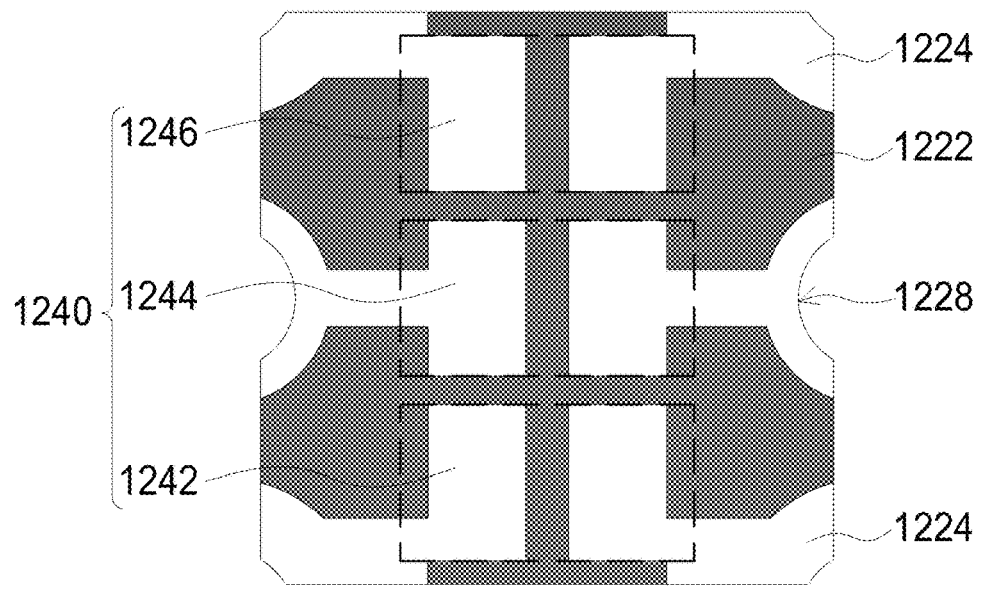
FIG. 12B shows a top view of the light-emitting device disclosed in FIG. 12A.
Figure 12C:
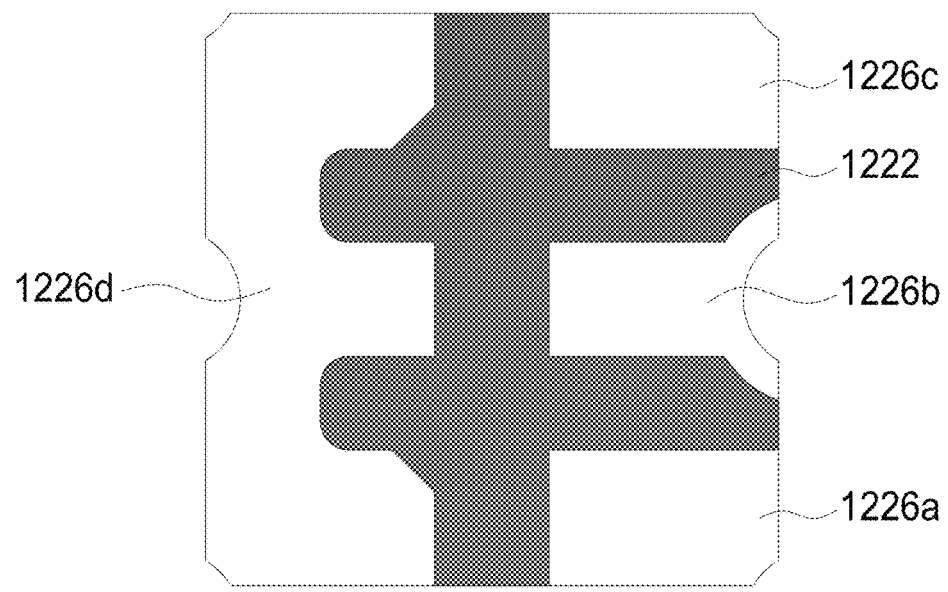
FIG. 12C shows a bottom view of the light-emitting device disclosed in FIG. 12A.

FIG. 12A shows a three-dimensional view of a light-emitting device 1200 in accordance with one embodiment of present application. FIG. 12B shows a top view of the light-emitting device 1200 disclosed in FIG. 12A, and FIG. 12C shows a bottom view of the light-emitting device 1200 disclosed in FIG. 12A. The light-emitting device 1200 includes a carrier 1220, a light-emitting element 1240, a connecting structure 1260, and a light-passing unit 1280. The structures, functions, and the manufacturing methods of the carrier 1220, the light-emitting element 1240, the connecting structure 1260, and the light-passing unit 1280 can be referred to the related paragraphs of the light-emitting device 100.

The difference between the light-emitting device 1200 and the light-emitting device 100 includes the structure of the carrier 1220 and the arrangement of the light-emitting units 1242, 1244, 1246. In this embodiment, the carrier 1220 includes an insulating layer 1222, an upper conductive layer 1224, a lower conductive layer 1226, and conducting vias 1228. The upper conductive layer 1224 includes six connecting portions (or three pairs of upper conductive pads) and six necking portions (or six conductive traces), and wherein two upper conductive pads of each pairs are adjacent to but separated from each other. Besides, each pair of the upper conductive pads is corresponding to each of the light-emitting units 1242, 1244, 1246. Referring to FIG. 12B, in one embodiment, the first light-emitting unit 1242, the second light-emitting unit 1244, and the third light-emitting unit 1246 are arranged sequentially and respectively corresponding to one pair of the upper conductive pads. The first light-emitting unit 1242, the second light-emitting unit 1244, and the third light-emitting unit 1246 are arranged as a character of "≡" (or "III"). In one embodiment, the upper conductive pads are arranged in a 3×2 matrix and corresponding to the arrangement of light-emitting units 1242, 1244, 1246. Besides, the three conductive traces are parallel to one another and extend from the inner side of the upper conductive layer 1224 toward a same side (a first side) of the light-emitting device 1200. Similarly, the other three conductive traces are parallel to each other and extends from the inner side of the upper conductive layer 1224 toward another side (a second side) of the light-emitting device 1200.

The detailed patterned structure of the lower conductive layer 1226 can be referred to FIG. 12C. In this embodiment, the lower conductive layer 1226 includes a first lower conductive pad 1226a, a second lower conductive pad 1226b, a third lower conductive pad 1226c, and a fourth lower conductive pad 1226d. The material and functions of the lower conductive layer 1226 can be referred to FIG. 1C and the related paragraphs. Referring to FIG. 12C, each of the first lower conductive pad 1226a, the second lower conductive pad 1226b, and the third lower conductive pad 1226c has a long side and a short side. The fourth lower conductive pad 1226d is a common electrode, and the fourth lower conductive pad 1226d has two concave portions and three convex portions, and wherein the three convex portions are respectively corresponding to the first lower conductive pad 1226a, the second lower conductive pad 1226b, and the third lower conductive pad 1226c. Thus, when the light-emitting device 1200 is electrically connected to a circuit board, the distribution of the electrically connecting material, such as solder, between the lower conductive layer 1226 and the circuit board can be more uniform so that the "Tombstone" phenomenon is prevented. In one embodiment, six conducting vias 1228 are respectively connecting to the six conductive traces and located at four corners and center positions of two sides of the carrier 1220, and wherein each of the two sides is the side which each of the aforementioned three conductive traces are extended toward. In one embodiment, the side length of the light-emitting device 1200 is smaller than 500 μm, and the distance between two corresponding upper conductive pads in each pair of upper conductive pads is smaller than 100 μm, and the length of each of the short sides of lower conductive pads 1226a, 1226b, 1226c is smaller than 150 μm.

Figure 13A:
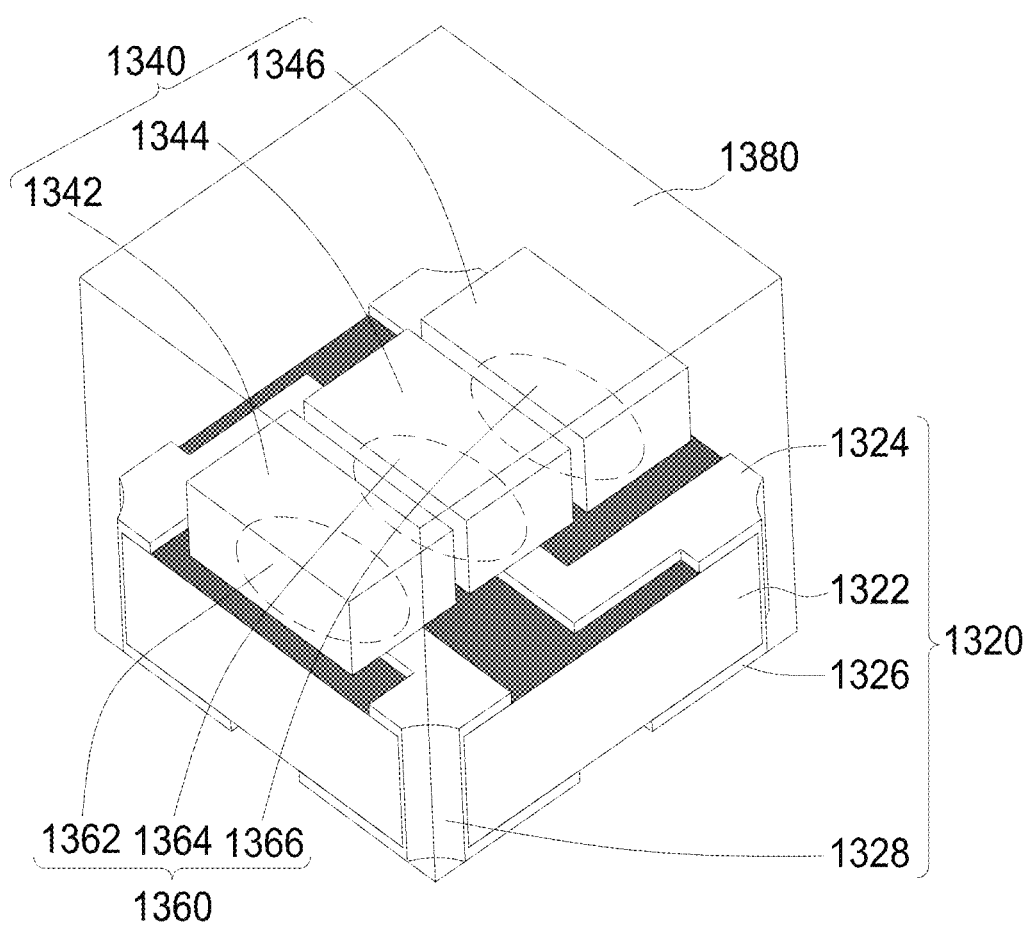
FIG. 13A shows a three-dimensional view of a light-emitting device in accordance with one embodiment of present application.
Figure 13B:
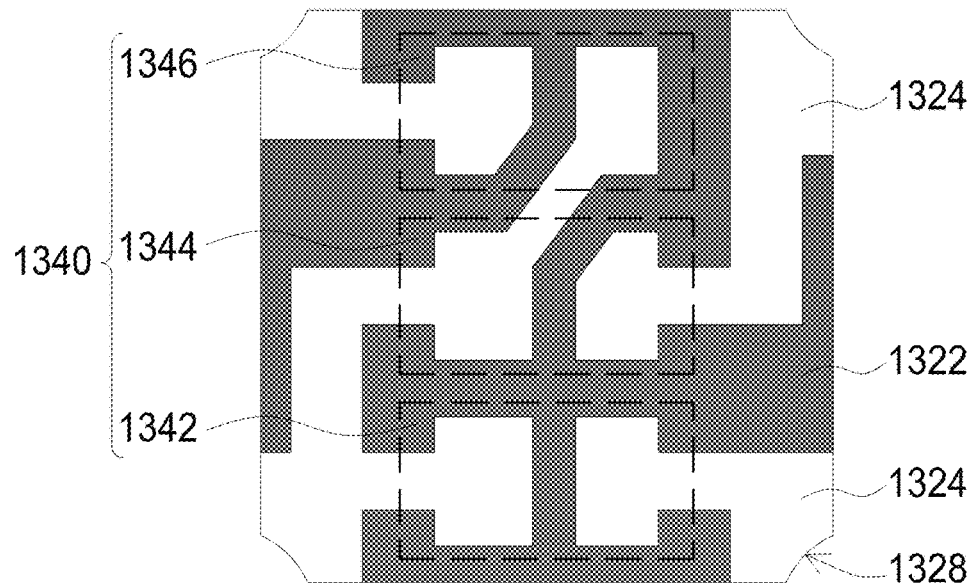
Figure 13C:
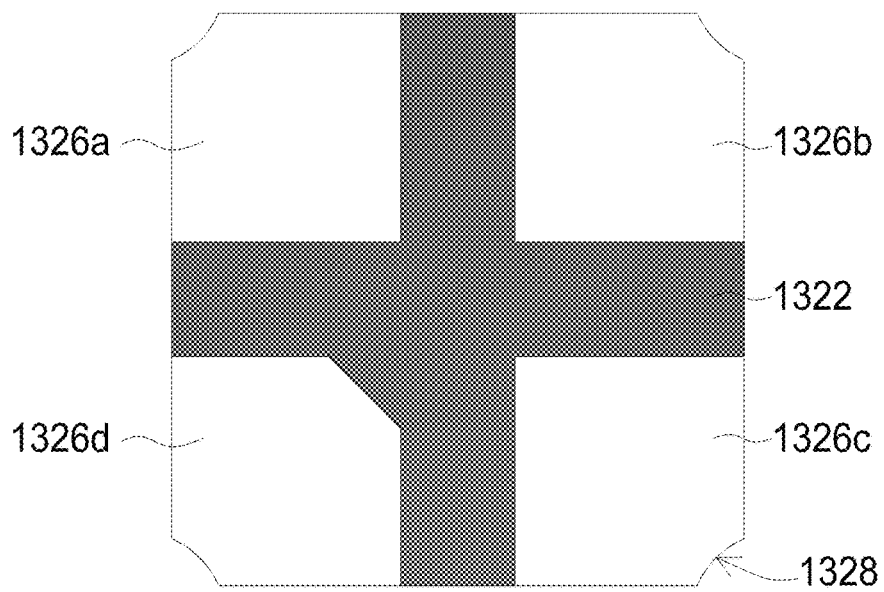
FIG. 13C shows a bottom view of the light-emitting device disclosed in FIG. 13A.

FIG. 13A shows a three-dimensional view of a light-emitting device 1300 in accordance with one embodiment of present application. FIG. 13B shows a top view of the light-emitting device 1300 disclosed in FIG. 13A. FIG. 13C shows a bottom view of the light-emitting device 1300 disclosed in FIG. 13A. The light-emitting device 1300 includes a carrier 1320, a light-emitting element 1340, a connecting structure 1360, and a light-passing unit 1380. The structures, functions, and the manufacturing methods of the carrier 1320, the light-emitting element 1340, the connecting structure 1360, and the light-passing unit 1380 can be referred to the related paragraphs of the light-emitting device 100.

The difference between the light-emitting device 1300 and the light-emitting device 100 includes the structure of the carrier 1320 and the arrangement of the light-emitting units 1342, 1344, 1346 of the light-emitting element 1340. In one embodiment, the carrier 1320 includes an insulating layer 1322, an upper conductive layer 1324, a lower conductive layer 1326, and conducting vias 1328. The detailed patterned structure of the upper conductive layer 1324 can be referred to FIG. 13B. The upper conductive layer 1324 includes six connecting portions (or three pairs of upper conductive pads) and six necking portions (or six conductive traces). The arrangement of the upper conductive pads and the light-emitting element 1340 can be referred to FIG. 12B and the related paragraphs. The difference between the upper conductive layer 1324 and the upper conductive layer 1224 disclosed in FIG. 12B is that the upper conductive layer 1324 includes at least two conductive traces which are connected to two upper conductive pads, respectively.

The detailed patterned structure of the lower conductive layer 1326 can be referred to FIG. 13C. In one embodiment, the lower conductive layer 1326 includes a first lower conductive pad 1326a, a second lower conductive pad 1326b, a third lower conductive pad 1326c, and a fourth lower conductive pad 1326d. The materials and functions of the lower conductive pads 1326a, 1326b, 1326c, 1326d can be referred to FIG. 1C and the related paragraphs. In one embodiment, the four conducting vias 1328 are respectively located at four corners of the carrier 1320. In one embodiment, at least one side length of the light-emitting device 1300 is smaller than 500 µm, a distance between any two neighboring lower conductive pads 1326a, 1326b, 1326c, 1326d is smaller than 200 and a side length of each of the lower conductive pads 1326a, 1326b, 1326c, 1326d is smaller than 200 µm.

Figure 14A:
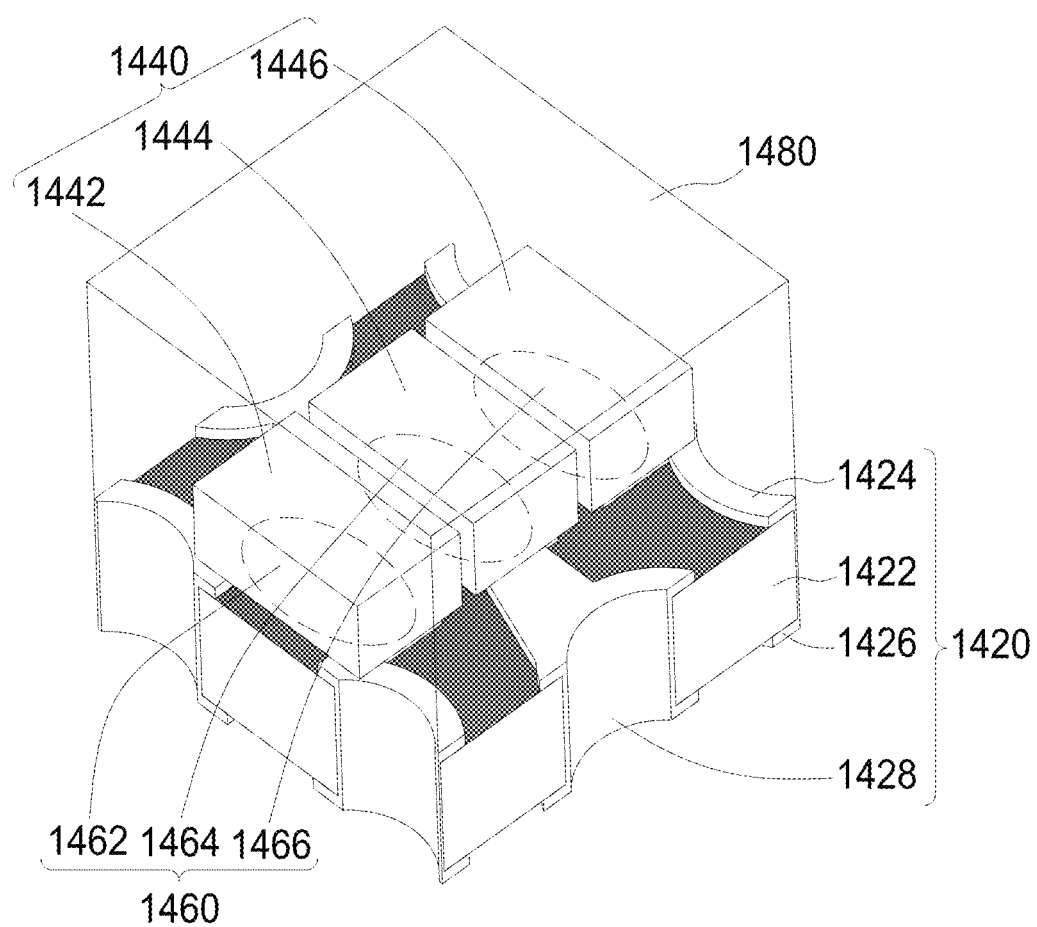
FIG. 14A shows a three-dimensional view of a light-emitting device in accordance with one embodiment of present application.
Figure 14B:
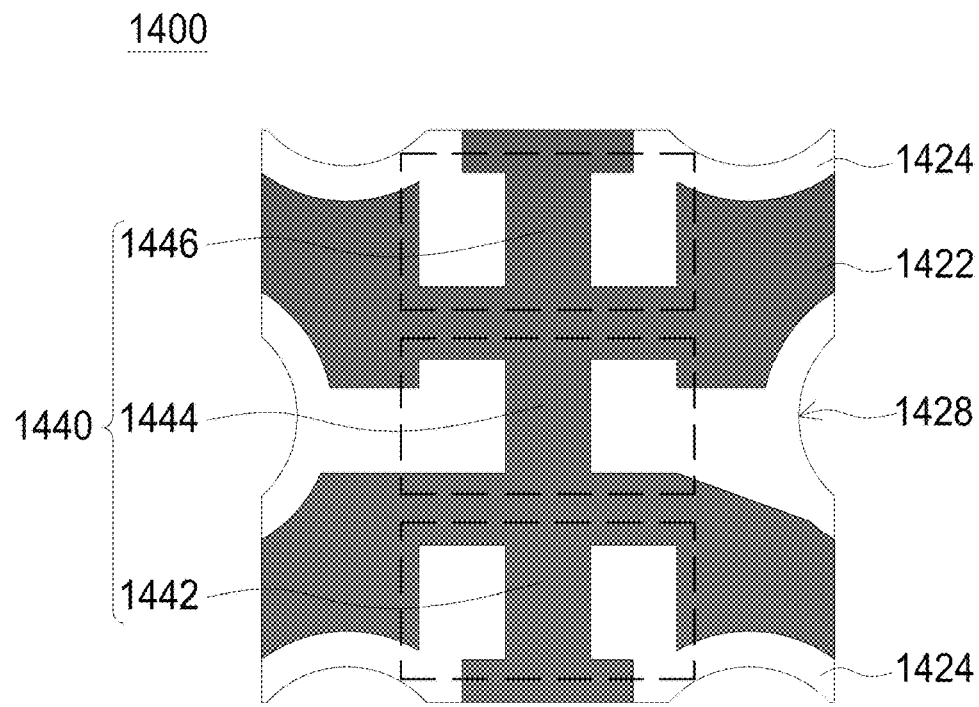
FIG. 14B shows a top view of the light-emitting device disclosed in FIG. 14A.
Figure 14C:
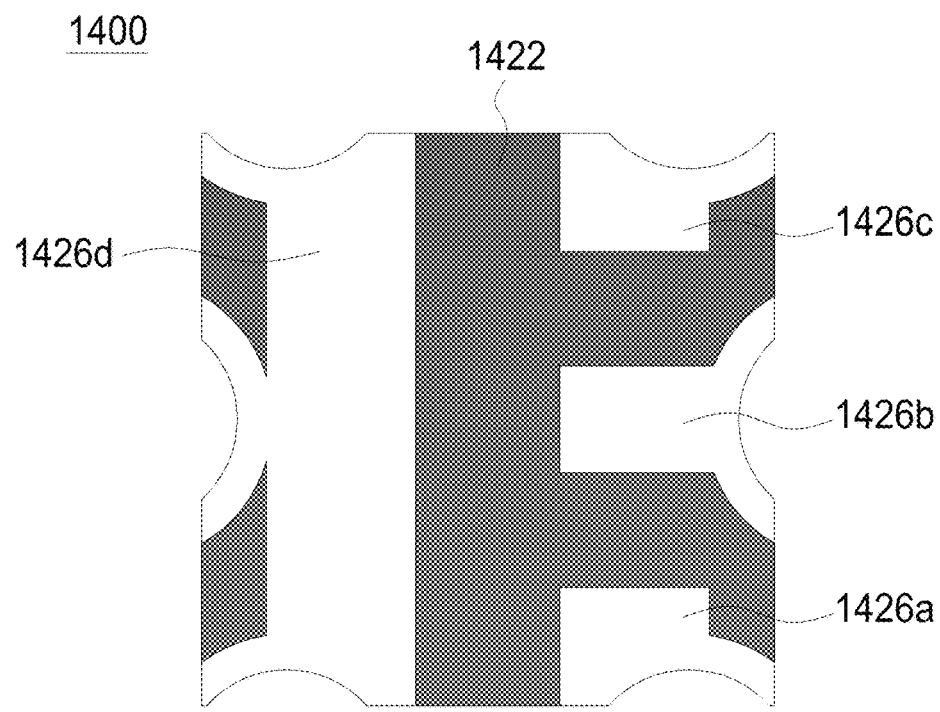
FIG. 14C shows a bottom view of the light-emitting device disclosed in FIG. 14A.

FIG. 14A shows a three-dimensional view of a light-emitting device 1400 in accordance with one embodiment of present application. FIG. 14B shows a top view of the light-emitting device 1400 disclosed in FIG. 14A, and FIG. 14C shows a bottom view of the light-emitting device 1400 disclosed in FIG. 14A. The light-emitting device 1400 includes a carrier 1420, a light-emitting element 1440, a connecting structure 1460, and a light-passing unit 1480. The structures, functions, and the manufacturing methods of the carrier 1420, the light-emitting element 1440, the connecting structure 1460, and the light-passing unit 1480 can be referred to the related paragraphs of the light-emitting device 100.

The difference between the light-emitting device 1400 and the light-emitting device 100 includes the structure of the carrier 1420 and the arrangement of the light-emitting units 1442, 1444, 1446 of the light-emitting element 1440. In one embodiment, the carrier 1420 includes an insulating layer 1422, an upper conductive layer 1424, a lower conductive layer 1426 and conducting vias 1428. The detailed patterned structure of the upper conductive layer 1424 can be referred to FIG. 14B. The upper conductive layer 1424 includes six connecting portions (or three pairs of upper conductive pads) and six necking portions (or six conductive traces). The arrangement of the upper conductive pads and the light-emitting element 1440 can be referred to FIG. 12B and the related paragraphs. The difference between the upper conductive layer 1424 and the upper conductive layer 1224 disclosed in FIG. 12B is that the upper conductive layer 1424 includes at least four conducting vias 1428 at the sides of the carrier 1420, not at the corners thereof. In other words, the six conducting vias 1428 are all located at the sides of the carrier 1420.

The detailed patterned structure of the lower conductive layer 1426 can be referred to FIG. 14C. In one embodiment, the lower conductive layer 1426 includes a first lower conductive pad 1426a, a second lower conductive pad 1426b, a third lower conductive pad 1426c, and a fourth lower conductive pad 1426d. The materials and functions of the lower conductive pads 1426a, 1426b, 1426c, 1426d can be referred to FIG. 12C and the related paragraphs. The difference between the lower conductive layer 1426 and the lower conductive layer 1226 is that the fourth lower conductive pad 1426d includes a bevel side. In one embodiment, at least one side length of the light-emitting device 1400 is smaller than 400 µm, a distance between two corresponding upper conductive pads of each pair of upper conductive pads is smaller than 80 µm, and a side length of each short side of the lower conductive pads 1426a, 1426b, 1426c is smaller than 100 µm.

Figure 15A:
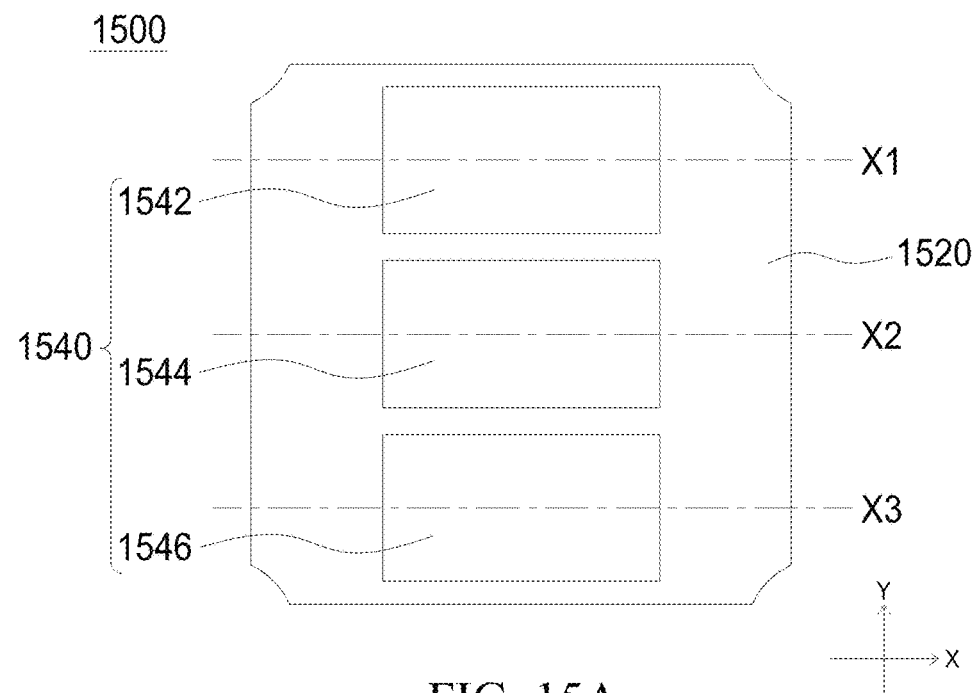
FIG. 15A shows a light-emitting device in accordance with one embodiment of present application.

FIG. 15A shows a light-emitting device 1500 which is a schematic top-view diagram of the light-emitting device 1200, 1300, or 1400. In FIG. 15A, only the carrier 1520 and the light-emitting element 1540 are illustrated. The carrier 1520 represents the carrier 1220, 1320, or 1420 which is disclosed in the previous embodiment, and the details such as the contour, the upper conductive layer, and the insulating layer thereof are not precisely depicted. The specific structures, functions, materials, and forming method of the light-emitting units 1542, 1544, 1546 which are included in the light-emitting element 1540 can be referred to the related paragraphs of the light-emitting device 1200, 1300, or 1400.

Figure 15B:
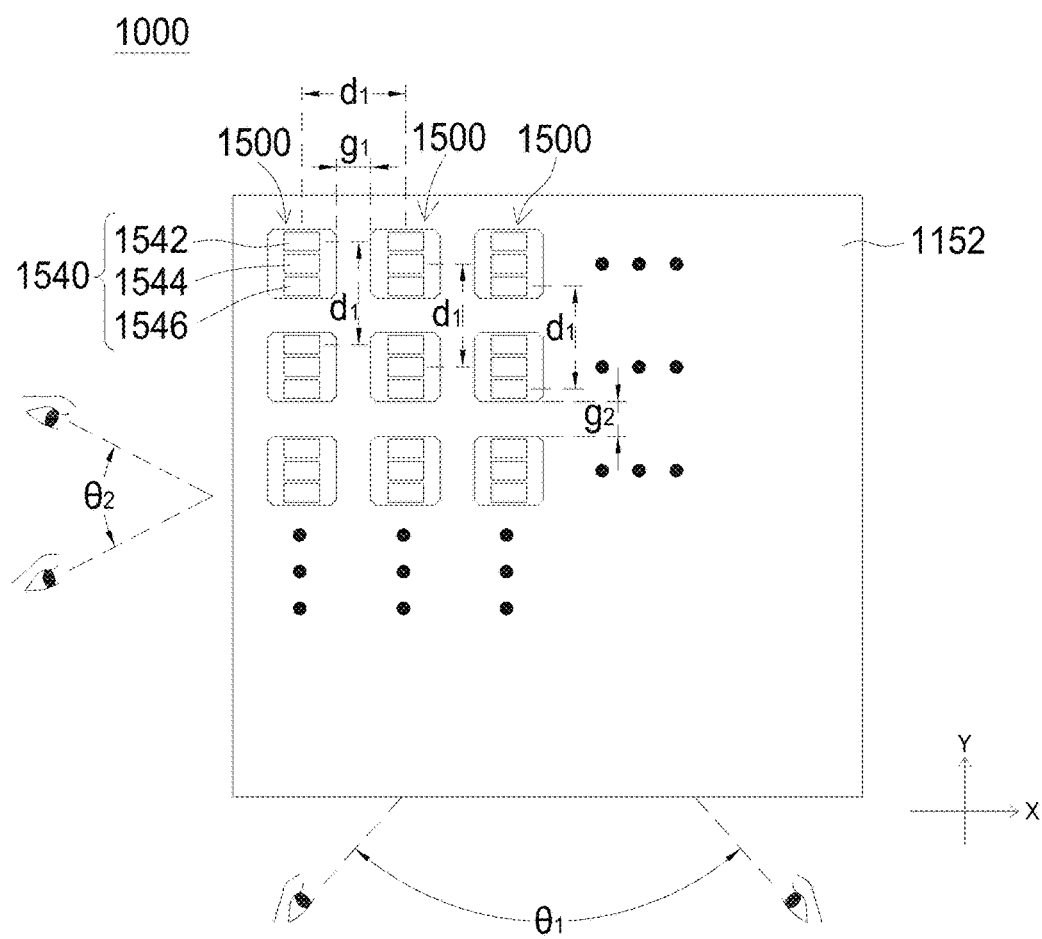
FIG. 15B shows a display module in accordance with one embodiment of present application.

FIG. 15B shows a display module 1000 which includes a target substrate 1152 and a plurality of light-emitting devices 1500 arranged in a matrix on the target substrate 1152. Each light-emitting device 1500 includes a light-emitting element 1540. Each light-emitting element 1540 includes light-emitting units 1542, 1544, and 1546. Each light-emitting unit 1542, 1544, or 1546 emits red light, green light, or blue light, respectively. Because the light-emitting element 1540 can emit red light, green light, and blue light individually, the light-emitting element 1540 is able to be a display pixel in the display module 1000. The way to transfer the light-emitting devices 1500 to the target substrate 1152 can be done one by one or once all together. In the x-axis direction (horizontal direction), the distance between two corresponding light-emitting units 1542, 1544, or 1546 in two adjacent light-emitting device 1500 is d1; in the y-axis direction (vertical direction), the distance between two corresponding light-emitting units 1542, 1544, or 1546 in two adjacent light-emitting device 1500 is also d1. The distance d1 is decided by the size of the target substrate 1152 and the resolution of the display module 1000. In the x-axis direction, two adjacent light-emitting devices 1500 have a gap g1; in the y-axis direction, two adjacent light-emitting devices 1500 have a gap g2. In one embodiment, both of the gaps g1 and g2 are between 5 µm and 1000 µm. The larger gap is easier for the subsequent procedure in case there is a need to change the damaged light-emitting device 1500. In the general using condition, the observer changes the observing position in the x-axis direction (horizontal direction) of the display module 1000 more often and changes the observing position in the y-axis direction (vertical direction) of the display module 1000 less often. Therefore, the capable observing angle θ1 in the x-axis direction (horizontal direction) of the display module 1000 should be large enough to make the light-emitting angles of the light-emitting elements 1540 in the x-axis direction (horizontal direction) large and the light intensity distribution thereof even. In order to minimize the color difference in the range of the capable observing angle θ1 in the x-axis direction (horizontal direction) of the display module 1000, as shown in FIG. 15B, the light-emitting strength distribution variation of the light-emitting units 1542, 1544, and 1546 along the x axis direction should be reduced or the same.

Figure 15C:
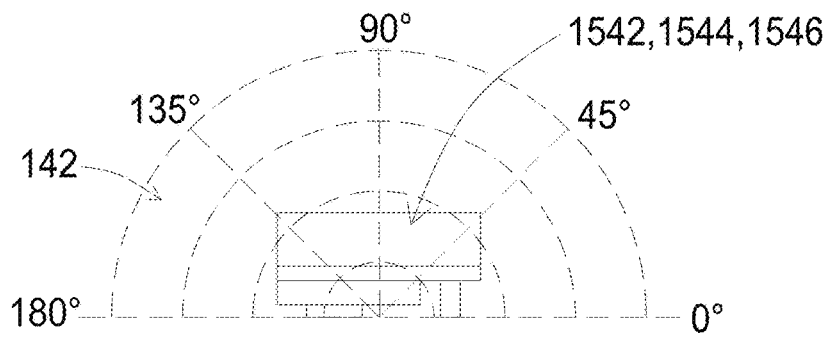
FIG. 15C shows a measuring method for measuring the light-emitting angle of the light-emitting unit disclosed in FIG. 15A.

FIG. 15C shows a measuring method for measuring the light-emitting angle of the light-emitting units 1542, 1544, and 1546 disclosed in FIG. 15A. Measuring the light-emitting strength from 0 to 180 degrees of the light-emitting units 1542, 1544, and 1546 along the dotted lines X1, X2, and X3 disclosed in FIG. 15A respectively. Wherein, the capable light-emitting angle is defined as a light-emitting strength distribution angle which is capable of emitting at least 50% of the maximum light-emitting strength.

In one embodiment, the light-emitting units in the light-emitting device 1500 are the bare dies or the laser diodes which emit red, green, and blue lights, respectively. In more details, light-emitting unit 1542 is a red bare die, light-emitting unit 1544 is a blue bare die, and light-emitting unit 1546 is a green bare die.

In one embodiment, referring to FIG. 1D, the red bare die is bound to the substrate 142a with the light-emitting layer 142b through a bonding layer (not shown). The substrate 142a is an aluminum oxide substrate which has a reflective index of about 1.8 corresponding to the red light. The light-emitting layer 142b is an AlGaInP-series compound which has a reflective index larger than 2.8 corresponding to the red light. When the bonding layer is an insulating material such as silicon oxide ($SiO_x$), the bonding layer has a reflective index between 1.4 and 1.5 which is less than those of the substrate 142a and the light-emitting layer 142b. The red bare die has a light-emitting angle between 125 and 130 degrees. In another embodiment, when the bonding layer is a conductive oxide material such as zinc oxide (ZnO), the red bare die has a light-emitting angle between 125 and 135 degrees. In still another embodiment, when the bonding layer is a conductive oxide material such as zinc oxide (ZnO) and substrate 142a is an aluminum oxide substrate with a concave-convex surface facing the light-emitting layer 142b and directly contacting the bonding layer, the red bare die has a light-emitting angle between 130 and 140 degrees.

Referring to FIG. 1D, the light-emitting layer 142b of the green bare die or the blue die are nitride-series compounds. The substrate 142a thereof is also an epitaxial growth substrate such as an aluminum oxide substrate (sapphire substrate). Therefore, there is no bonding layer between the light-emitting layer 142b and the substrate 142a. The light-emitting layer of the blue bare die or the green die is a gallium-nitride (GaN)-series compound and has a reflective index between 2.3 and 2.5 corresponding to the blue light or the green light. The substrate 142a is an aluminum oxide substrate which has a reflective index of about 1.7~1.8 corresponding to the blue light or the green light. In one embodiment, the substrate 142a is an aluminum oxide substrate including a concave-convex surface facing the light-emitting layer 142b, and the blue bare die or the green bare die has a light-emitting angle between 130 and 140 degrees.

Figure 16A:
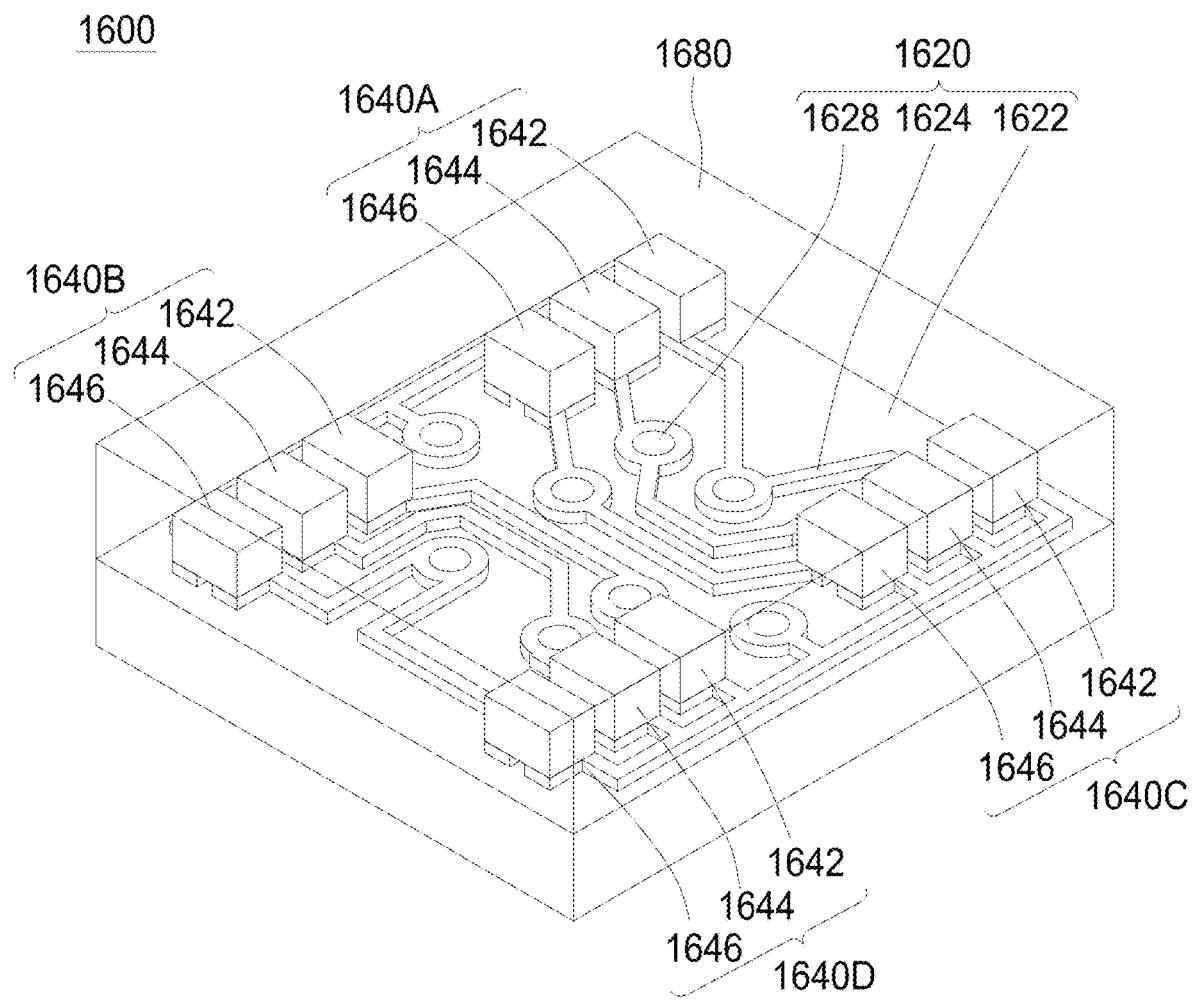
FIG. 16A shows a three-dimensional view of a light-emitting device in accordance with one embodiment of present application.
Figure 16B:
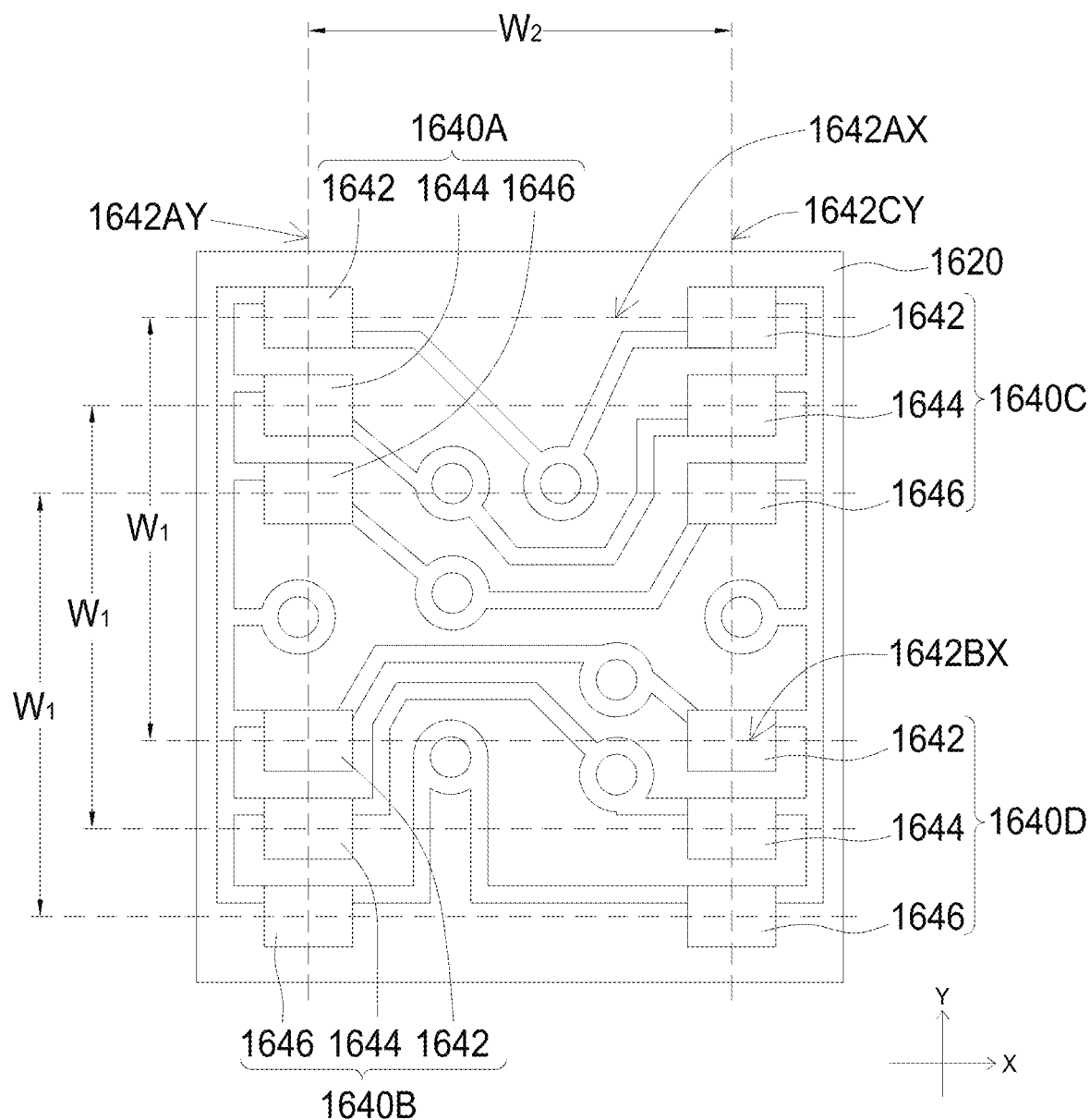
FIG. 16B shows a top view of the light-emitting device disclosed in FIG. 16A.
Figure 16C:
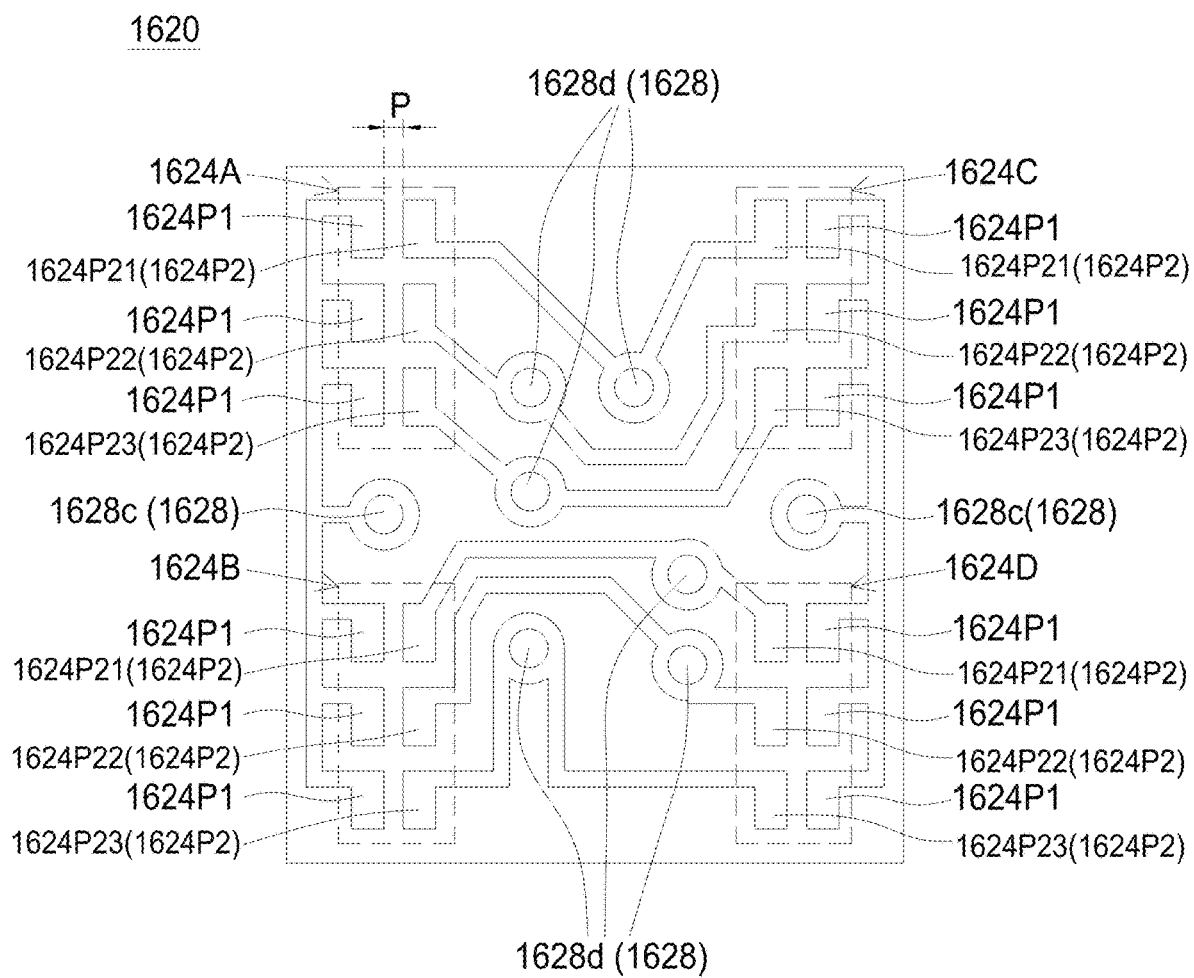
FIG. 16C shows a top view of the light-emitting device disclosed in FIG. 16A.
Figure 16D:
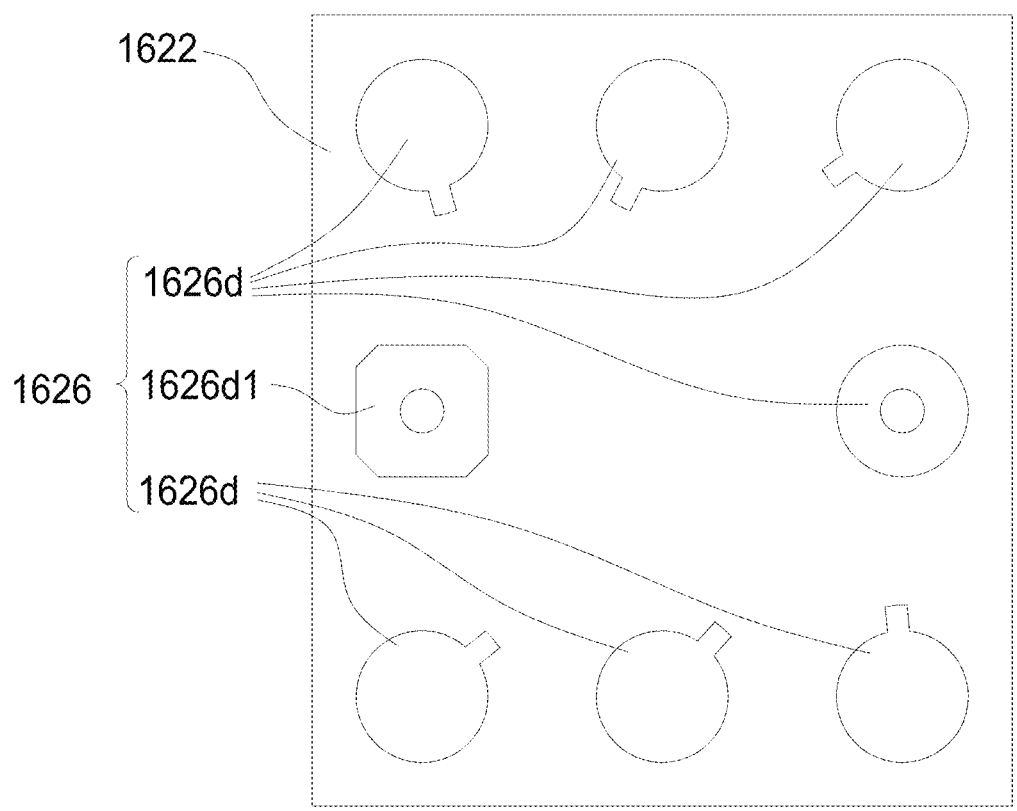
FIG. 16D shows a bottom view of the light-emitting device disclosed in FIG. 16A.

FIG. 16A shows a three-dimensional view of a light-emitting device 1600 in accordance with one embodiment of present application. FIG. 16B shows a top view of the light-emitting device 1600. FIGS. 16C and 16D show a top view of the light-emitting device 1600 comprising a carrier 1620 and a bottom view of the light-emitting device 1600, respectively. The light-emitting device 1600 includes a carrier 1620, four light-emitting elements 1640A, 1640B, 1640C, and 1640D fixed on the carrier 1620 by a connecting structure (not shown), and a light-passing unit 1680 covering the carrier 1620 and the four light-emitting elements 1640A, 1640B, 1640C, and 1640D, wherein the light-passing unit 1680 allows certain ratio of light emitted by the light-emitting elements to pass and the appearance of the light-passing unit can be transparent or translucent with the color of white, gray, or black. The definition is applied in the same and similar elements in the description and the specific structures, functions, and forming method of the carrier 1620, the light-emitting elements 1640A, 1640B, 1640C, and 1640D, the connecting structure, and the light-passing unit 1680 can be referred to the aforementioned related paragraphs.

Referring to FIG. 16B, in one embodiment, the four light-emitting elements 1640A, 1640B, 1640C, and 1640D are located at four corners of the carrier 1620, respectively. Each of the four light-emitting elements 1640A, 1640B, 1640C, and 1640D has the same arrangement. The first light-emitting unit 1642, the second light-emitting unit 1644, and the third light-emitting unit 1646 are arranged sequentially. The first light-emitting unit 1642, the second light-emitting unit 1644, and the third light-emitting unit 1646 are arranged as a character of "≡" (or "III").

As shown in FIG. 16B, axis 1642AX and axis 1642BX are parallel with x-axis, axis 1642AX passes the center points of the first light-emitting units 1642 of the light-emitting element 1640A and the light-emitting element 1640C, and axis 1642BX passes the center points of the first light-emitting units 1642 of the light-emitting element 1640B and the light-emitting element 1640D. There is a distance W1 between the axis 1642AX and the axis 1642BX. Similarly, either between the light-emitting element 1640A and the light-emitting element 1640B or between the light-emitting element 1640C and the light-emitting element 1640D, the distance between two respective second light-emitting units 1646 or between two respective third light-emitting units 1646 is also W1. Axis 1642AY and axis 1642CY are parallel with y-axis, axis 1642AY passes the center points of the first light-emitting units 1642, the second light-emitting units 1644, and the third light-emitting units 1646 of the light-emitting element 1640A and the light-emitting element 1640B, and axis 1642CY passes the center points of the first light-emitting units 1642, the second light-emitting units 1644, and the third light-emitting units 1646 of the light-emitting element 1640C and the light-emitting element 1640D. There is a distance W2 between the axis 1642AY and the axis 1642BY. In one embodiment, the distance W1 is the same as the distance W2.

Figure 17A:
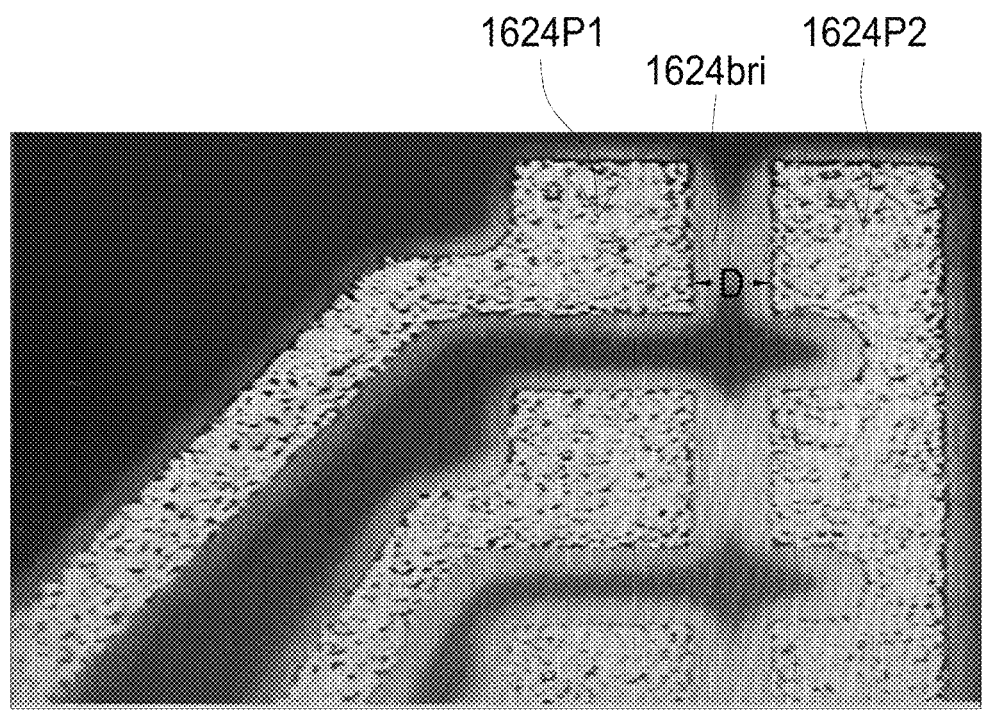
FIG. 17A and FIG. 17B show enlarged electron microscopic views of an upper conductive layer on the carrier of a light-emitting device in accordance with one embodiment of present application.
Figure 17B:
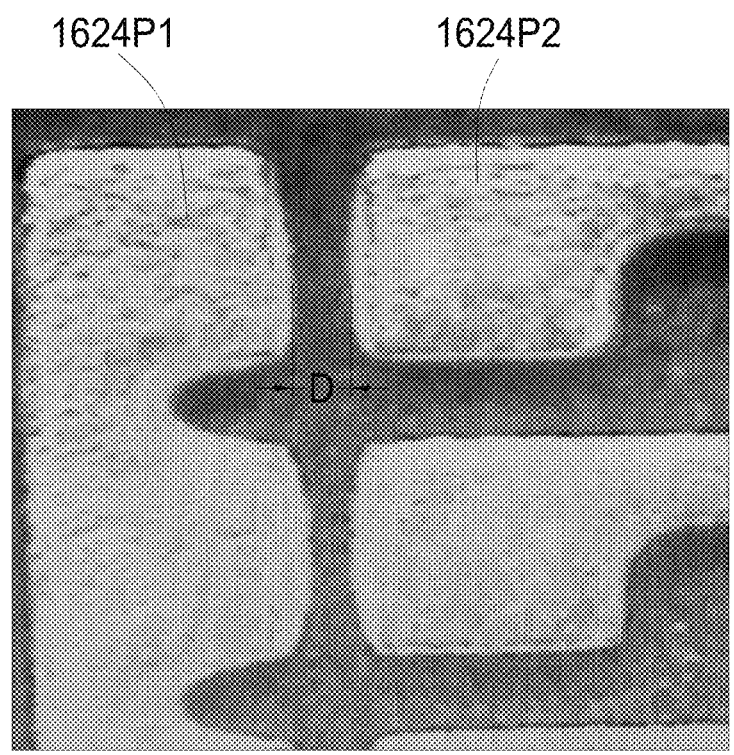

As the three-dimensional view of a light-emitting device 1600 shown in FIG. 16A, the bottom view of the carrier 1620 of the light-emitting device 1600 shown in FIG. 16D, the carrier 1620 includes an insulating layer 1622, an upper conductive layer 1624, a conducting via 1628, and a lower conductive layer 1626 (as shown in FIG. 16D), wherein the lower conductive layer 1626 includes a plurality of common electrodes 1626d and 1626d1. The detailed structures of the upper conductive layer 1624 can be referred to FIG. 16C. In one embodiment, the upper conductive layer includes four adhesive regions 1624A, 1624B, 1624C, and 1624D which are respectively corresponding to the light-emitting elements 1640A, 1640B, 1640C, and 1640D (as the dotted-line regions shown in the figure). Each adhesive region 1624A, 1624B, 1624C, or 1624D includes six connecting portions (or three pairs of upper conductive pads 1624P1 and 1624P2) and six necking portions (or six conductive traces). In each pair of upper conductive pads 1624P1 and 1624P2, the upper conductive pads 1624P1 and 1624P2 are separated from each other and has a distance P smaller than 80 μm. Besides, each pair of upper conductive pads is corresponding to a light-emitting unit. In one embodiment, the materials of the upper conductive layer 1624 and the lower conductive layer 1626 include metals such as Cu, Sn, Al, Ag, Pd, or Au, and the upper conductive layer 1624 and the lower conductive layer 1626 can be the stacks of the aforementioned metals. In one embodiment, the materials of the upper conductive layer 1624 includes the stack layers of Au and Pd, and Ni in not included. Because as shown in FIG. 17A, when the distance D between two adjacent upper conductive pads 1624P1 and 1624P2 is smaller than 40 μm, the Ni plating layer can cause the conductive anodic filament (CAF) which forms a conductive bridge 1624bri between the two adjacent upper conductive pads 1624P1 and 1624P2 and causes short circuit therebetween. In one embodiment, when the materials of the upper conductive layer 1624 include Cu, Au, and Pd and does not include Ni, as shown in FIG. 17B, when the distance D between two adjacent upper conductive pads 1624P1 and 1624P2 is smaller than 40 μm, such as 30.85 μm, the short circuit is stopped from happening.

As shown in FIG. 16C, a plurality of conducting vias 1628 include two common conducting vias 1628c and six common conducting vias 1628d. Two common conducting vias 1628c are respectively formed between two adhesive regions 1624A and 1624B and two adhesive regions 1624C and 1624D. Six common conducting vias 1628d are spread between two adhesive regions 1624A and 1624C and two adhesive regions 1624B and 1624D. All the upper conductive pads 1624P1 in the adhesive regions 1624A and 1624B are electrically connected to the left common conducting via 1628c. All the upper conductive pads 1624P1 in the adhesive regions 1624C and 1624D are electrically connected to the right common conducting via 1628c. The left and right common conducting vias 1628c(1628) are electrically insulated from each other before connected to other conductive bodies and are respectively connected to the common electrode 1626d1 and one of the common electrodes 1626d which are located at the corresponding positions of lower conductive layer 1626 through the conductive layers in the insulating layer 1622, as shown in FIG. 16D.

As shown in FIG. 16C, the pairs of upper conductive pads with the same numerals in the respective adhesive regions (the conductive pads which are connected to the light-emitting diodes emitting a same color) are connected to a common conducting via. Six upper conductive pads 1624P2 in the adhesive regions 1624A and 1624C and six upper conductive pads 1624P2 in the adhesive regions 1624B and 1624D are electrically connected to a common conducting via 1628d via the conductive traces. For example, the upper conductive pad 1624P21 in the adhesive region 1624A and the upper conductive pad 1624P21 in the adhesive region 1624C are electrically connected to a common conducting via 1628d via the conductive traces. Similarly, the other upper conductive pads 1624P22 and 1624P23 in the adhesive regions 1624A, 1624B, 1624C, and 1624D are connected to a common conducting via 1628d, and each common conducting via 1628d is electrically insulated from each other. As shown in FIG. 16D, six common conducting vias 1628d are respectively connected to the six common electrodes 1626d which are located at the lower conductive layer 1626 through the conductive layers in the insulating layer 1622.

As shown in FIGS. 16B and 16D, by providing the electrical power to one common electrode 1626d which is electrically connected to the common conducting via 1628C, one light-emitting unit (first light-emitting unit 1642, second light-emitting unit 1644, or third light-emitting unit 1646) in one of the light-emitting elements 1640A, 1640B, 1640C, or 1640D can be lit. In other words, anyone of the light-emitting units 1642, 1644, or 1646 is able to be lit by selectively providing the electrical power to one specific common electrode 1626d. In one embodiment, one of the common electrodes 1626d and 1626d1 has a shape different from those of the others. For example, in the present embodiment, the shape of one common electrode 1626d1 is square and is different from those of the other common electrodes 1626d which are round so that if one would like to place the light-emitting device 1600 to a circuit board, the common electrode 1626d1 can be used to identify the arrangement and the direction of the first light-emitting units 1642, the second light-emitting units 1644 and the third light-emitting units 1646 on the light-emitting device 1600.

Figure 18A:
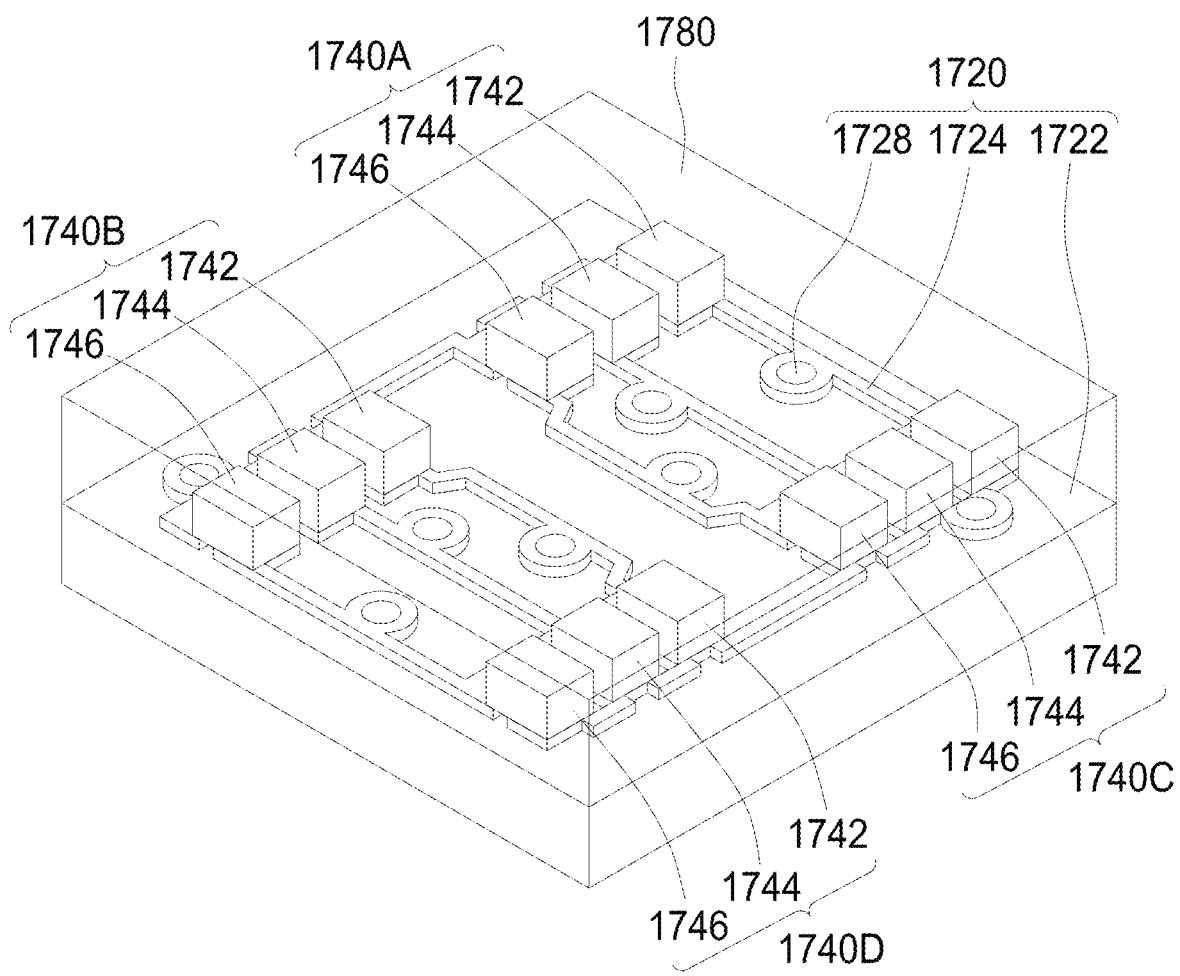
FIG. 18A shows a three-dimensional view of a light-emitting device in accordance with one embodiment of present application.
Figure 18B:
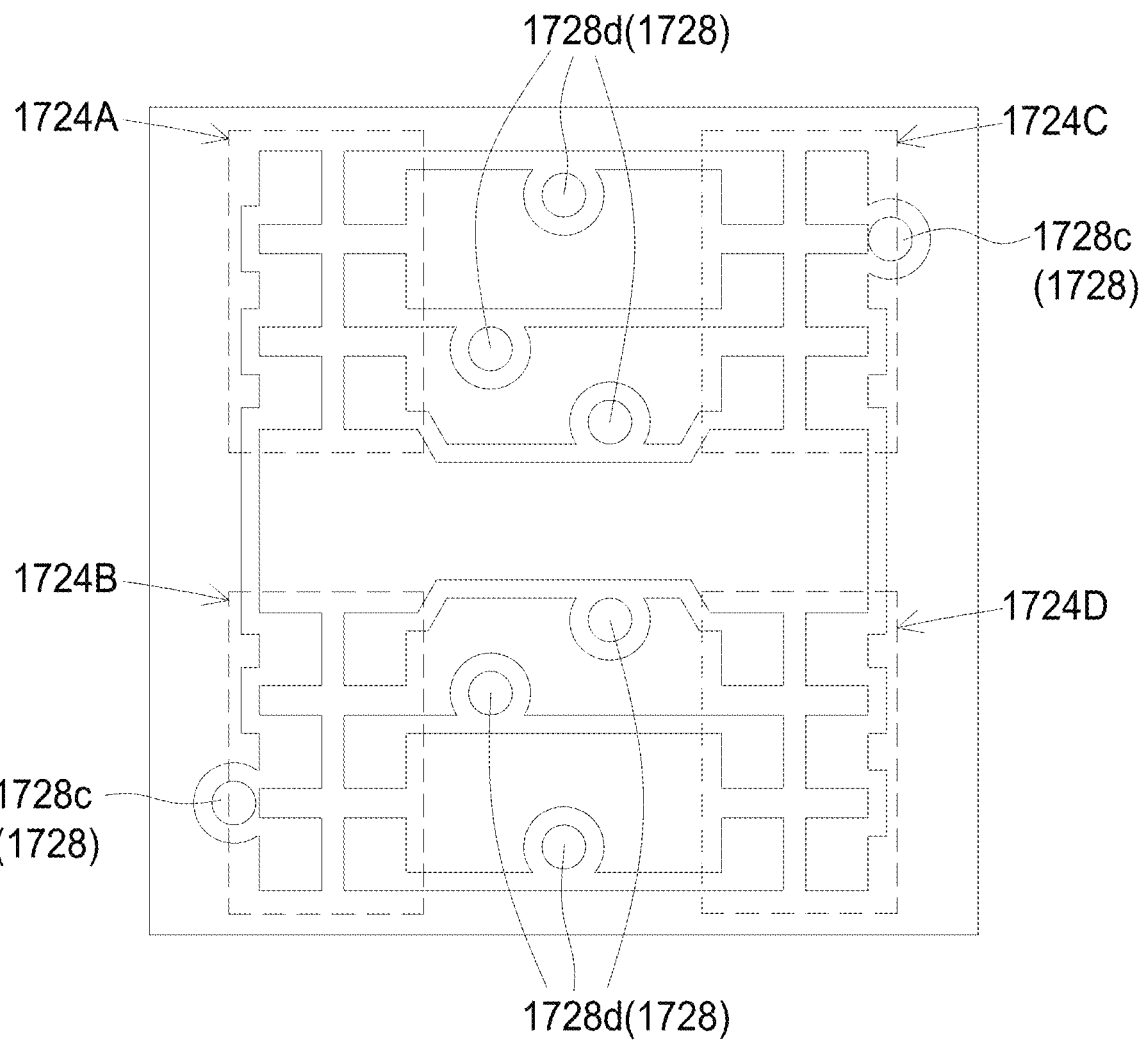
FIG. 18B shows a top view of the light-emitting device disclosed in FIG. 18A.
Figure 18C:
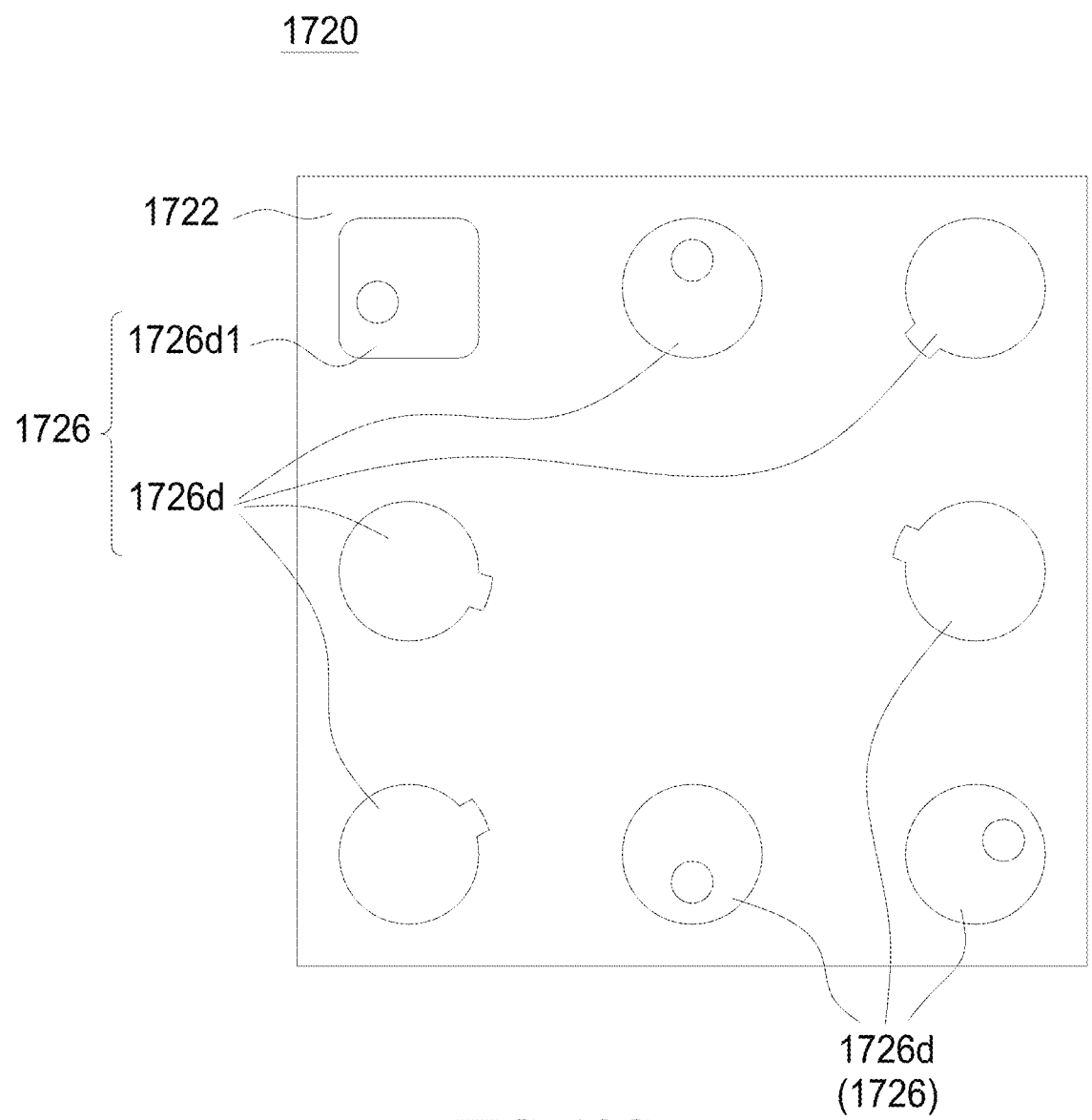
FIG. 18C shows a bottom view of the light-emitting device disclosed in FIG. 18A.

FIG. 18A shows a three-dimensional view of a light-emitting device 1700 in accordance with one embodiment of present application. FIG. 18B shows a top view of a carrier 1720 of the light-emitting device 1700. FIG. 18C shows a bottom view of the carrier 1720. The light-emitting device 1700 includes a carrier 1720, four light-emitting elements 1740A, 1740B, 1740C, and 1740D fixed on the carrier 1720 by a connecting structure (not shown), and a light-passing unit 1780 covering the carrier 1720 and the four light-emitting elements 1740A, 1740B, 1740C, and 1740D. The specific structures, functions, and forming methods of the carrier 1720, the light-emitting elements 1740A, 1740B, 1740C, and 1740D, the connecting structure, and the light-passing unit 1780 can be referred to the aforementioned related paragraphs. As shown in FIGS. 18B and 18C, the differences between the light-emitting device 1600 and the light-emitting device 1700 are the circuit layout design, the positions of the common conducting vias 1728, and the shapes of the common electrodes 1726d and 1726d1 of the lower conductive layer 1726. As shown in FIG. 18B, the plurality of conducting vias 1728 includes two common conducting vias 1728c and six common conducting vias 1728d. Two common conducting vias 1728c are respectively located at the corners near the adhesive regions 1724B and 1724D. Six common conducting vias 1728d are divided into two groups and spread between two adhesive regions 1724A and 1724C and two adhesive regions 1724B and 1724D. The upper conductive pads in the adhesive regions 1724A, 1724B, 1724C, and 1724D are connected to the common conducting vias 1728c and 1728d via a different circuit layout which is different from that of the light-emitting device 1600, and the connecting method thereof can be referred to the light-emitting device 1600.

As shown in FIG. 18C, in the lower conductive layer 1726, the shape of the common electrode 1726d1 is different from those of the other common electrodes 1726d. For example, in the present embodiment, the shape of the common electrode is square and is different from those of the other common electrodes 1726d which are round so that if one would like to place the light-emitting device 1700 to a circuit board, the common electrode 1726d1 can be used to identify the arrangement and the direction of the first light-emitting units 1742, the second light-emitting units 1744 and the third light-emitting units 1746 on the light-emitting device 1700.

Figure 19A:
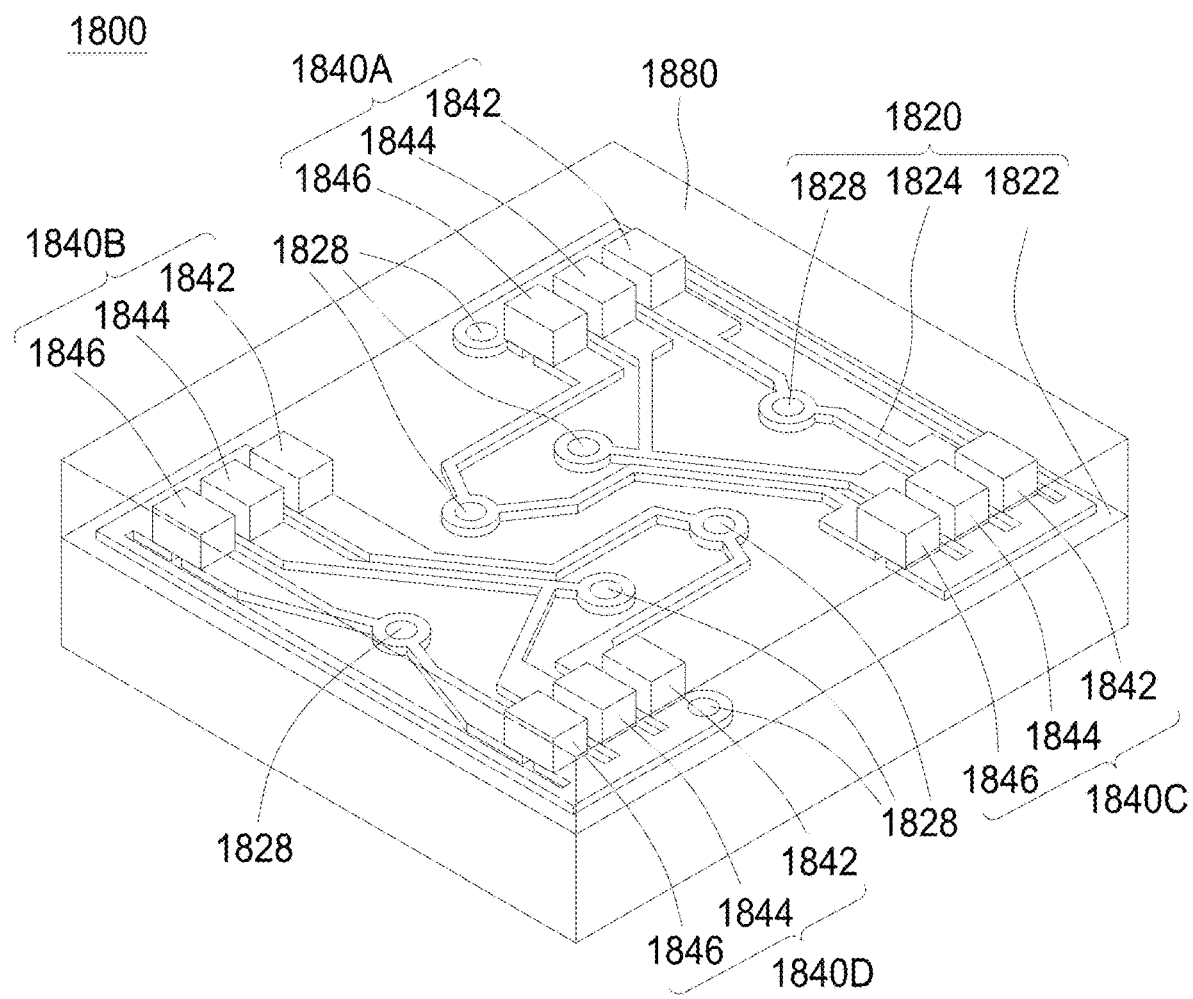
FIG. 19A shows a three-dimensional view of a light-emitting device in accordance with one embodiment of present application.
Figure 19B:
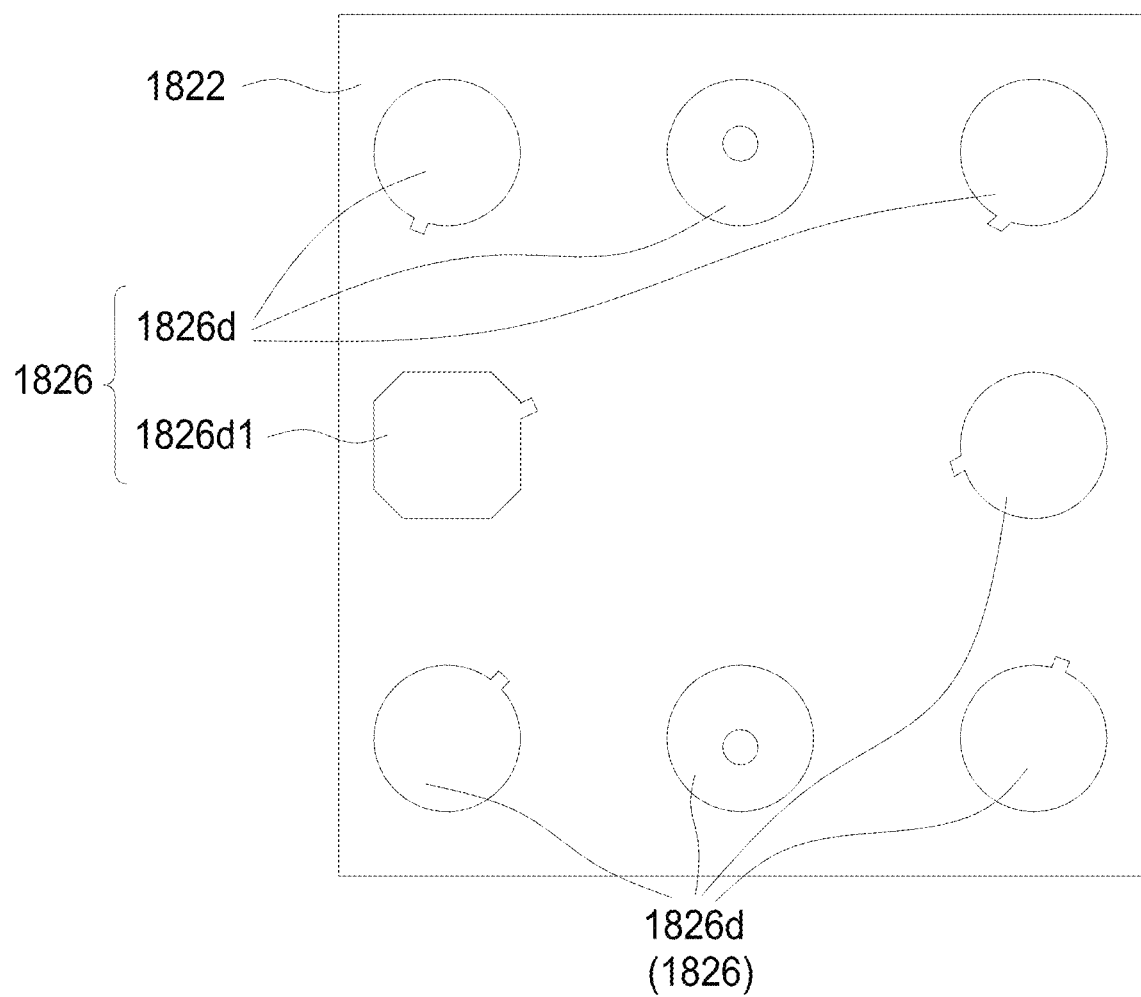
FIG. 19B shows a bottom view of the light-emitting device disclosed in FIG. 19A.

FIG. 19A shows a three-dimensional view of a light-emitting device 1800 in accordance with one embodiment of present application. FIG. 19B shows a bottom view of a carrier 1820 of the light-emitting device 1800. The light-emitting device 1800 includes a carrier 1820, four light-emitting elements 1840A, 1840B, 1840C, and 1840D fixed on the carrier 1820 by a connecting structure (not shown), and a light-passing unit 1880 covering the carrier 1820 and the four light-emitting elements 1840A, 1840B, 1840C, and 1840D. The detailed structures, functions, and forming methods of the carrier 1820, the light-emitting elements 1840A, 1840B, 1840C, and 1840D, the connecting structure, and the light-passing unit 1880 can be referred to the aforementioned related paragraphs.

As shown in FIGS. 19A and 19B, the differences between the light-emitting device 1800 and the light-emitting devices 1600 and 1700 are the circuit layout design on the carrier 1820, the positions of the common conducting vias 1828, and the shapes of the common electrodes 1826$d$ and 1826$d1$ of the lower conductive layer 1826.

Figure 20:
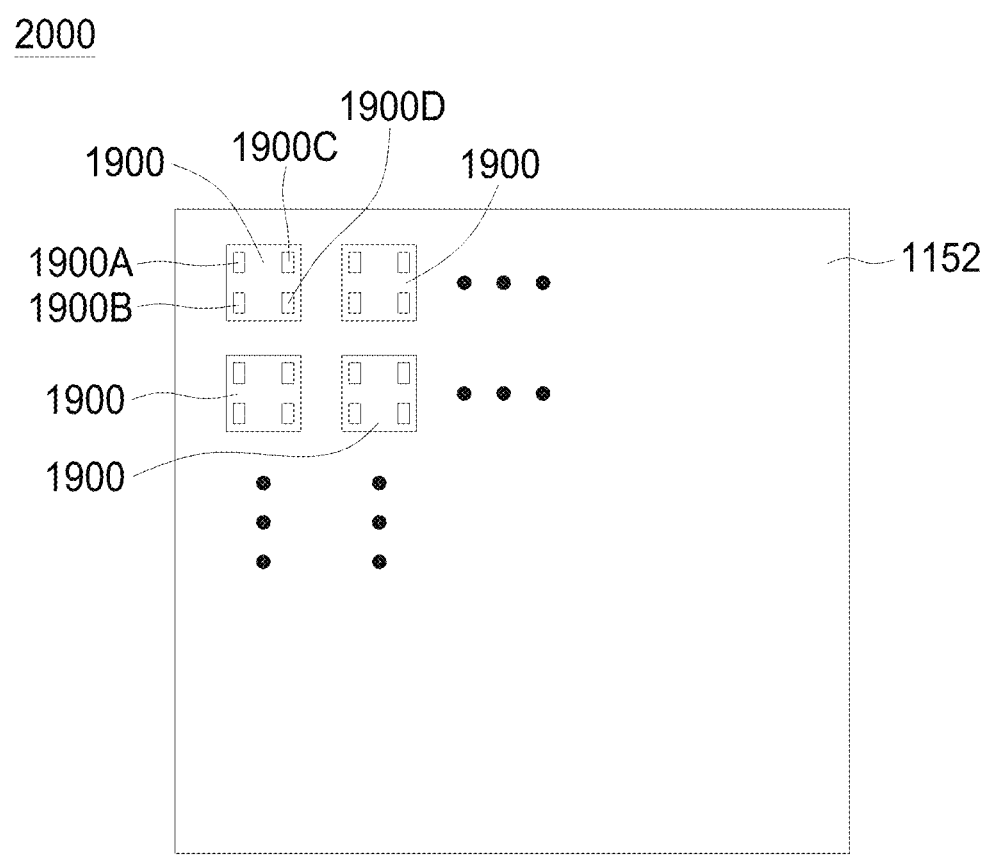
FIG. 20 shows a display module in accordance with one embodiment of present application.

FIG. 20 shows a light-emitting module 2000, the light-emitting module 2000 includes a target substrate 1152 and a plurality of light-emitting devices 1900 fixed on the target substrate 1152 in a matrix form. The light-emitting devices 1900 can be selected from the aforementioned light-emitting devices 1600, 1700, and/or 1800. The difference between the light-emitting module 2000 and the light-emitting module 1000 is that the light-emitting device 1900 includes four light-emitting elements 1940A, 1940B, 1940C, and 1940D which can emit red light, green light, and blue light. Each of the light-emitting elements 1940A, 1940B, 1940C, and 1940D can be a pixel of the light-emitting module 2000. Because light-emitting device 1900 includes four light-emitting elements, the number of times to place the light-emitting devices 1900 on the target substrate 1152 is quarter of the number of times to place the light-emitting devices 1500 on the target substrate 1152, and the process time is reduced.

The aforementioned light-emitting devices 1600, 1700, and 1800 include four light-emitting elements arranged in a 2×2 matrix. In one embodiment, the light-emitting devices include more light-emitting elements arranged in a 3×3 matrix, a 4×4 matrix, and so on so that the process time to place the light-emitting devices on the target substrate can be reduced. In still another embodiment, the light-emitting devices include more light-emitting elements arranged in a 4×3 matrix, a 3×2 matrix, a 16×9 matrix, and so on. The design can be adjusted in accordance with the display scale of the display module.

Figure 21:
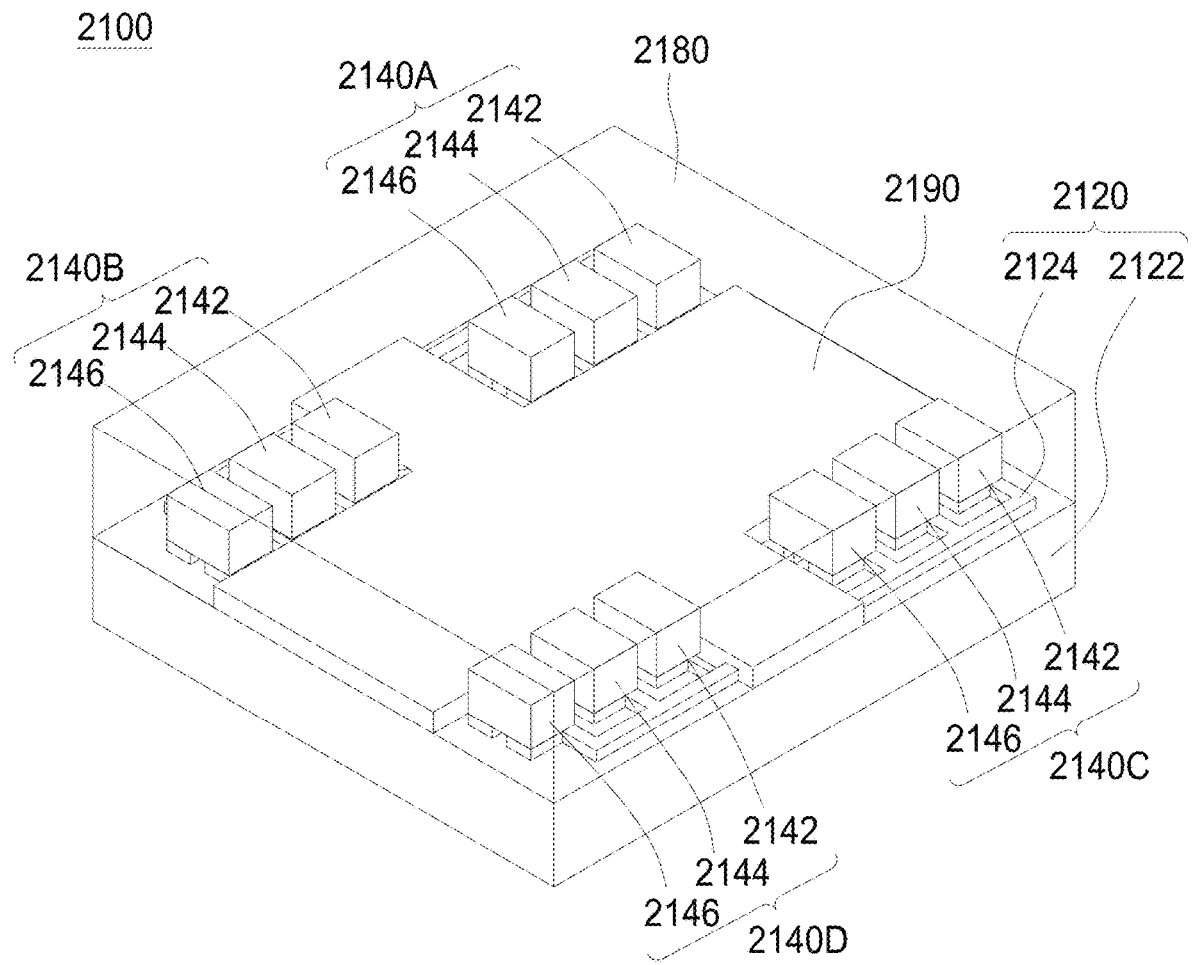
FIG. 21 shows a three-dimensional view of a light-emitting device in accordance with one embodiment of present application.

FIG. 21 shows a three-dimensional view of a light-emitting device 2100 in accordance with one embodiment of present application. The light-emitting device 2100 is much the same as the light-emitting device 1600, 1700, or 1800. The detailed structures, functions, and forming methods of the carrier 2120, the light-emitting elements 2140A, 2140B, 2140C, and 2140D, the connecting structure (not shown), and the light-passing unit 2180 can be referred to the aforementioned related paragraphs.

The difference between the light-emitting device 2100 and the light-emitting device 1600, 1700, or 1800 is that the light-emitting device 2100 includes a light-shielding layer 2190 located on the carrier 2120, covering the upper conductive layer 2124 and the conducting vias (not shown) which are located between the light-emitting elements 2140A-2140D, and exposing the light-emitting elements 2140A-2140D and a portion of the upper conductive layer 2124 surrounding thereof. The light-shielding layer 2190 is a dark and light-impenetrable insulating material such as an insulating glue mixed with black particles. The light-shielding layer 2190 can reduce the light reflected from the upper conductive layer 2124 and the conducting vias. When the light-emitting devices 2100 are applied in the light-emitting module 2000 to replace the light-emitting devices 1900, the contrast of the light-emitting module 2000 can be improved.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising: a carrier, comprising a first side, an insulating layer, a plurality of pairs of upper conductive pads on the insulating layer and a lower conductive layer formed under the insulating layer;
   first, second, third, and fourth light-emitting elements connected to the plurality of pairs of upper conductive pads; and
   a light-passing unit formed on the carrier and covering the first, second, third, and fourth light-emitting elements;
   wherein each of the plurality of pairs of upper conductive pads comprises a first upper conductive pad and a second upper conductive pad,
   wherein the lower conductive layer comprises a first common electrode connected to the plurality of first upper conductive pads, and a plurality of second common electrodes connected to the plurality of second upper conductive pads,
   wherein the plurality of pairs of upper conductive pads is arranged in a first column and a second column, and the first column and the second column are parallel to the first side,
   wherein, in the first column, the first upper conductive pad is closer to the first side than the second upper conductive pad, and, in the second column, the second upper conductive pad is closer to the first side than the first upper conductive pad.

2. The light-emitting device according to claim 1, wherein each of the first, second, third, and fourth light-emitting elements comprises a first light-emitting bare die configured to emit a red light, a second light-emitting bare die configured to emit a green light, and a third light-emitting bare die configured to emit a blue light.

3. The light-emitting device according to claim 2, wherein two adjacent first light-emitting bare dies in a row are separated by a first distance W1, two adjacent first light-emitting bare dies in the first column are separated by a second distance W2, and W1 is substantially equal to W2.

4. The light-emitting device according to claim 3, wherein two adjacent second light-emitting bare dies in the row have a third distance W3, and W3 is substantially equal to W1.

5. The light-emitting device according to claim 3, wherein the carrier further comprises a second side substantially perpendicular to the first side, the row is substantially parallel with the second side.

6. The light-emitting device according to claim 1, wherein the carrier further comprises a plurality of conducting vias passing through the insulating layer.

7. The light-emitting device according to claim 6, further comprising a light-shielding layer located on the carrier and covering the plurality of conducting vias.

8. The light-emitting device according to claim 7, wherein, in a top view, the light-shielding layer is formed in a cross shape.

9. The light-emitting device according to claim 1, wherein the first upper conductive pad and the second upper conductive pad are separated by a distance D equal to or larger than 40 □m.

10. The light-emitting device according to claim 9, wherein the distance D is smaller than 80 µm.

11. The light-emitting device according to claim 7, wherein the light-shielding layer comprises an insulating material and black particles.

12. The light-emitting device according to claim 7, wherein the light-passing unit covers the light-shielding layer.

13. The light-emitting device according to claim 1, wherein the light-passing unit is gray or black.

14. The light-emitting device according to claim 1, wherein the plurality of pairs of upper conductive pads is devoid of Ni.

15. The light-emitting device according to claim 14, wherein the plurality of pairs of upper conductive pads comprises Cu, Au, Pd, or a combination thereof.

16. The light-emitting device according to claim 1, further comprising a plurality of connecting structures between the plurality of pairs of upper conductive pads and the first light-emitting elements.

17. The light-emitting device according to claim 16, wherein each of the plurality of connecting structures comprises an electrical connecting portion and a protection portion surrounding the electrical connecting portion.

18. A light-emitting module, comprising:
   a substrate; and
   a plurality of the light-emitting devices as claimed in claim 1, formed on the substrate in a matrix configuration.

* * * * *